United States Patent
Kinoshita et al.

(10) Patent No.: US 9,923,166 B2
(45) Date of Patent: Mar. 20, 2018

(54) TRANSPARENT ELECTRODE AND ELECTRONIC DEVICE

(71) Applicant: Konica Minolta, Inc., Tokyo (JP)

(72) Inventors: Toshiyuki Kinoshita, Hino (JP);
Takeshi Hakii, Sagamihara (JP);
Hiroshi Ishidai, Hachioji (JP);
Kazuhiro Yoshida, Hachioji (JP);
Takatoshi Tsujimura, Fujisawa (JP)

(73) Assignee: KONICA MINOLTA, INC., Tokyo (JP)

( * ) Notice: Subject to any disclaimer, the term of this patent is extended or adjusted under 35 U.S.C. 154(b) by 213 days.

(21) Appl. No.: 14/377,368

(22) PCT Filed: Feb. 14, 2013

(86) PCT No.: PCT/JP2013/053501
§ 371 (c)(1),
(2) Date: Aug. 7, 2014

(87) PCT Pub. No.: WO2013/122131
PCT Pub. Date: Aug. 22, 2013

(65) Prior Publication Data
US 2016/0013439 A1   Jan. 14, 2016

(30) Foreign Application Priority Data
Feb. 15, 2012   (JP) ................. 2012-030612

(51) Int. Cl.
*H01L 51/50* (2006.01)
*H01L 51/52* (2006.01)
(Continued)

(52) U.S. Cl.
CPC ...... *H01L 51/5234* (2013.01); *H01L 51/5092* (2013.01); *H01L 51/5206* (2013.01);
(Continued)

(58) Field of Classification Search
CPC . H05B 33/28; H01L 51/5234; H01L 51/5206; H01L 2251/558; H01L 2251/301;
(Continued)

(56) References Cited

U.S. PATENT DOCUMENTS

2009/0284138 A1* 11/2009 Yasukawa ............ C09K 11/06
                                                              313/504
2011/0057920 A1*  3/2011 Matsuura ............ H01L 27/3258
                                                              345/211
(Continued)

FOREIGN PATENT DOCUMENTS

JP  2002-015623 A  1/2002
JP  2006-164961 A  6/2006
(Continued)

OTHER PUBLICATIONS

Notification of Reasons for Refusal dated Jun. 28, 2016 from the corresponding Japanese Application; Patent Application No. 2013-558720; English translation of Notification of Reasons for Refusal; Total of 5 pages.

(Continued)

*Primary Examiner* — Joanna Pleszczynska
(74) *Attorney, Agent, or Firm* — Lucas & Mercanti, LLP

(57) ABSTRACT

Provided is a transparent electrode having sufficient electrical conductivity and light transmissibility, as well as an electronic device and an organic electroluminescence element whose performance is improved by using such a transparent electrode. A transparent electrode (1) has an electrode layer (1b) composed of silver, wherein the film-thickness of the electrode layer (1b) is 12 nm or less at which sheet resistance is measurable, and wherein the circumferential length of apertures (a) obtained by processing a scanning electron microscope image of a surface region (S)

(Continued)

with an area of 500 nm×500 nm of the electrode layer (1b) is, in sum total, 3000 nm or less.

3 Claims, 6 Drawing Sheets

(51) Int. Cl.
H01L 51/54 (2006.01)
B32B 15/08 (2006.01)
H05B 33/28 (2006.01)
H01L 27/32 (2006.01)

(52) U.S. Cl.
CPC ...... *H01L 51/5212* (2013.01); *H01L 51/5215* (2013.01); *H05B 33/28* (2013.01); *H01L 27/3293* (2013.01); *H01L 51/5228* (2013.01); *H01L 2251/301* (2013.01); *H01L 2251/5315* (2013.01); *H01L 2251/558* (2013.01)

(58) Field of Classification Search
CPC . H01L 51/50; H01L 51/5215; H01L 2251/50; H01L 2251/53; H01L 2251/5223; B32B 15/00; B32B 15/08
USPC .................................. 428/141, 213, 457, 701
See application file for complete search history.

(56) References Cited

U.S. PATENT DOCUMENTS

| | | | |
|---|---|---|---|
| 2011/0169399 A1* | 7/2011 | Ito | ........................ H01L 51/5234 313/504 |
| 2012/0068173 A1* | 3/2012 | Umezaki | ................ G09G 3/342 257/43 |

FOREIGN PATENT DOCUMENTS

| | | |
|---|---|---|
| JP | 2007-149633 A | 6/2007 |
| JP | 2008-293129 A | 12/2008 |
| JP | 2009-132831 A | 6/2009 |
| JP | 2009-151963 A | 7/2009 |
| JP | 2009-194211 A | 8/2009 |
| JP | 2011-015828 A | 1/2011 |

OTHER PUBLICATIONS

Notification of Reasons for Refusal dated Feb. 7, 2017 from corresponding Japanese Patent Application No. JP 2013-558720; English translation of Notification of Reasons for Refusal; Total of 7 pages.

* cited by examiner

TRANSPARENT ELECTRODE AND ELECTRONIC DEVICE

CROSS REFERENCE TO RELATED APPLICATION

This Application is a 371 of PCT/JP2013/053501 filed on Feb. 14, 2013 which, in turn, claimed the priority of Japanese Patent Application No. JP2012-030612 filed on Feb. 15, 2012 both applications are incorporated herein by reference.

TECHNICAL FIELD

The present invention relates to a transparent electrode and an electronic device, and more particularly, to a transparent electrode having electrical conductivity and light transmissibility, and an electronic device using such a transparent electrode.

BACKGROUND ART

An organic electroluminescence element (i.e., so-called organic EL element) using electroluminescence (referred to as EL hereinafter) of an organic material is a thin-film type completely-solid element capable of emitting light at a low voltage of several volts to several tens volts, and has many excellent features such as high brightness, high luminous efficiency, thin in thickness, light in weight and the like. Therefore, recently the organic electroluminescence element has attracted attention as a backlight for various kinds of displays, a display board (such as a signboard, an emergency light or the like), and a planar light-emitting body (such as a light source for a lighting fixture).

Such an organic electroluminescence element includes two layers of electrodes, and a light emitting layer formed of an organic material sandwiched between the two layers of electrodes; and the light emitted by the light emitting layer is transmitted through the electrode(s) and extracted to the outside. Thus, at least one of the two layers of electrodes is configured as a transparent electrode.

Generally, the transparent electrode is formed by an oxide semiconductor material, such as indium tin oxide ($SnO_2$—$In_2O_3$) or the like; however, there is also a proposal in which the transparent electrode is formed by laminating ITO and silver in order to reduce resistance (see, for example, Patent Documents 1 and 2). However, since ITO contains indium, which is a rare metal, the material cost goes up; and further, in order to reduce resistance, it is necessary to perform an annealing treatment at about 300° C. after film-formation. To solve such problems, the following configurations are proposed: one is a configuration in which a film composed of a metal material having high electrical conductivity (such as silver or the like) is made thin; another one is a configuration in which a film composed of a material obtained by mixing aluminum into silver is formed, so that the electrical conductivity of the film can be ensured at a film-thickness thinner than that of a film composed of silver only (see, for example, Patent Document 3).

PRIOR ART DOCUMENTS

Patent Documents

Patent Document 1: Japanese Unexamined Patent Application Publication No. 2002-15623

Patent Document 2: Japanese Unexamined Patent Application Publication No. 2006-164961

Patent Document 3: Japanese Unexamined Patent Application Publication No. 2009-151963

DISCLOSURE OF THE INVENTION

Problems to be Solved by the Invention

However, even the transparent electrode is configured by silver and/or aluminum, which have high electrical conductivity, it is difficult to obtain sufficient electrical conductivity and light transmissibility at the same time.

In view of the aforesaid problems, it is an object of the present invention to provide a transparent electrode having sufficient electrical conductivity and light transmissibility, as well as an electronic device whose performance is improved by using the transparent electrode.

Means for Solving the Problems

The aforesaid object of the present invention is achieved by the following configurations.
1. A transparent electrode includes an electrode layer composed of silver, wherein the film-thickness of the electrode layer is 12 nm or less at which sheet resistance of the electrode layer is measurable, and wherein the circumferential length of aperture(s) obtained by performing image processing on a scanning electron microscope image of a surface region with an area of 500 nm×500 nm of the electrode layer is, in sum total, 3000 nm or less.
2. The transparent electrode according to configuration 1, wherein the circumferential length of the aperture(s) is, in sum total, 1000 nm or less.
3. An electronic device includes a transparent electrode according to configuration 1 or 2.
4. In the electronic device according to configuration 3, the electronic device is an organic electroluminescence element.

In the transparent electrode having the aforesaid configuration, by setting the film-thickness of the electrode layer of the transparent electrode to 12 nm or less at which the sheet resistance is measurable, the practicability of the electrode layer as an electrode film is ensured while light absorption component or light reflection component of the electrode layer is reduced. Particularly, since the circumferential length of apertures "a" obtained by performing image processing on the image of the surface region with an area of 500 nm×500 nm of the electrode layer obtained by a scanning electron microscope is 3000 nm or less, it is possible to reliably attain an electrical conductivity with a measurable sheet resistance despite the extremely small film-thickness of 12 nm or less as mentioned above.

As a result, with the transparent electrode having such an electrode layer, since the electrode layer (which substantially functions as an electrode) has electrical conductivity as well as having light transmissibility due to small film-thickness, the electrical conductivity and the light transmissibility are both improved.

Advantages of the Invention

As described above, according to the present invention, it is possible to improve both the electrical conductivity and the light transmissibility of the transparent electrode at the same time, and it is also possible to improve the performance of the electronic device that uses the transparent electrode.

MODES FOR CARRYING OUT THE INVENTION

An embodiment of the present invention will be described in the following order with reference to the attached drawings.
1. Transparent Electrode
2. Applications of Transparent Electrode
3. First Example of Organic Electroluminescence Element (Top Emission Type)
4. Second Example of Organic Electroluminescence Element (Bottom Emission Type)
5. Third Example of Organic Electroluminescence Element (Dual Emission Type)
6. Fourth Example of Organic Electroluminescence Element (Inversely laminated configuration)
7. Applications of Transparent Electrode
8. Illumination Device 1
9. Illumination Device 2

<<1. Transparent Electrode>>

Figure 1:
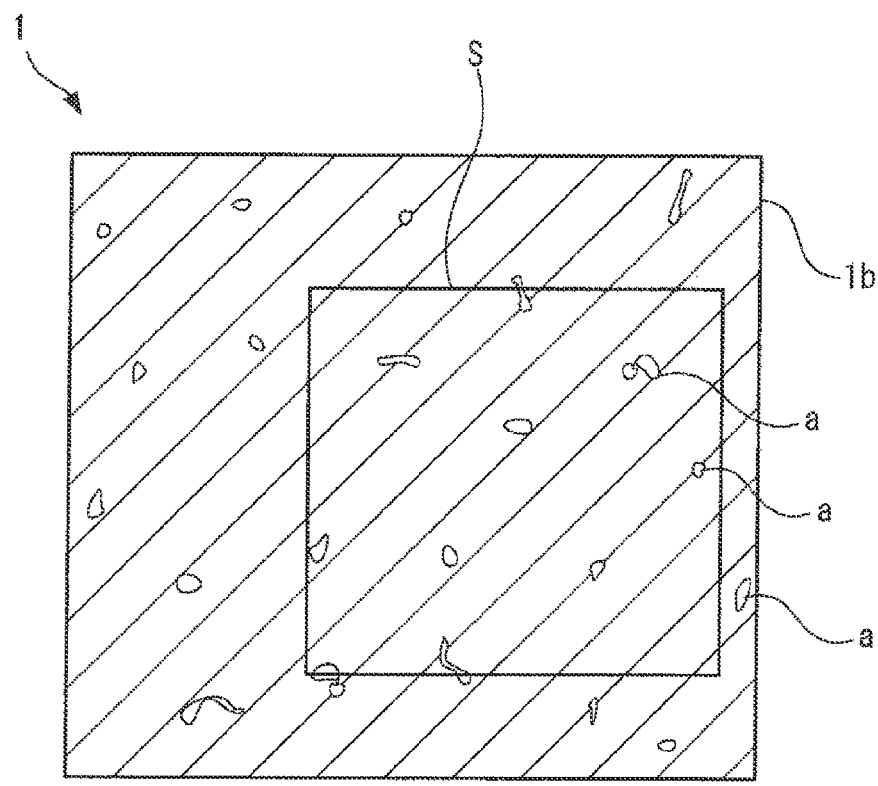
FIG. 1 is a plan view schematically showing a configuration of a transparent electrode according to the present invention.
Figure 2:
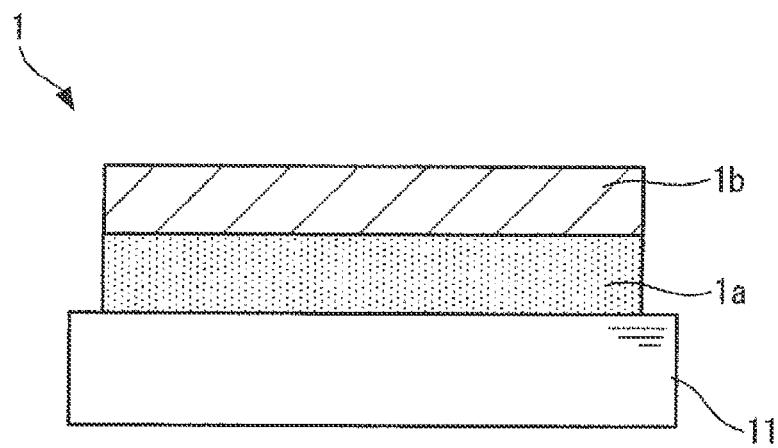
FIG. 2 is a cross-sectional view schematically showing a configuration of the transparent electrode according to the present invention.

FIG. 1 is a plan view schematically showing a configuration of a transparent electrode according to the present invention. FIG. 2 is a cross-sectional view schematically showing a configuration example of the transparent electrode according to the present invention. As shown in FIGS. 1 and 2, a transparent electrode 1 includes a nitrogen-containing layer 1a and an electrode layer 1b arranged adjacent to the nitrogen-containing layer 1a; however, the transparent electrode 1 may include the electrode layer 1b only, or may have a laminated structure formed by the nitrogen-containing layer 1a and the electrode layer 1b. In such a transparent electrode 1, the nitrogen-containing layer 1a and the electrode layer 1b are arranged, in this order, on the top of a base material 11, for example. As will be described later in detail, the present invention is characterized in that the electrode layer 1b, which constitutes the electrode portion of the transparent electrode 1, is formed as a film having a predetermined film-thickness and a predetermined film-forming state. Further, the nitrogen-containing layer 1a arranged adjacent to the electrode layer 1b is, for example, a layer formed by using a material having a specific relationship with the electrode material constituting the electrode layer 1b.

Detailed configurations of the electrode layer 1b, the nitrogen-containing layer 1a formed adjacent to the electrode layer 1b (which constitute the transparent electrode 1 having the aforesaid laminated structure), and the base material 11 (on which the transparent electrode 1 is arranged) will be described below in this order. Incidentally, the term "transparent" of the transparent electrode 1 of the present invention means that light transmittance of the transparent electrode 1 for light with a wavelength of 550 nm is 50% or higher.

<Electrode Layer 1b>

The electrode layer 1b is a layer formed by using a conductive material, and is a layer formed on, for example, the nitrogen-containing layer 1a. The electrode layer 1b has a film-thickness of 12 nm or less at which the sheet resistance of the electrode layer 1b is measurable. Since electrode layer 1b has a film-thickness at which the sheet resistance of the electrode layer 1b is measurable, the electrode layer 1b has two-dimensional continuity in the in-plane direction of the conductive material constituting the electrode layer 1b, so that practicability of the electrode layer 1b as an electrode film is ensured. Further, by setting the film-thickness of the electrode layer 1b to 12 nm or less, light absorption component or light reflection component of the electrode layer 1b is reduced, and therefore the light transmittance of the transparent electrode 1 is ensured.

Further, the sum of circumferential length(s) of aperture(s) "a" obtained by performing image processing on a scanning electron microscope image of a surface region S with an area of 500 nm×500 nm of the electrode layer 1b is 3000 nm or less. The scanning electron microscope is a microscope suitable for observing the surface region S with an area of about 500 nm×500 nm. The surface region S is an area arbitrarily set on the surface of the electrode layer 1b.

Here, the electrode layer 1b is an extremely thin film having a film-thickness of 12 nm or less. Thus, as shown in the plan view of FIG. 1, there is a possibility that the conductive material might not be able to perfectly form a film so as to have aperture(s) "a" left therein, depending on the film-forming state of the conductive material. Even in such a case, the circumferential length(s) of all aperture(s) "a" left in the surface region S with an area of 500 nm×500 nm are summed; and if the sum of the circumferential length(s) of the aperture(s) "a" is 3000 nm or less, the film is used as the electrode layer 1b. It is preferred that the sum of the circumferential length(s) of the aperture(s) "a" is 1000 nm or less. Further, it is most preferred the electrode layer 1b is a perfect continuous film without aperture "a"; and in such a case the sum of circumferential length(s) of aperture(s) "a" is 0 nm.

Incidentally, in the image processing, the contrast of the secondary electron image or reflection electron image obtained by the scanning electron microscope is binarized, for example. The summed length of the circumferential length(s) of the aperture(s) "a" is obtained by recognizing the boundary portion(s) of the binarized contrast as the peripheral border of the aperture(s) "a", and summing the length(s) of all boundary portion(s) within the surface region S with an area of about 500 nm×500 nm.

The conductive material constituting the aforesaid electrode layer 1b is silver (Ag) or an alloy containing silver as a main component. In the case where the silver constituting the electrode layer 1b is an alloy containing silver as a main component, examples of the alloy include silver magnesium (AgMg), silver copper (AgCu), silver palladium (AgPd), silver palladium copper (AgPdCu), silver indium (AgIn), silver aluminium (AgAl), silver gold (AgAu) and the like.

The electrode layer 1b may be formed by a method based on wet process, a method based on dry process or the like, wherein examples of the method based on wet process include a coating method, an ink-jet method, a dipping method and the like, and the method based on dry process include a deposition method (e.g., a resistance heating method, an EB method or the like), a sputtering method, a CVD method and the like). Among these methods, the deposition method is preferably used. For example, if a sputtering method is used to form the electrode layer 1b, a sputter target whose additive element concentration with respect to silver (Ag), the main component, has been previously adjusted is used to perform film-formation by sputtering method. The sputtering method may be used to form the electrode layer 1b in all cases where the aforesaid additive elements are used; however, the sputtering method is particularly preferred to be used to form the electrode layer 1b in the case where copper (Cu) or palladium (Pd) is used as an additive element. Also, a deposition method is particularly preferred to be used to form the electrode layer 1b in the case where indium (In), magnesium (Mg) or aluminium (Al) is used as an additive element. In such a case, the additive element is co-deposited with silver. At this time, a deposition method is used in which the concentration of the additive element with respect to silver (Ag), the main component, is adjusted by adjusting the deposition rate of the additive element and the deposition rate of silver (Ag) respectively. The electrode layer 1b is characterized that, by being formed on the nitrogen-containing layer 1a, the electrode layer 1b has sufficient electrical conductivity without performing high-temperature annealing or the like after film-formation; however, high-temperature annealing or the like may also be performed after film-formation according to necessity.

Alternatively, in the electrode layer 1b described above, the layer of silver or an alloy containing silver as a main component may include a plurality of layers laminated one on another, according to necessity.

<Nitrogen-Containing Layer 1a>

As shown in the cross-sectional view of FIG. 2, the nitrogen-containing layer 1a is a layer provided as a ground layer of the electrode layer 1b. The nitrogen-containing layer 1a is a layer formed by using an organic material, for example, and the electrode layer 1b is formed on the nitrogen-containing layer 1a, wherein the electrode layer 1b is formed of a material so that the film of such material grows in a single-layer growth mode (Frank-van der Merwe: FW mode). As an example, in the case where the electrode layer 1b is formed by silver or an alloy containing silver as a main component, the nitrogen-containing layer 1a is formed by an organic material containing nitrogen atom (N). The detailed configuration of the nitrogen-containing layer 1a in the case where the electrode layer 1b is formed by silver or an alloy containing silver as a main component will be described below.

The nitrogen-containing layer 1a is a layer formed by using a compound having a specific relationship with silver (Ag), which is the main material constituting the electrode layer 1b, selected from compounds having a heterocycle with a nitrogen atom (N) as a hetero atom. Here, the effective action energy $\Delta Eef$ shown in the following Formula (1) is defined as interaction energy between the compound and silver. A compound whose effective action energy $\Delta Eef$ satisfies the following Formula (2) and has a specific relationship is used to form the nitrogen-containing layer 1a.

[Mathematical Expression 1]

$$\Delta Eef = n \times \Delta E/s \quad (1)$$

n: Number of nitrogen atom(s) contained in compound and stably bonded with silver (Ag)
$\Delta E$: Interaction energy between nitrogen atom (N) and silver (Ag)
s: Surface area of compound $$-0.4 \leq \Delta Eef \leq -0.10 [kcal/mol \cdot Å^2] \quad (2)$$

In Formula (1), the "number [n] of nitrogen atom(s) contained in the compound and stably bonded with silver" is a number obtained by selecting and counting, from the nitrogen atoms contained in the compound, only the nitrogen atom(s) stably bonded with silver as specific nitrogen atom(s). The nitrogen atoms from which the specific nitrogen atom(s) is (are) to be selected include all nitrogen atoms contained in the compound, instead of being limited to the nitrogen atom(s) which constitute the heterocycle. The selection of the specific nitrogen atom(s) from all nitrogen atoms contained in the compound is performed in the following manner either with a bond distance [r(Ag·N)] between silver and nitrogen atom in the compound calculated by, for example, a molecular orbital calculation method as an index, or with an angle between nitrogen atom and silver with respect to the ring containing nitrogen atom in the compound (i.e., a dihedral angle [D]) as an index. Incidentally, the molecular orbital calculation is performed by using Gaussian 03 (Gaussian, Inc., Wallingford, Conn., 2003).

First, in the case where the selection of the specific nitrogen atom(s) is performed with the bond distance [r(Ag·N)] as an index, considering the steric structure of each compound, the distance at which nitrogen atom(s) in the compound is stably bonded with silver is set as a "stable bond distance". Further, the bond distance [r(Ag·N)] for each nitrogen atom contained in the compound is calculated by using the molecular orbital calculation method. The nitrogen atom(s) whose calculated bond distance [r(Ag·N)] is close to the "stable bond distance" is selected as the specific nitrogen atom(s). Such selection of the nitrogen atom(s) is applicable to a compound having many nitrogen atoms which constitute the heterocycle, and a compound having many nitrogen atoms which do not constitute the heterocycle.

While in the case where the selection of the specific nitrogen atom(s) is performed with the dihedral angle [D] as an index, the molecular orbital calculation method is used to calculate the dihedral angle [D]. The nitrogen atom(s) whose calculated dihedral angle [D] satisfies "D<10 degrees" is selected as the specific nitrogen atom(s). Such selection of the nitrogen atom(s) is applicable to a compound having many nitrogen atoms which constitute the heterocycle.

The interaction energy [ΔE] between silver (Ag) and nitrogen (N) contained in the compound is an interaction energy between nitrogen selected in the above manner and silver, and is possible to be calculated by the molecular orbital calculation method.

Further, the surface area [s] is calculated with respect to the structure of each compound, by using a Tencube/WM (manufactured by Tencube Co., Ltd).

It is further preferred that the effective action energy ΔEef defined above falls in a range satisfying the following Formula (3).

[Mathematical Expression 2]

$$\Delta Eef \leq -0.20 [\text{kcal/mol} \cdot \text{Å}^2] \quad (3)$$

Examples of the heterocycle having a nitrogen atom contained in the compound constituting the nitrogen-containing layer 1a as a hetero atom include aziridine, azirine, azetidine, azete, azolidine, azole, piperidine, pyridine, azepane, azepine, imidazole, pyrazole, oxazole, thiazole, imidazoline, pyrazine, morpholine, thiazine, indole, isoindole, benzimidazole, purine, quinoline, isoquinoline, quinoxaline, cinnoline, pteridine, acridine, carbazole, benzo-C-cinnoline, porphyrin, chlorine, choline, and the like.

For example, a compound represented by the following General Formula (1) or a compound represented by General Formula (2) shown later is favorably used as the compound having a heterocycle with a nitrogen atom as a hetero atom. The nitrogen-containing layer 1a constituting the transparent electrode 1 is formed by using a compound represented by General Formula (1) or (2) and selected from the compounds satisfying Formula (1) or (2).

or —N=, wherein R3 represents a hydrogen atom or a substituent, and wherein at least one of E71 to E79 and at least one of E80 to E88 each represent —N=; and n3 and n4 each represent an integer of 0 to 4, wherein the sum of n3 and n4 is 2 or more.

Examples of the arylene group represented by Y5 in General Formula (1) include an o-phenylene group, a p-phenylene group, a naphthalenediyl group, an anthracenediyl group, a naphthacenediyl group, a pyrenediyl group, a naphthylnaphthalenediyl group, a biphenyldiyl group (for example, a [1,1'-biphenyl]-4,4'-diyl group, a 3,3'-biphenyldiyl group, and a 3,6-biphenyldiyl group), a terphenyldiyl group, a quaterphenyldiyl group, a quinquephenyldiyl group, a sexiphenyldiyl group, a septiphenyldiyl group, an octiphenyldiyl group, a nobiphenyldiyl group and a deciphenyldiyl group and the like.

Examples of the heteroarylene group represented by Y5 in General Formula (1) include a divalent group derived from the group consisting of a carbazole ring, a carboline ring, a diazacarbazole ring (also referred to as a monoazacarboline ring, indicating a ring structure formed in such a manner that one of the carbon atoms constituting the carboline ring is replaced with a nitrogen atom), a triazole ring, a pyrrole ring, a pyridine ring, a pyrazine ring, a quinoxaline ring, a thiophene ring, an oxadiazole ring, a dibenzofuran ring, a dibenzothiophene ring and an indole ring.

It is preferred that the divalent linking group (which is an arylene group, a heteroarylene group or a combination thereof represented by Y5) contains, among the heteroarylene groups, a group derived from a condensed aromatic heterocycle formed by condensing three or more rings, and further, it is preferred that the group derived from the condensed aromatic heterocycle formed by condensing three or more rings is a group derived from a dibenzofuran ring or a group derived from a dibenzothiophene ring.

Examples of the substituent represented by R3 of —C(R3)=represented by each of E51 to E66 and E71 to E88 in General Formula (1) include: an alkyl group (for example, a methyl group, an ethyl group, a propyl group, an isopropyl group, a tert-butyl group, a pentyl group, a hexyl group, an

[Chemical Formula 1]

General Formula (1)

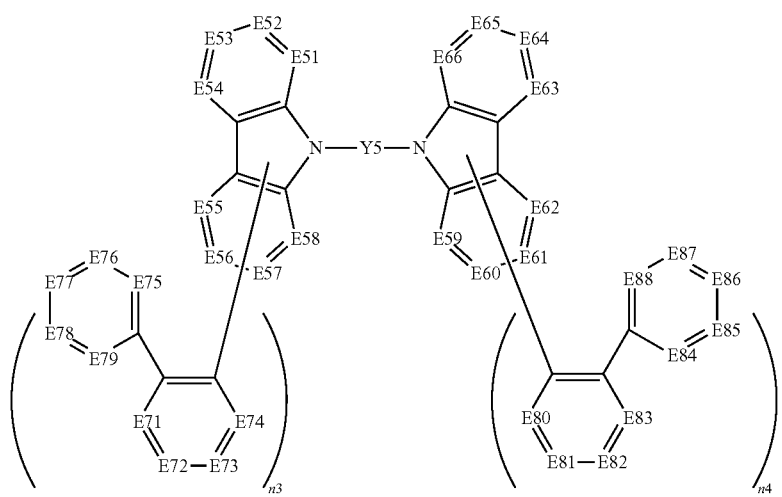

In General Formula (1), Y5 represents a divalent linking group which is an arylene group, a heteroarylene group or a combination of the arylene group and the heteroarylene group; E51 to E66 and E71 to E88 each represent —C(R3)= octyl group, a dodecyl group, a tridecyl group, a tetradecyl group, a pentadecyl group and the like); a cycloalkyl group (for example, a cyclopentyl group, a cyclohexyl group and the like); an alkenyl group (for example, a vinyl group, an allyl group and the like); an alkynyl group (for example, an ethynyl group, a propargyl group and the like); an aromatic hydrocarbon group (also referred to as an aromatic carbon ring group, an aryl group or the like, and examples of the aromatic hydrocarbon group include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenyryl group and the like); an aromatic heterocyclic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, a diazacarbazolyl group (which is formed by substituting any one of carbon atoms constituting a carboline ring of the aforesaid carbolinyl group with a nitrogen atom), a phtharazinyl group and the like); a heterocyclic group (for example, a pyrrolidyl group, an imidazolidyl group, a morpholyl group, an oxazolidyl group and the like); an alkoxy group (for example, a methoxy group, an ethoxy group, a propyloxy group, a pentyloxy group, an hexyloxy group, an octyloxy group, a dodecyloxy group and the like); a cycloalkoxy group (for example, a cyclopentyloxy group, a cyclohexyloxy group and the like); an aryloxy group (for example, a phenoxy group, a naphthyloxy group and the like); an alkylthio group (for example, a methylthio group, an ethylthio group, a propylthio group, a pentylthio group, a hexylthio group, an octylthio group, a dodecylthio group and the like); a cycloalkylthio group (for example, a cyclopentylthio group, a cyclohexylthio group and the like); an arylthio group (for example, a phenylthio group, a naphthylthio group and the like); an alkoxycarbonyl group (for example, a methyloxycarbonyl group, an ethyloxycarbonyl group, a butyloxycarbonyl group, an octyloxycarbonyl group, a dodecyloxycarbonyl group and the like); an aryloxycarbonyl group (for example, a phenyloxycarbonyl group, a naphthyloxycarbonyl group and the like); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group and the like); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group and the like); an acyloxy group (for example, an acetyloxy group, an ethylcarbonyloxy group, a butylcarbonyloxy group, an octylcarbonyloxy group, a dodecylcarbonyloxy group, a phenylcarbonyloxy group and the like); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group and the like); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group and the like); an ureido group (for example, a methylureido group, an ethylureido group, a pentylureido group, a cyclohexylureido group, an octylureido group, a dodecylureido group, a phenylureido group, a naphthylureido group, a 2-pyridylaminoureido group and the like); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group and the like); an alkylsulfonyl group (for example, a methylsulfonyl group, an ethylsulfonyl group, a butylsulfonyl group, a cyclohexylsulfonyl group, a 2-ethylhexylsulfonyl group, a dodecylsulfonyl group and the like); an arylsulfonyl group or a heteroarylsulfonyl group (for example, a phenylsulfonyl group, a naphthylsulfonyl group, a 2-pyridylsulfonyl group and the like); an amino group (for example, an amino group, an ethylamino group, a dimethylamino group, a butylamino group, a cyclopentylamino group, a 2-ethylhexylamino, a dodecylamino group, an anilino group, a naphthylamino group, a 2-pyridylamino group, a piperidyl group (also referred to as a piperidinyl group), a 2,2,6,6-tetramethyl piperidinyl group and the like); a halogen atom (for example, a fluorine atom, a chlorine atom, a bromine atom and the like); a fluorohydrocarbon group (for example, a fluoromethyl group, a trifluoromethyl group, a pentafluoroethyl group, a pentafluorophenyl group and the like); a cyano group; a nitro group; a hydroxyl group; a mercapto group; a silyl group (for example, a trimethylsilyl group, a triisopropylsilyl group, a triphenylsilyl group, a phenyldiethylsilyl group and the like); a phosphate group (for example, dihexylphosphoryl group and the like); a phosphite group (for example, diphenylphosphinyl group and the like); a phosphono group, and the like.

Part of these substituents may be further substituted by the above-mentioned substituent. Further, a plurality of these substituents may be bonded to each other to form a ring.

In General Formula (1), it is preferable that six or more of E51 to E58 and six or more of E59 to E66 are each represented by —C(R3)=.

It is preferable that, in General Formula (1), at least one of E75 to E79 and at least one of E84 to E88 each represent —N=.

It is further preferable that, in General Formula (1), any one of E75 to E79 and any one of E84 to E88 each represent —N=.

Further, it is preferable that, in General Formula (1), E71 to E74 and E80 to E83 are each represented by —C(R3)=.

Further, it is preferred that, in the compound represented by General Formula (1), E53 is represented by —C(R3)=, wherein R3 represents a liking site; and it is further preferred that E61 is also represented by —C(R3)=, wherein R3 represents a liking site.

Furthermore, it is preferred that E75 and E84 are each represented by —N=, and E71 to E74 and E80 to E83 are each represented by —C(R3)=.

As another example of the compound constituting the nitrogen-containing layer 1a, a compound represented by the following General Formula (2) is used.

[Chemical Formula 2]

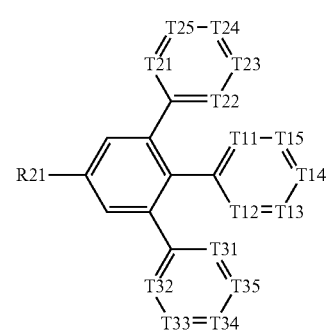

General Formula (2)

In General Formula (2), R21 represents a substituent. Further, in General Formula (2), T11, T12, T21 to T25, and T31 to T35 each represent —C(R22)= or —N=, and T13 to T15 each represent —C(R22)=; wherein R22 represents a hydrogen atom (H) or a substituent. At least one of T11 and T12 represents nitrogen atom (—N=), at least one of T21 to T25 represents nitrogen atom (—N=), and at least one of T31 to T35 represents nitrogen atom (—N=).

In General Formula (2), examples of the substituent represented by R21 and R22 include the same ones as described in the examples of R3 in General Formula (1). Part of these substituents may be further substituted by the above-mentioned substituent.

In the case where the aforesaid nitrogen-containing layer 1a is formed on the base material 11, the nitrogen-containing layer 1a may be formed by a method based on wet process (such as a coating method, an ink-jet method, a dipping method or the like), a method based on dry process (such as a deposition method (e.g., a resistance heating method, an EB method or the like), a sputtering method, a CVD method or the like) or the like. Among these methods, the deposition method is preferably used.

[Concrete Examples of Compound]

Concrete examples (1 to 134) of the compound constituting the nitrogen-containing layer 1a are shown below; however, the present invention is not limited thereto. Note that, the concrete examples also include examples of compounds which are not included in General Formula (1) and General Formula (2). The nitrogen-containing layer 1a constituting the transparent electrode 1 is formed by using a compound satisfying Formula (1) or Formula (2) and selected from the compounds (1 to 134) exemplified below.

[Chemical Formula 3]

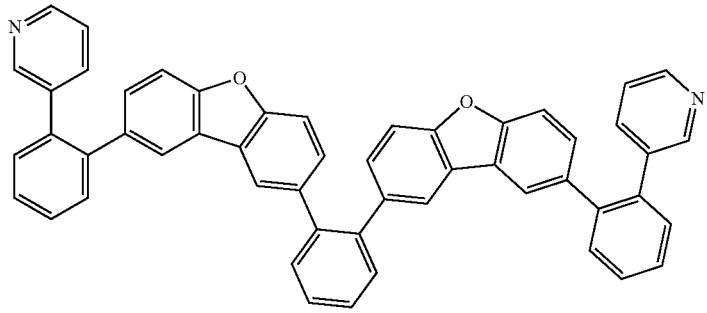

1

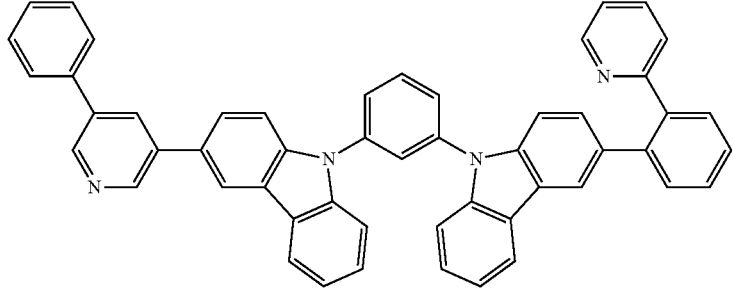

2

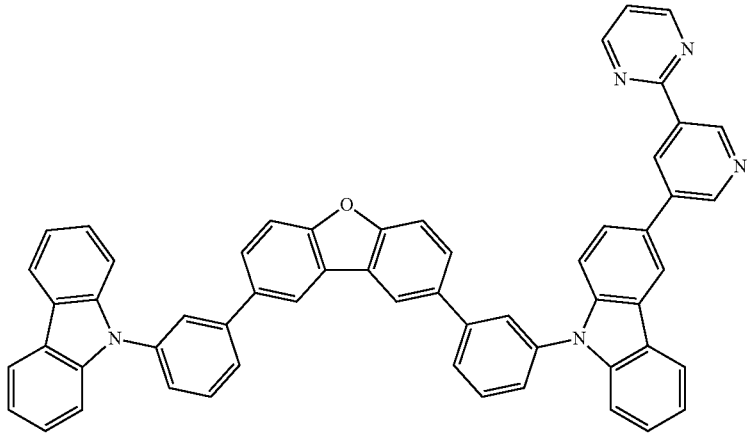

3

-continued
4
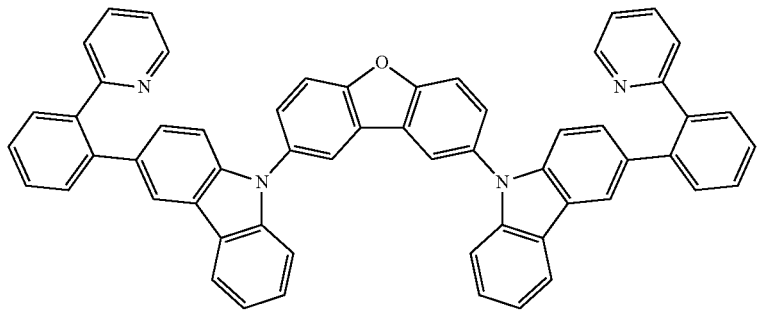
5
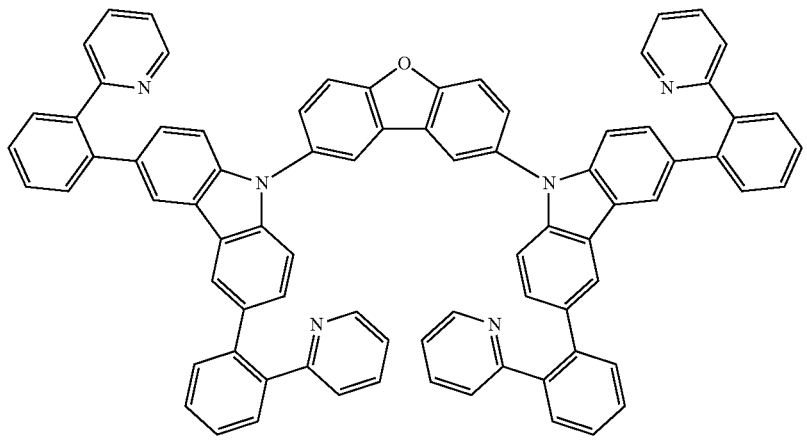
[Chemical Formula 4]
6
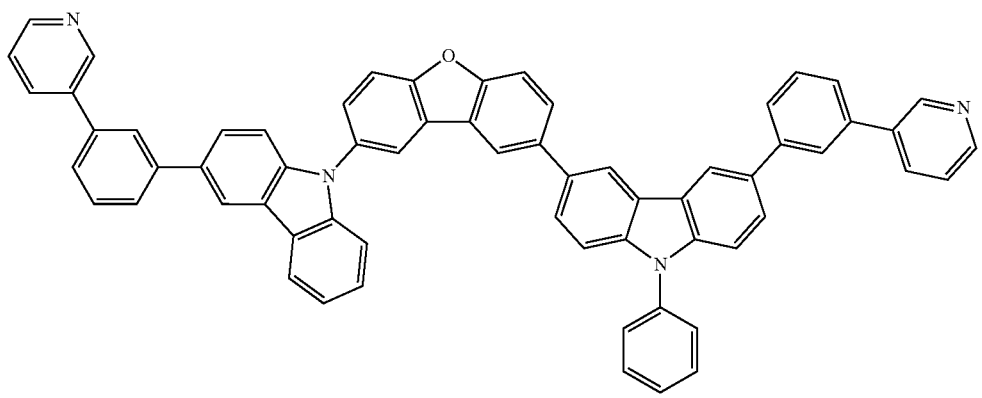
7
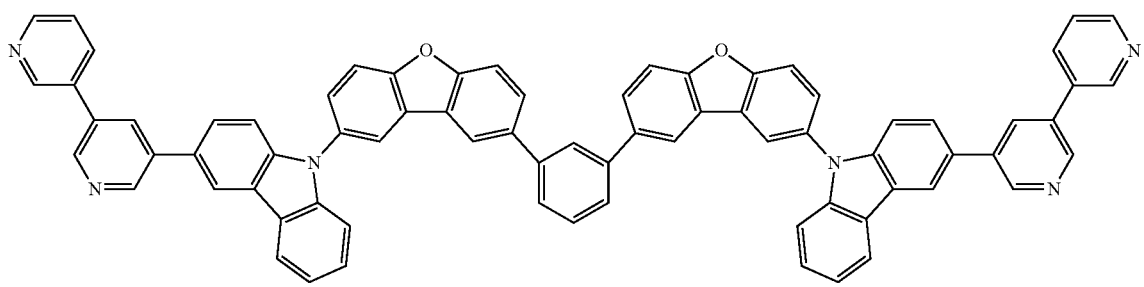

-continued
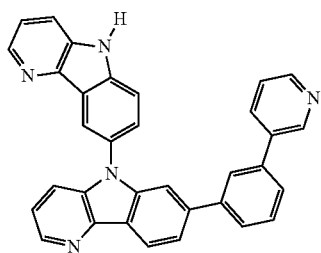
8
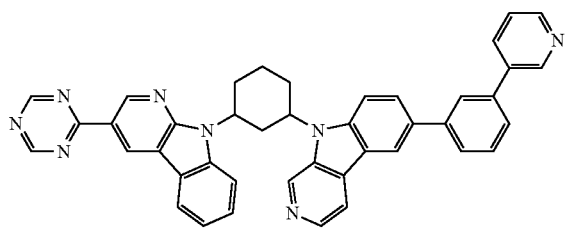
9
[Chemical Formula 5]
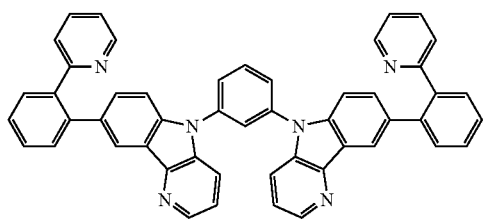
10
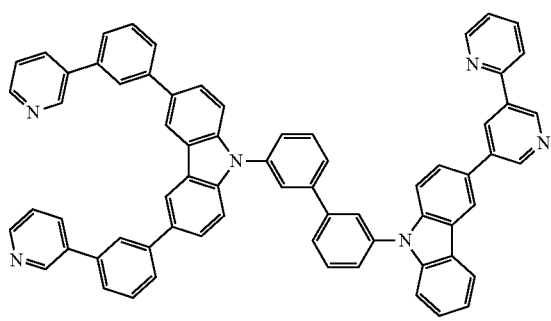
11
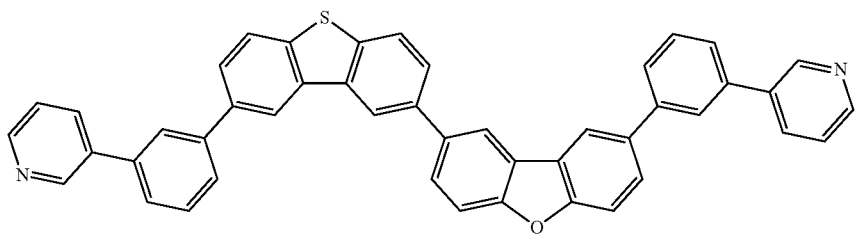
12
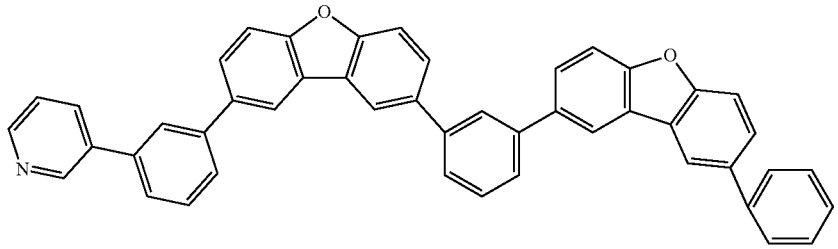
13
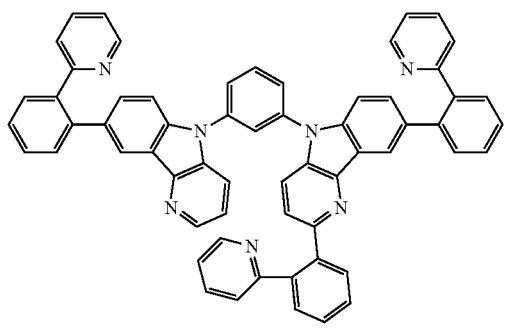
14
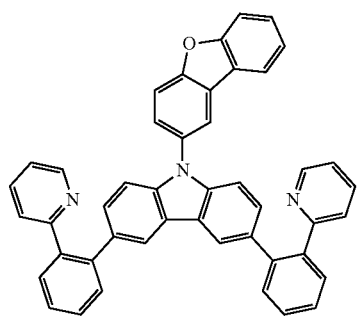
15

[Chemical Formula 6]
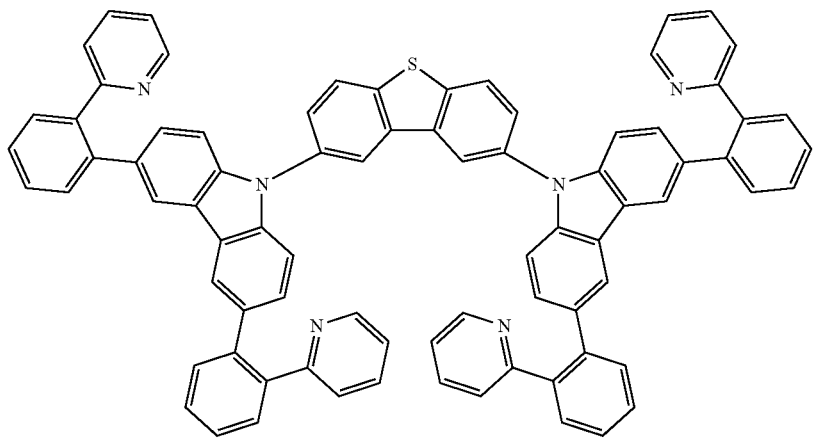
16
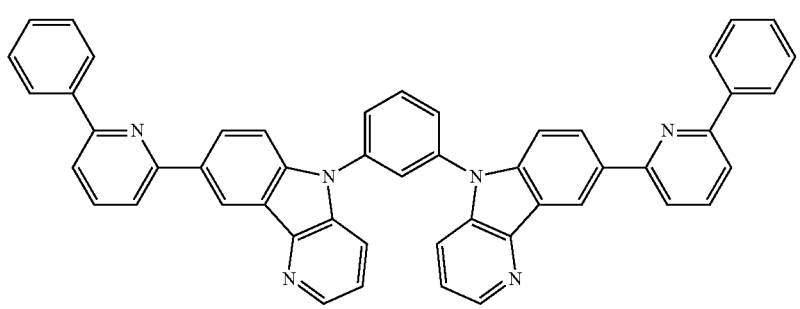
17
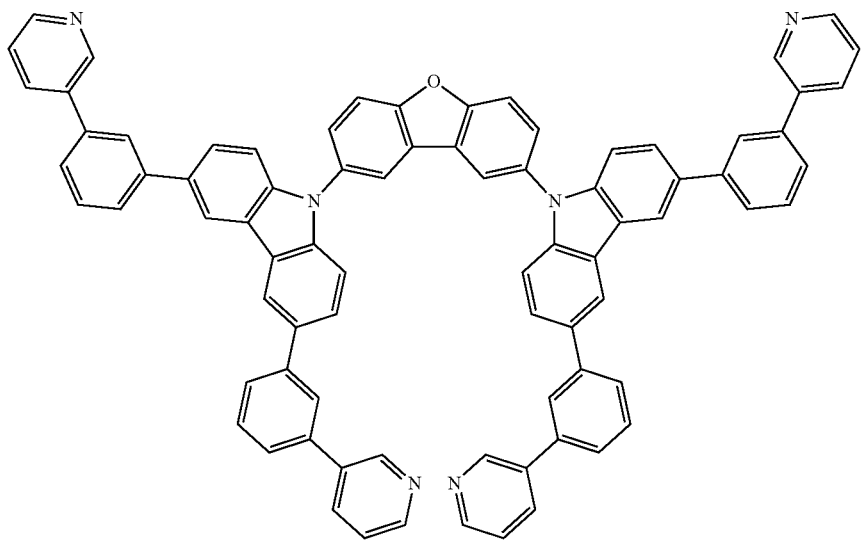
18
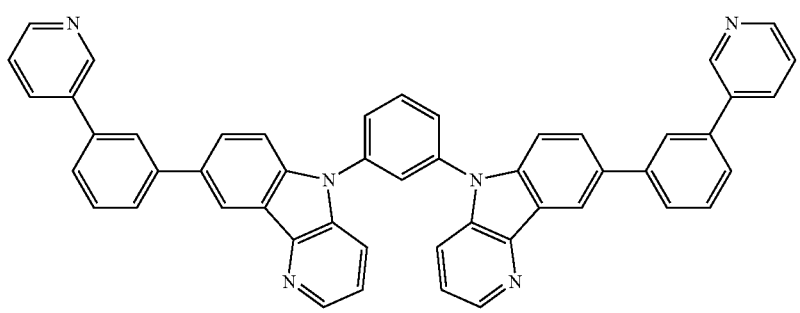
19

[Chemical Formula 7]
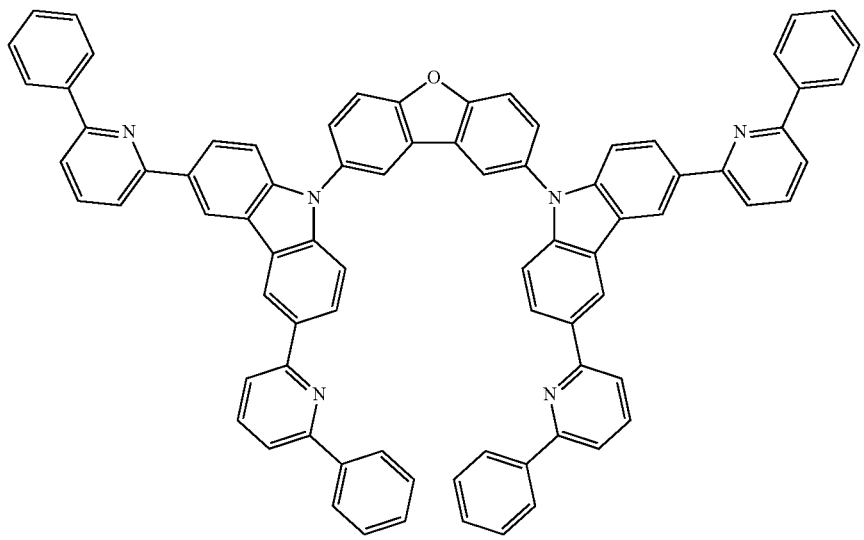
20
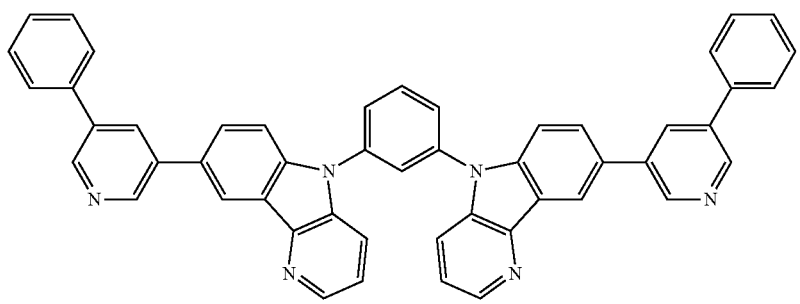
21
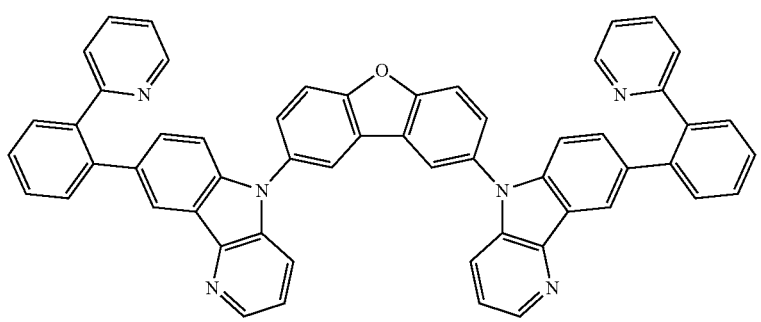
22
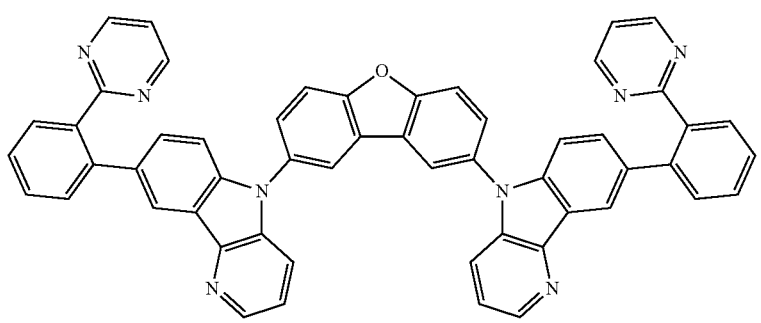
23

[Chemical Formula 8]
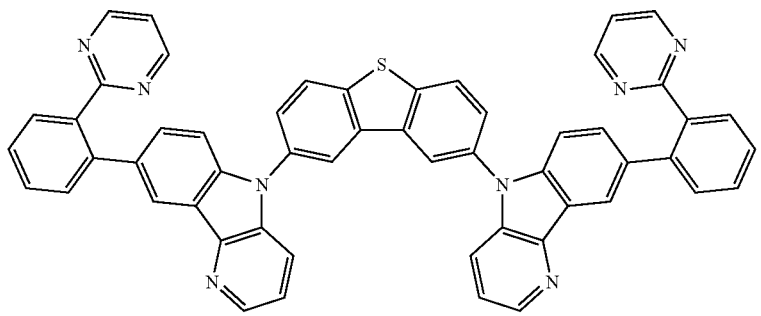
24
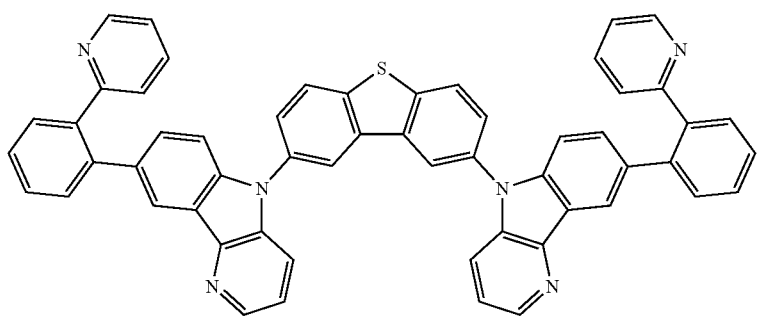
25
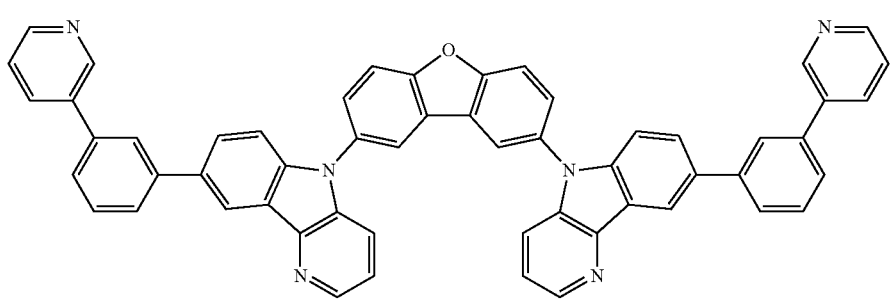
26
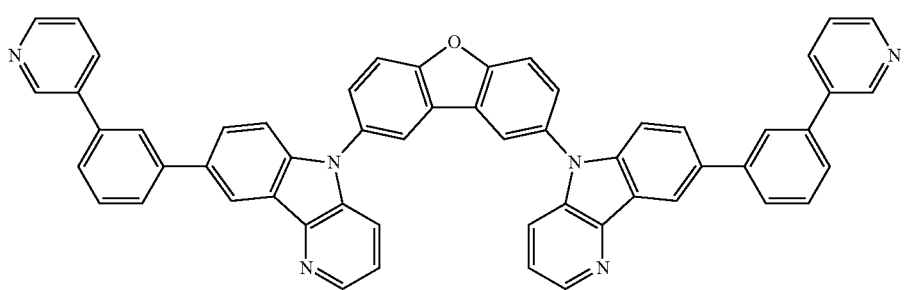
27
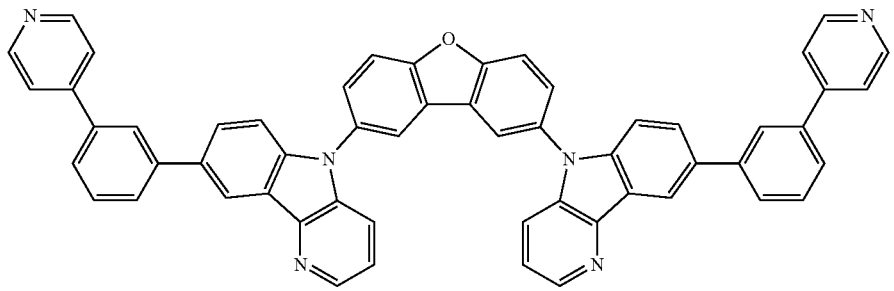
28

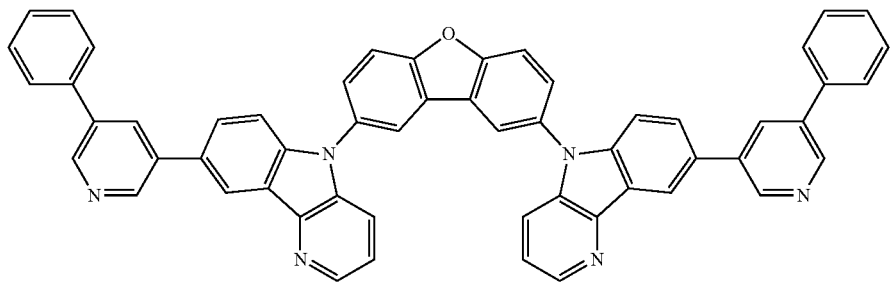
29
[Chemical Formula 9]
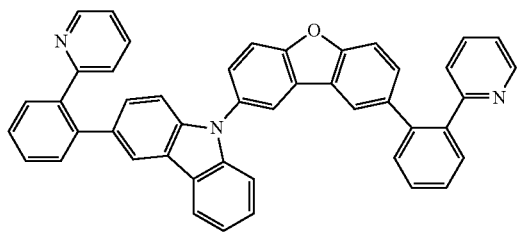
30
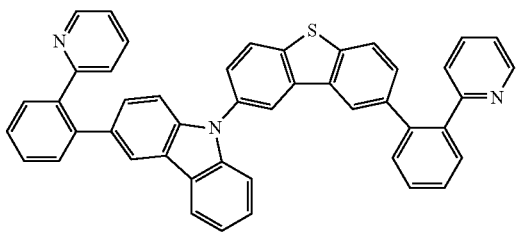
31
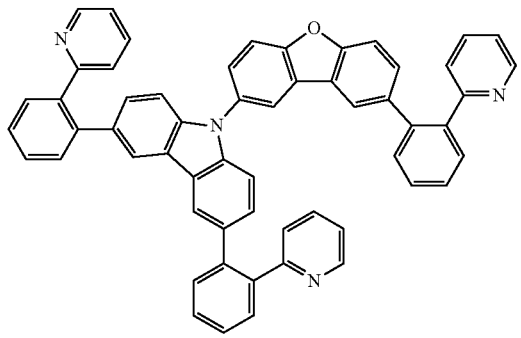
32
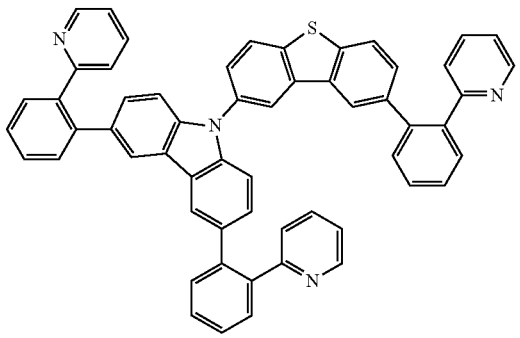
33
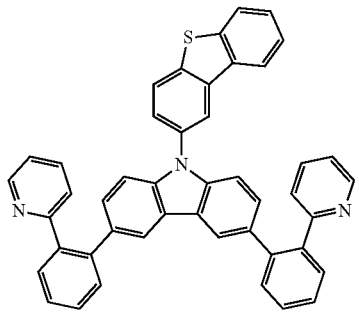
34
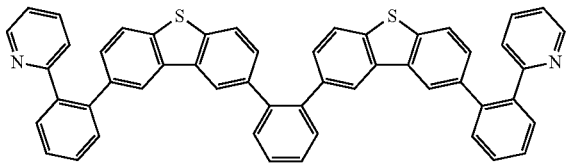
35
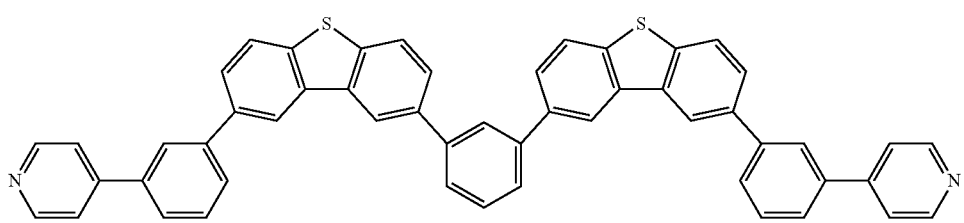
36

[Chemical Formula 10]
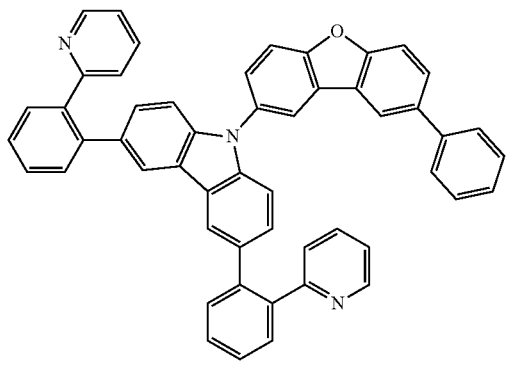
37
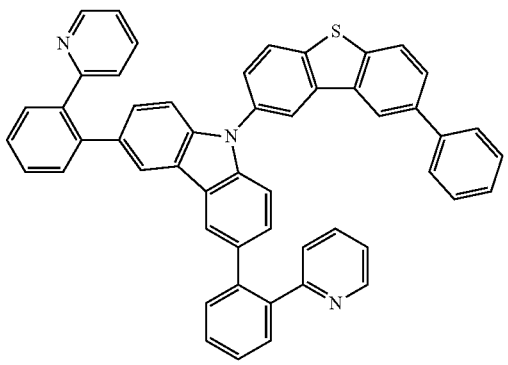
38
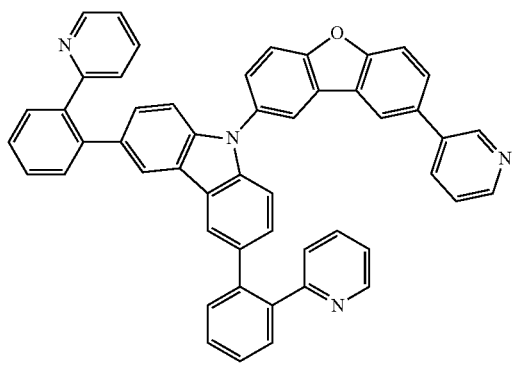
39
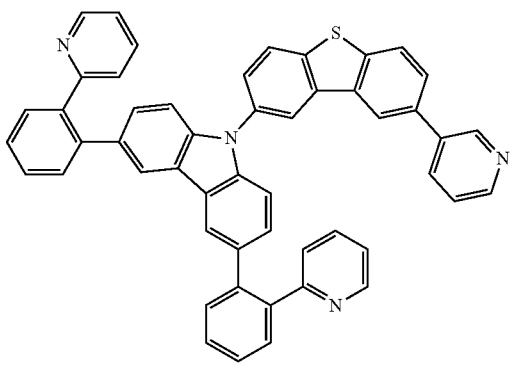
40
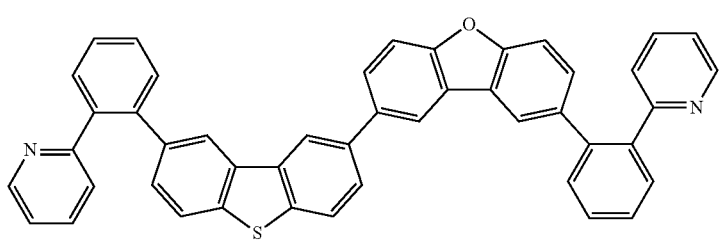
41
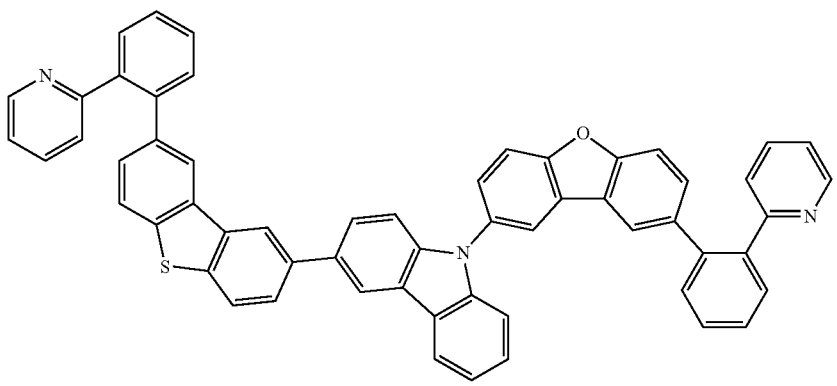
42

[Chemical Formula 11]
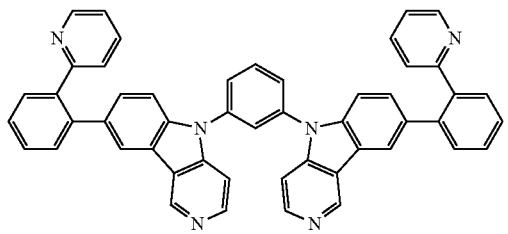
43
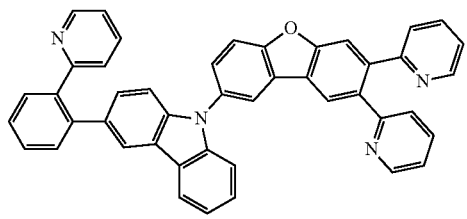
44
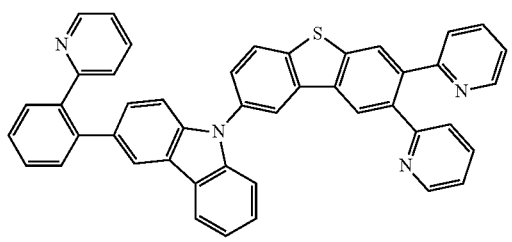
45
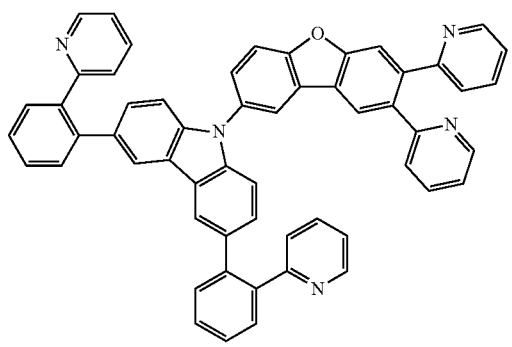
46
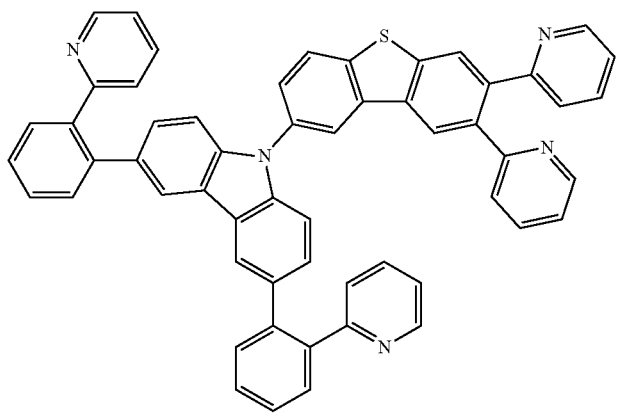
47
[Chemical Formula 12]
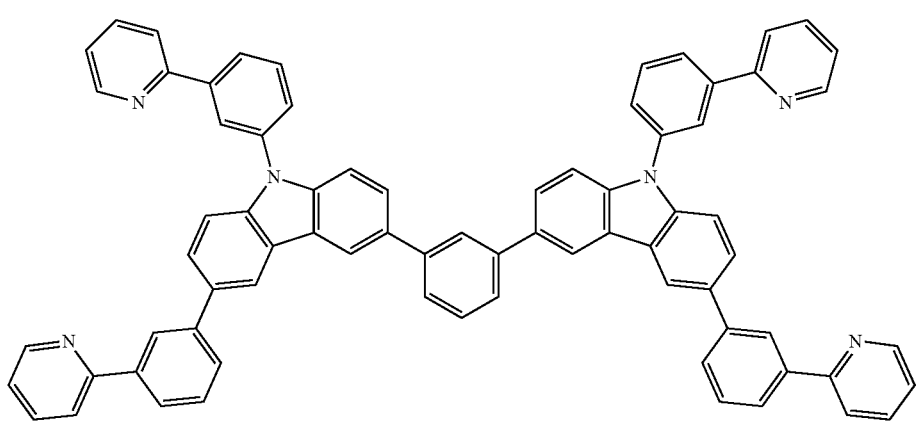
48

49
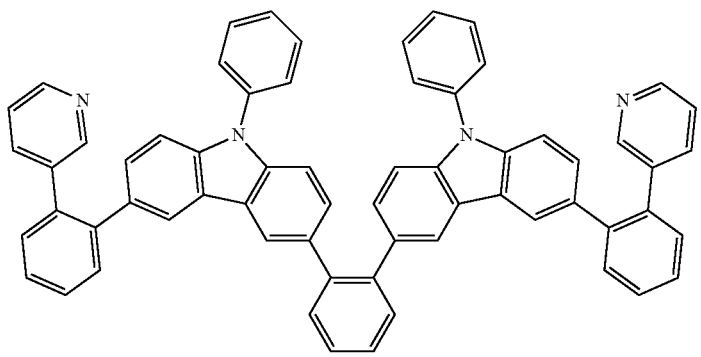
50
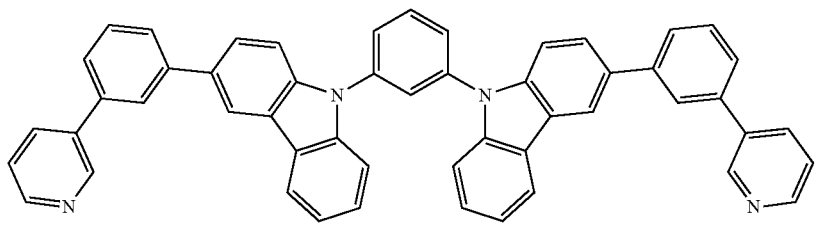
51
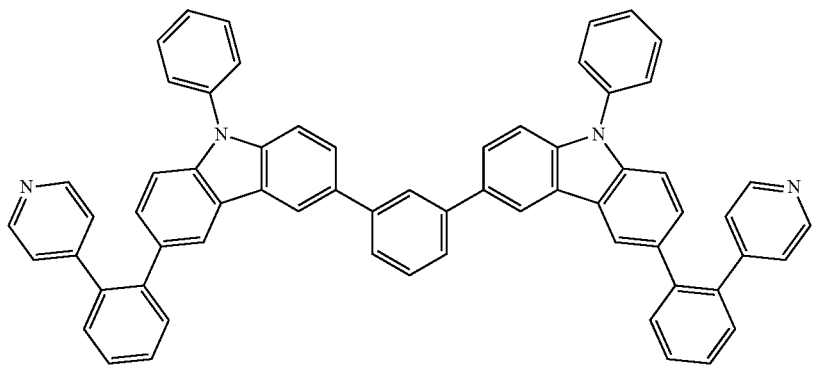
52
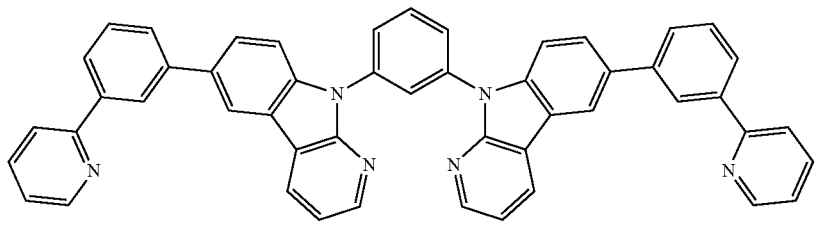
[Chemical Formula 13]
53
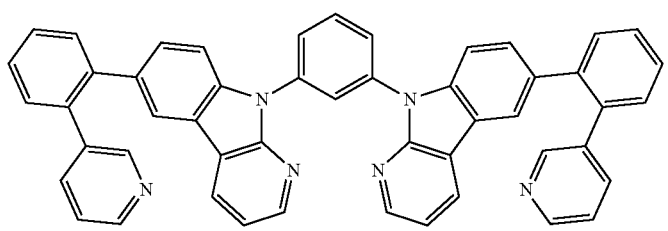

54
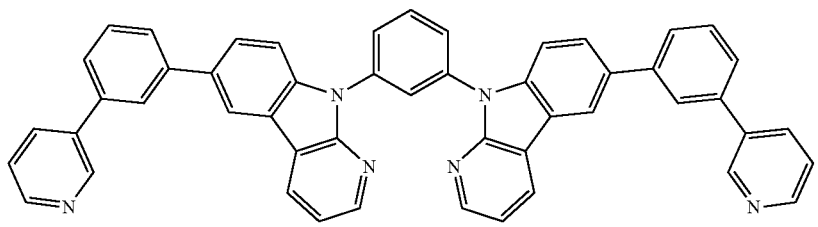
55
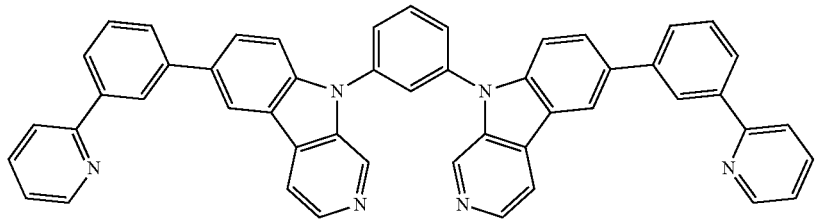
56
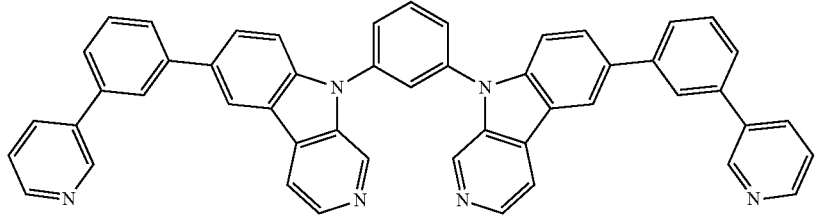
57
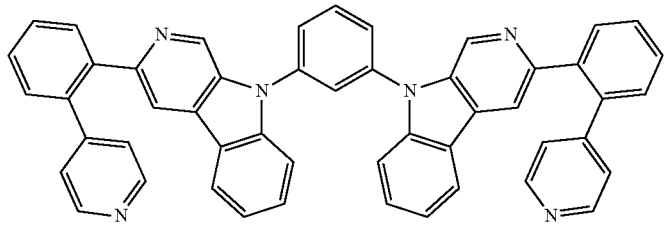
58
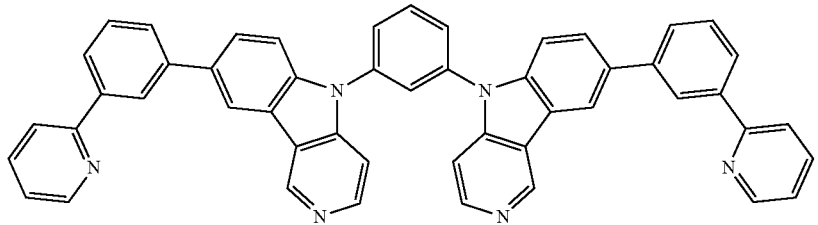
[Chemical Formula 14]
59    60
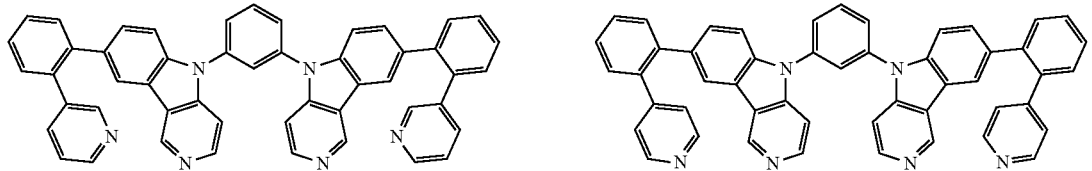
61
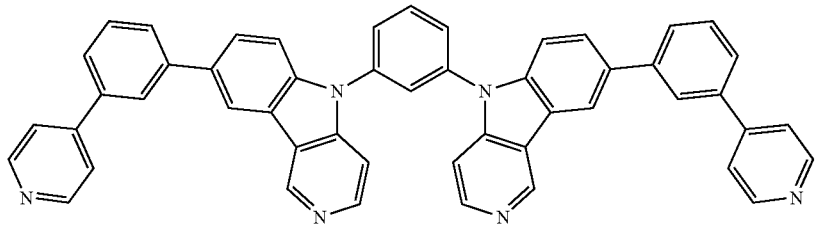

-continued
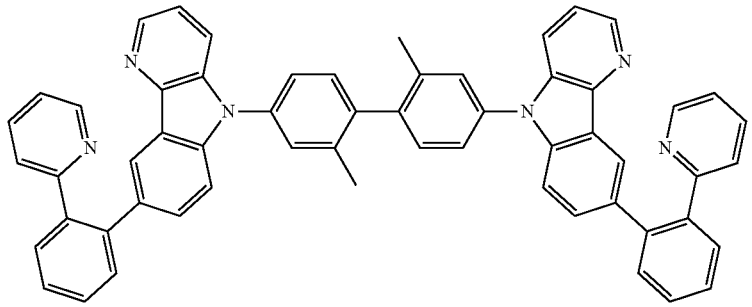
62
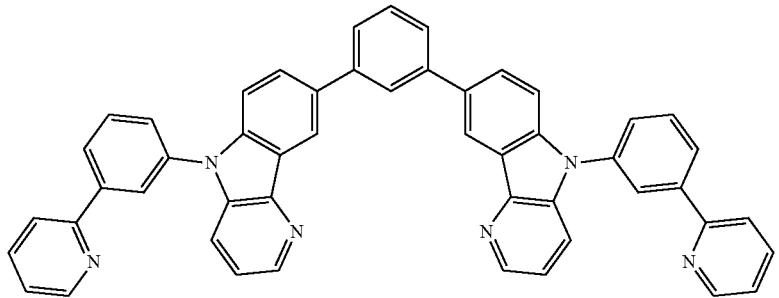
63
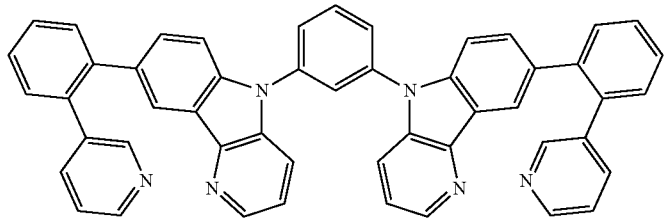
64
[Chemical Formula 15]
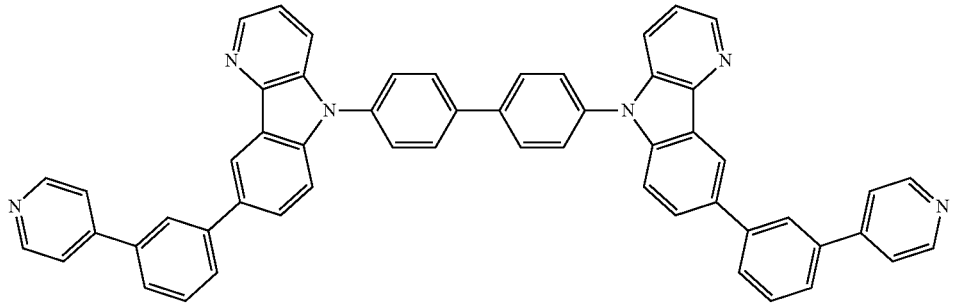
65
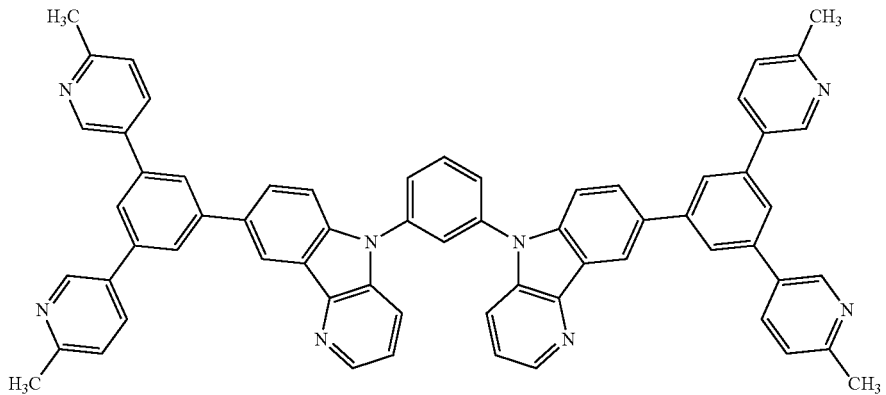
66

-continued
67
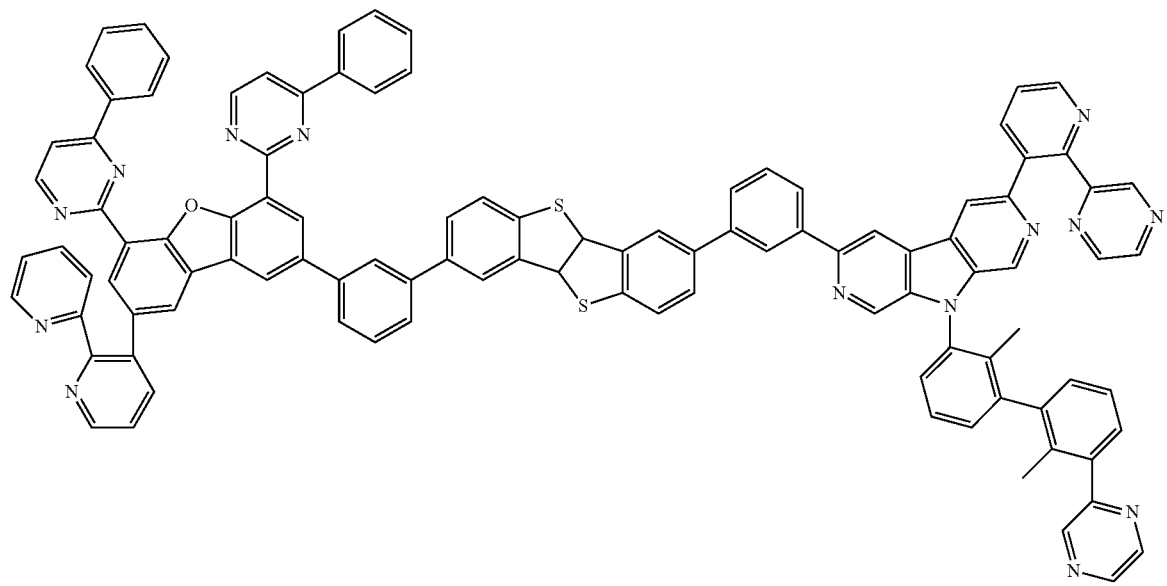
[Chemical Formula 16]
68
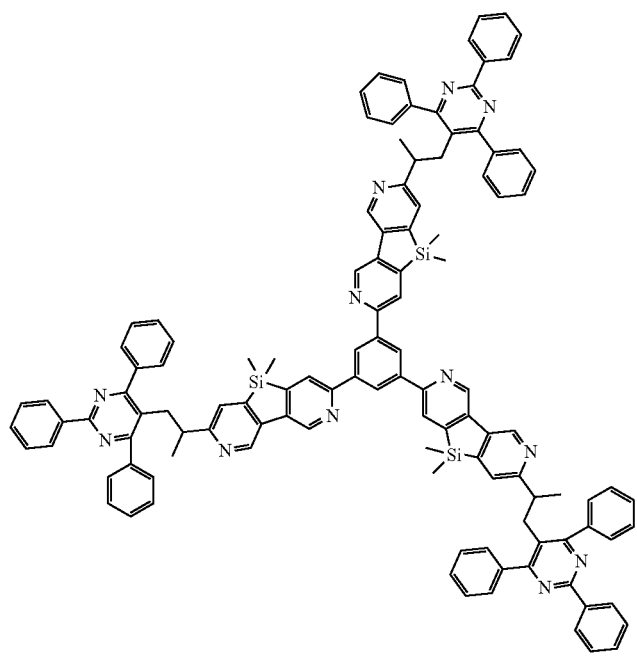

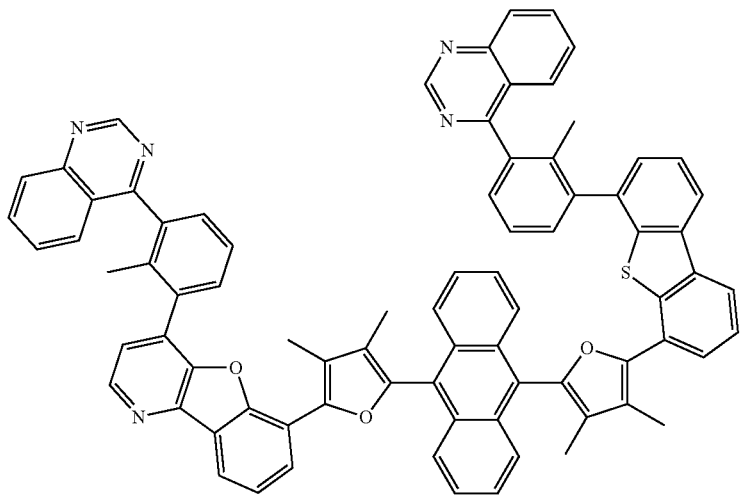
[Chemical Formula 17]
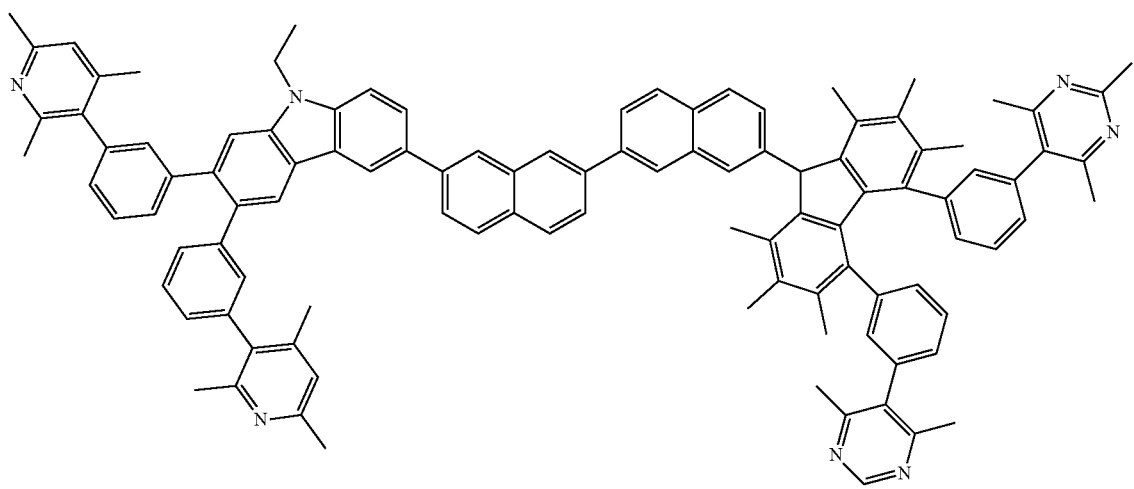
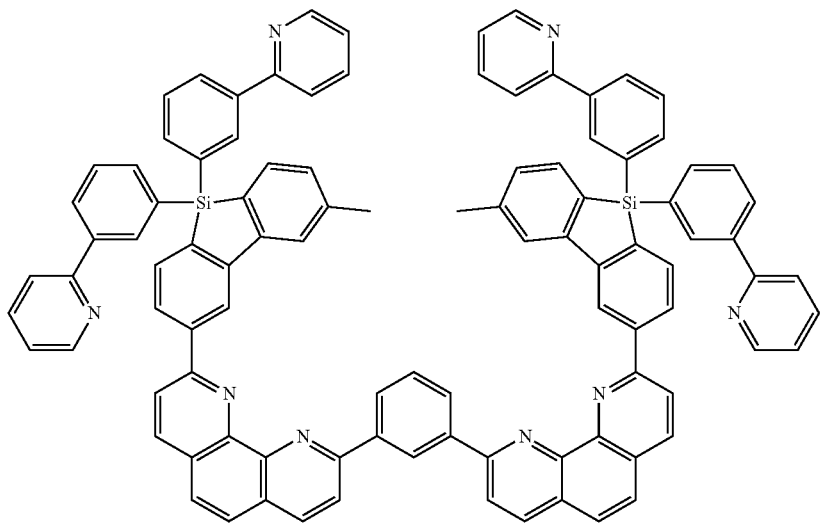

-continued
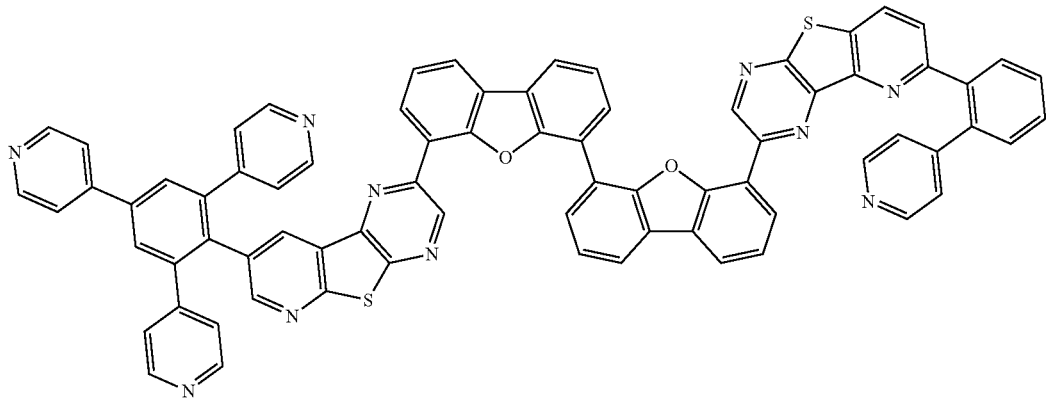
72
[Chemical Formula 18]
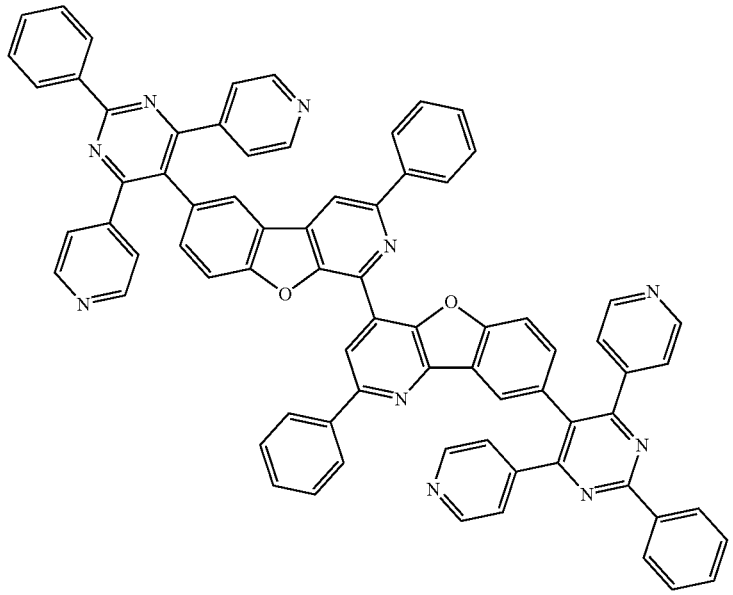
73
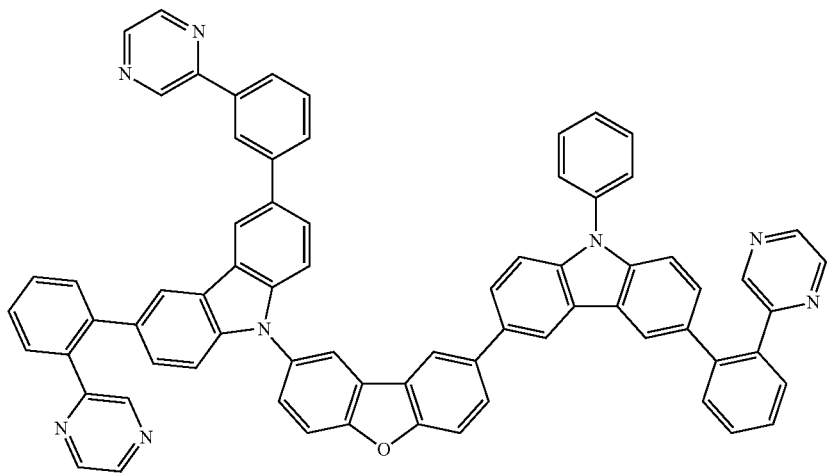
74

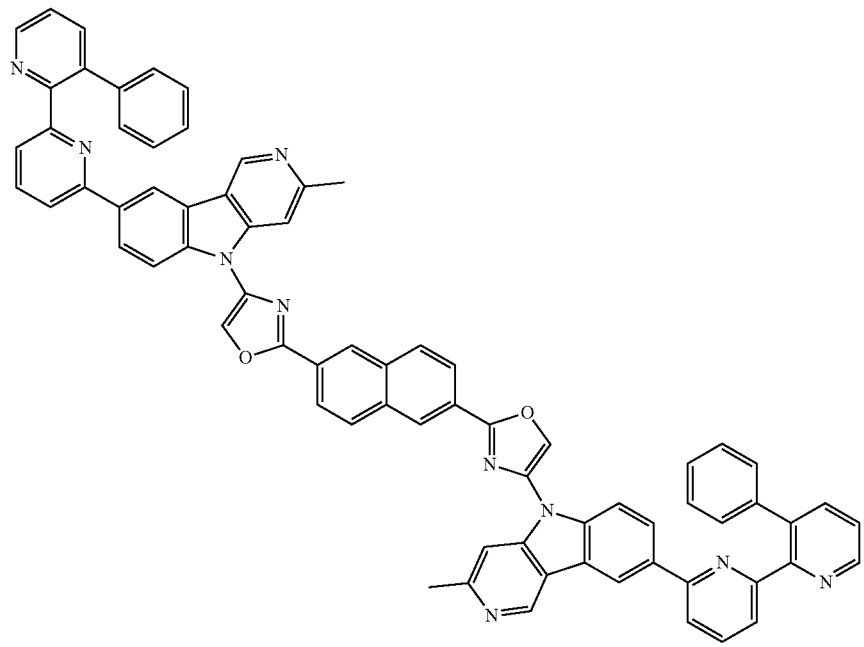
75
[Chemical Formula 19]
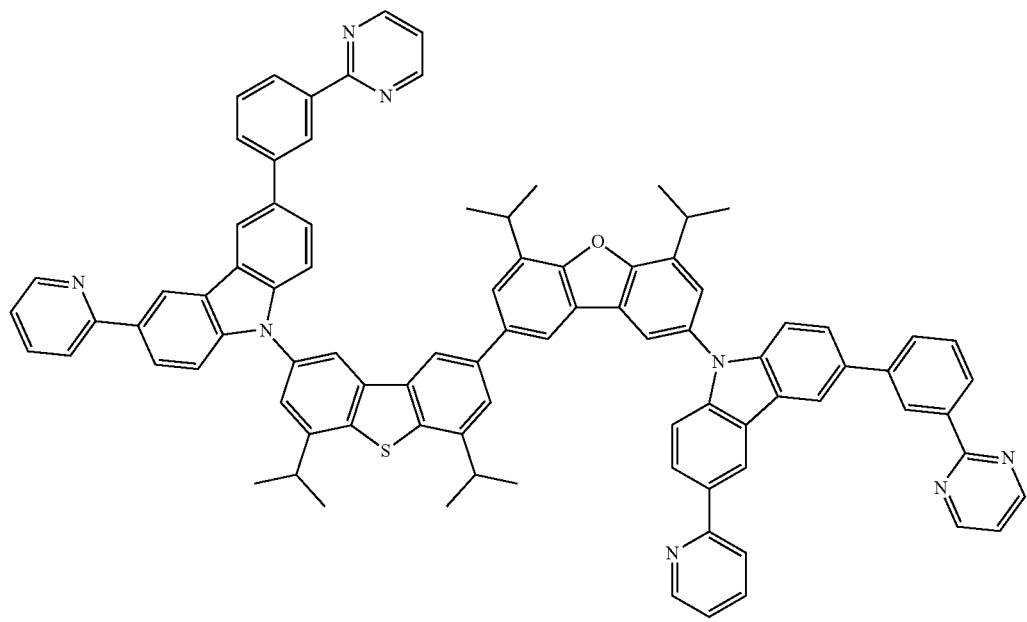
76

77
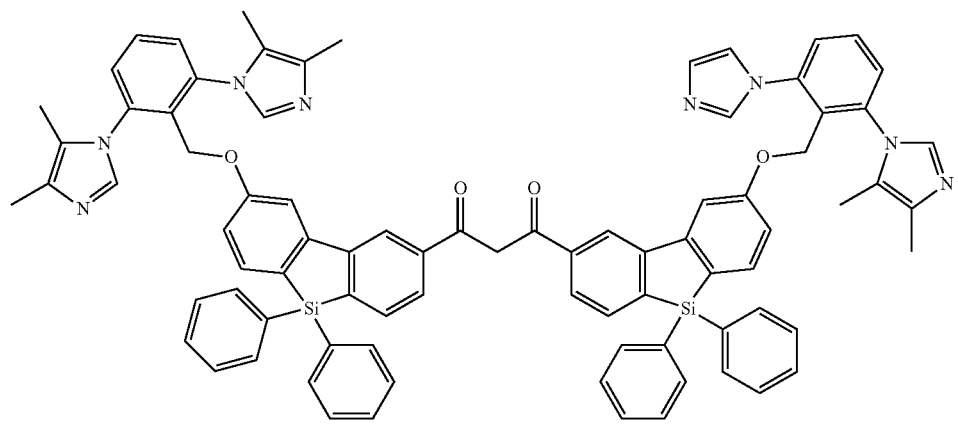
78
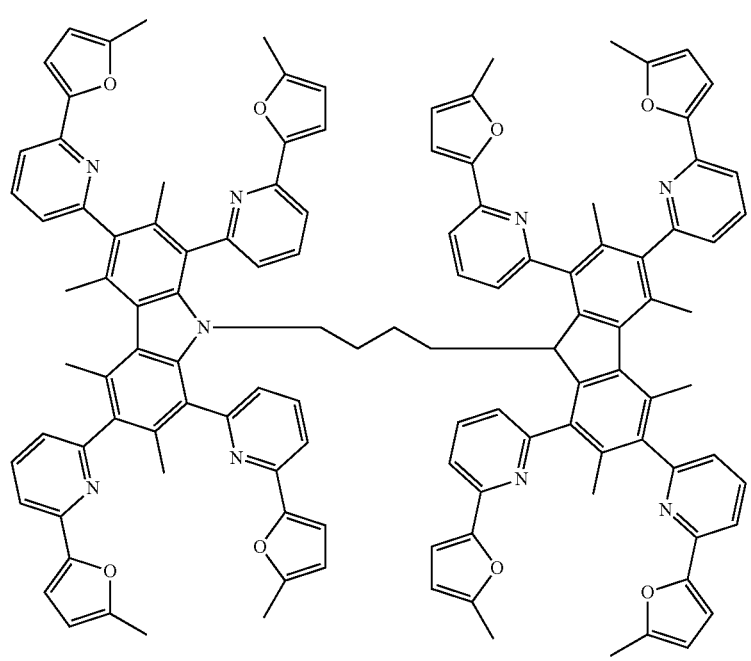

[Chemical Formula 20]
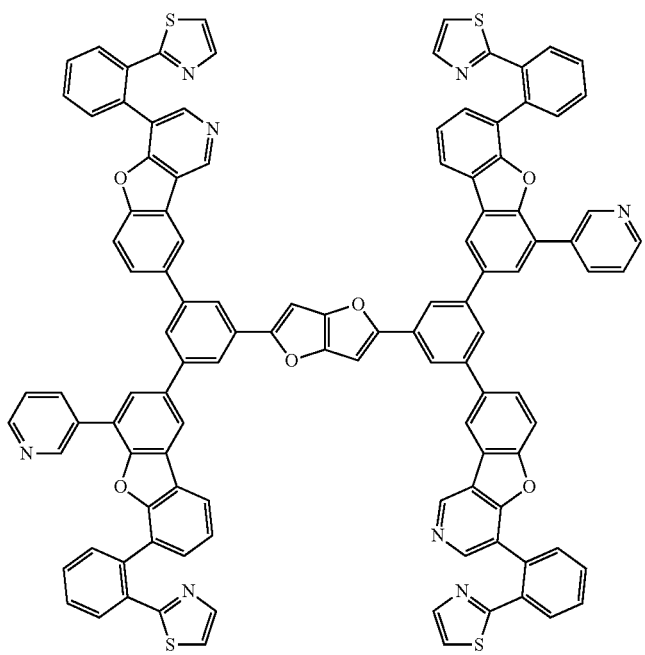
79
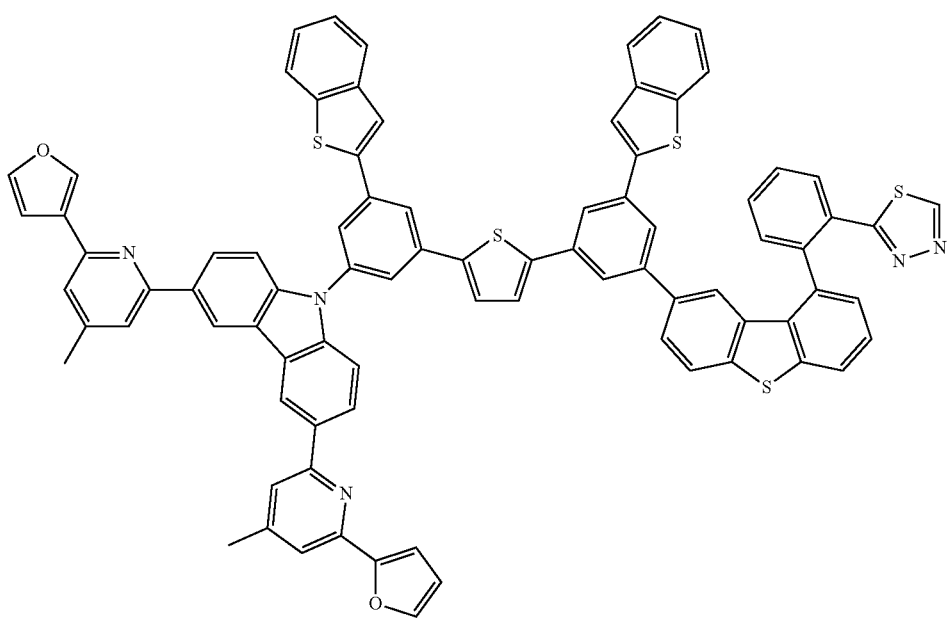
80

[Chemical Formula 21]
81
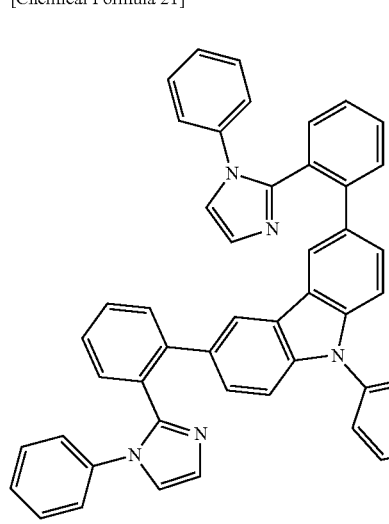
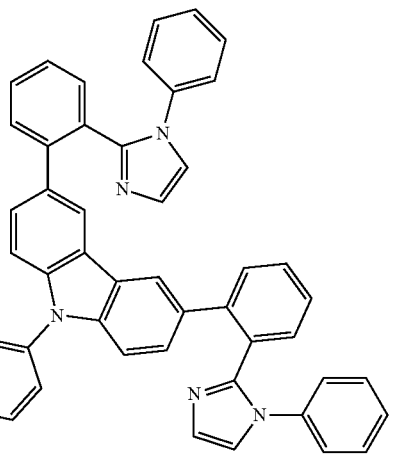
82
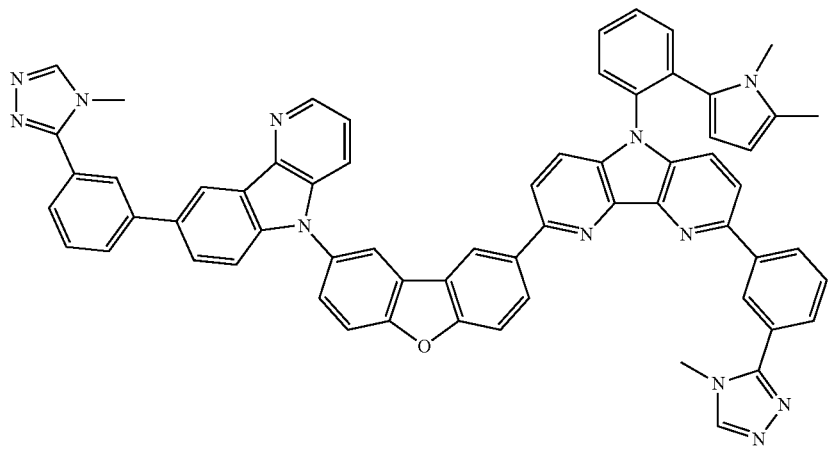
83
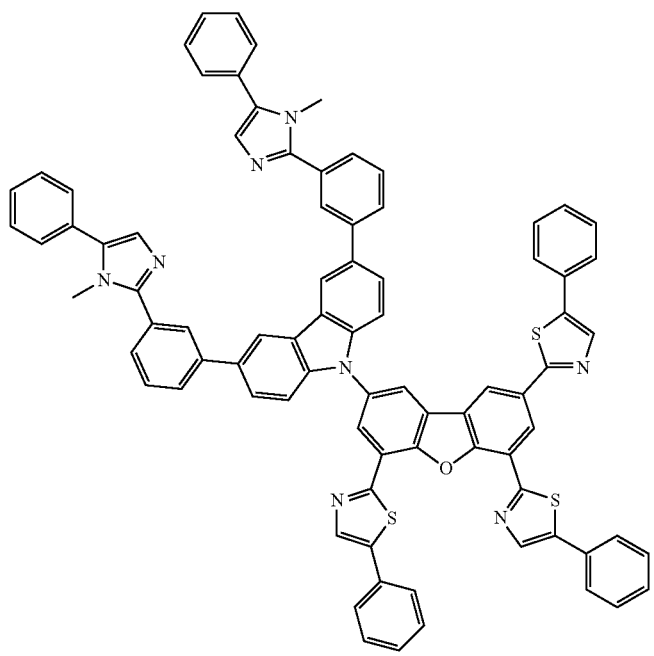

[Chemical Formula 22]
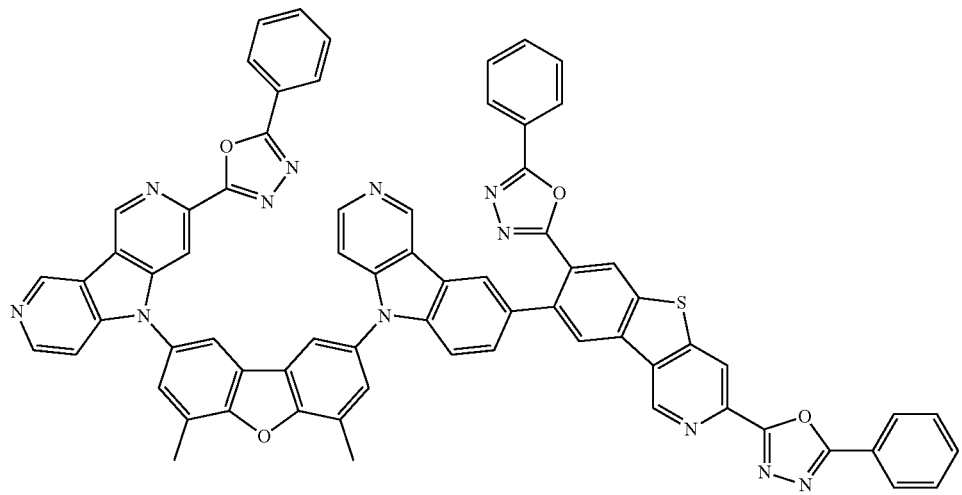
84
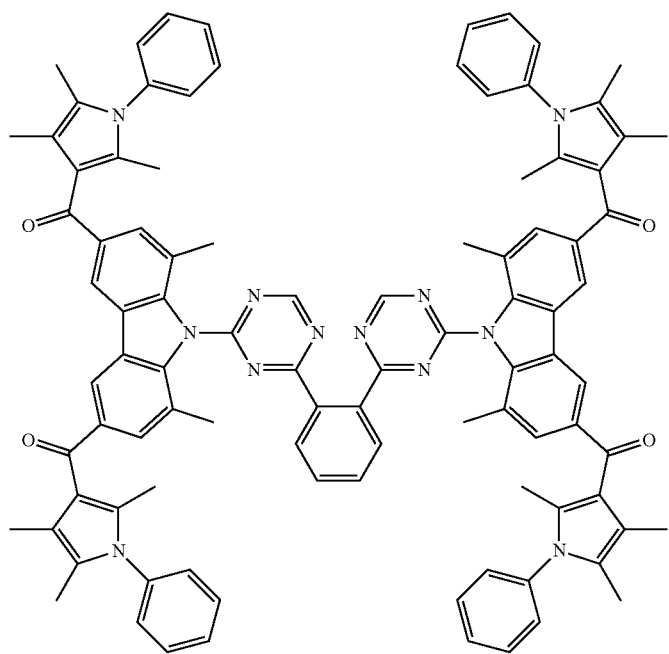
85

[Chemical Formula 23]
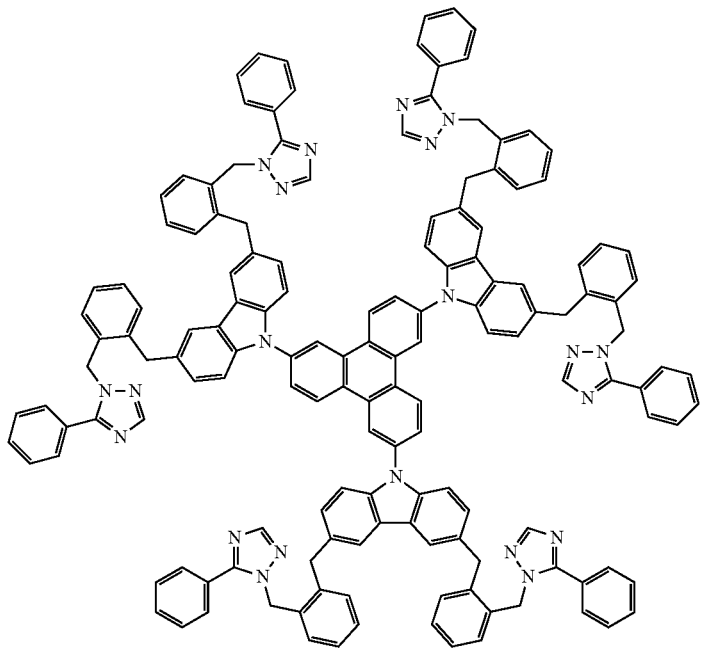
86
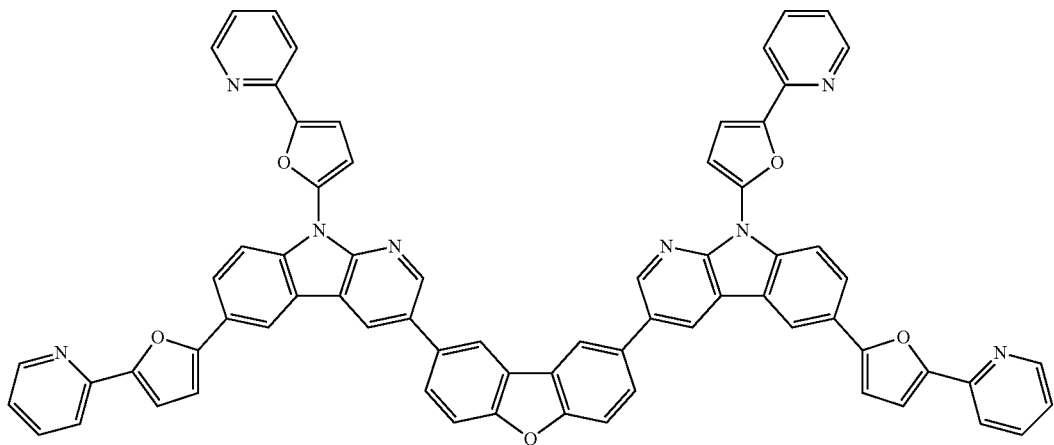
87
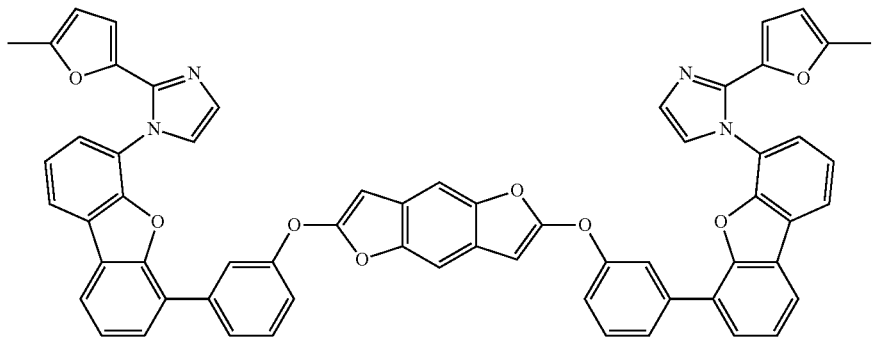
88

[Chemical Formula 24]
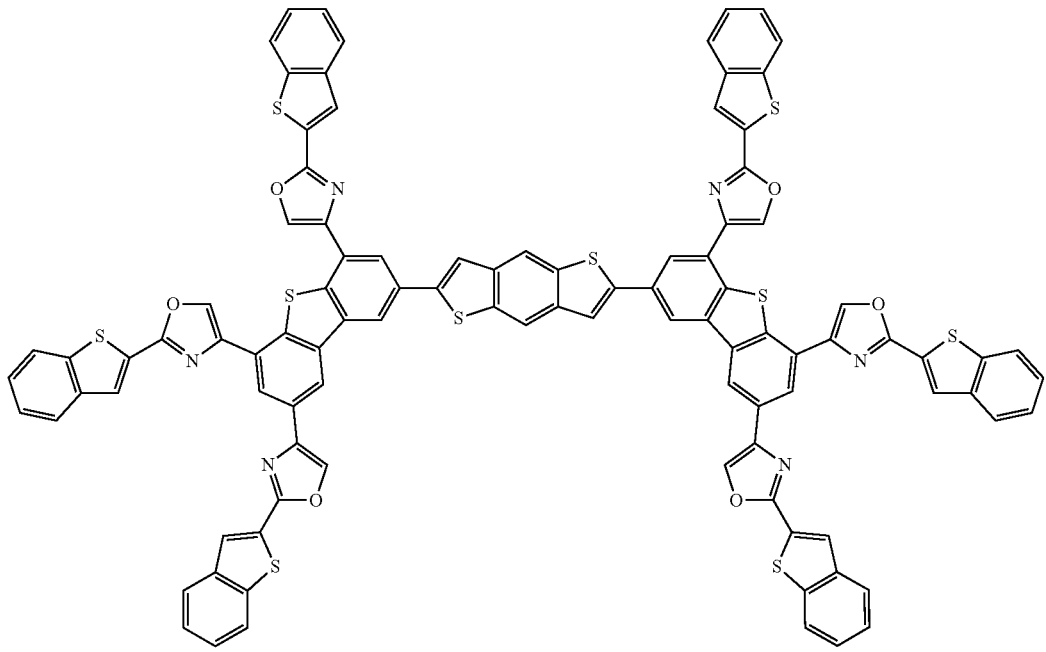
89
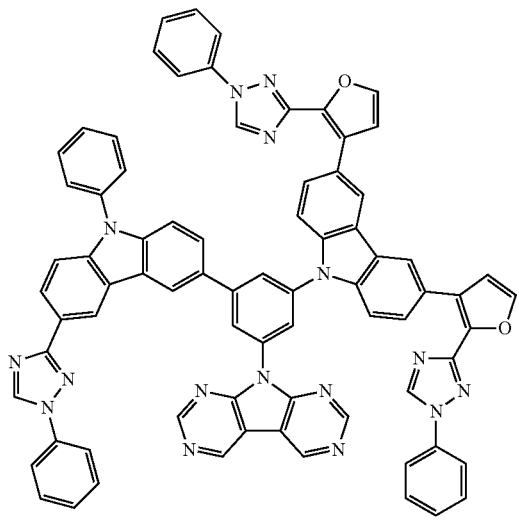
90
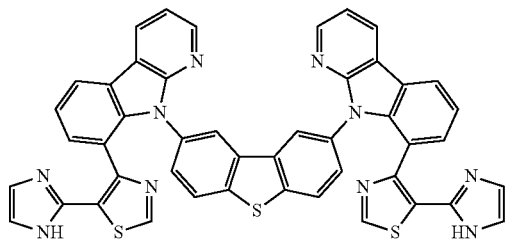
91

[Chemical Formula 25]
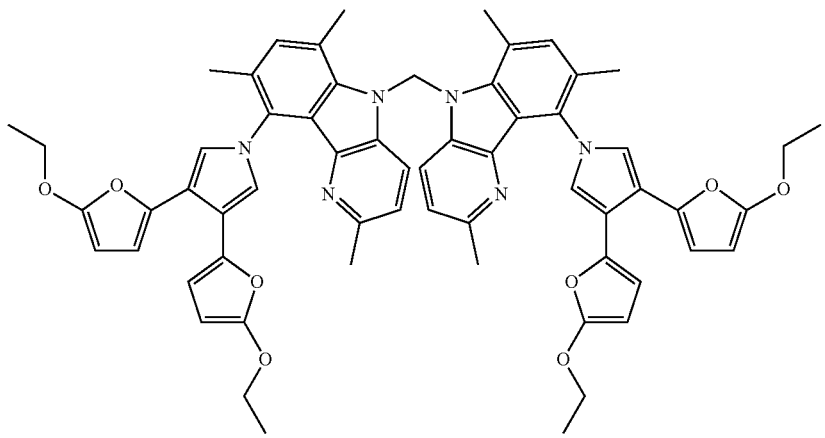
92
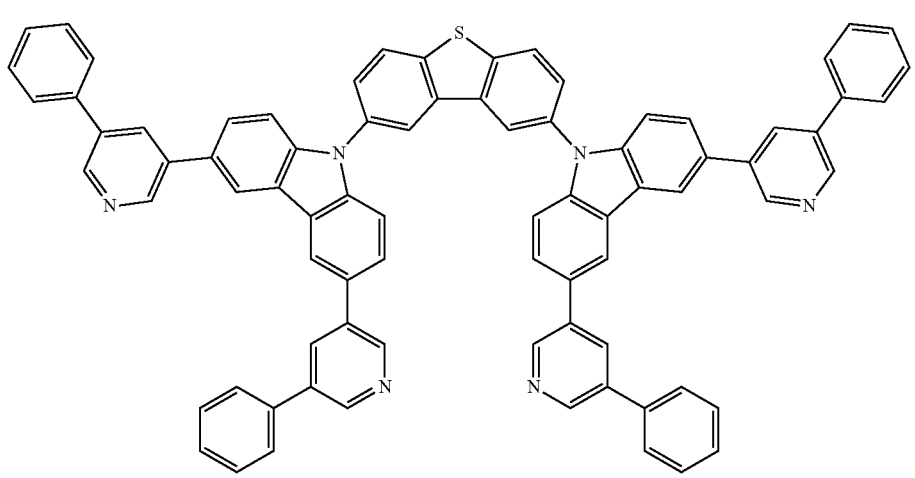
93
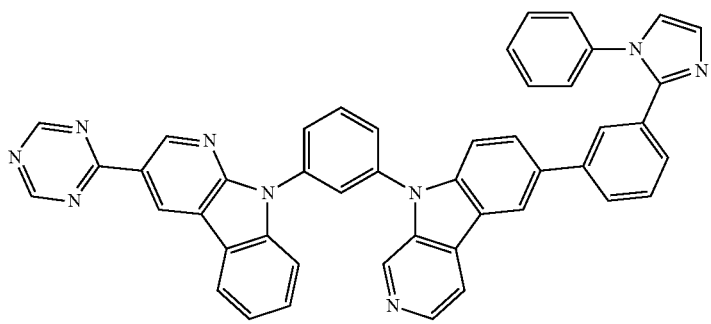
94
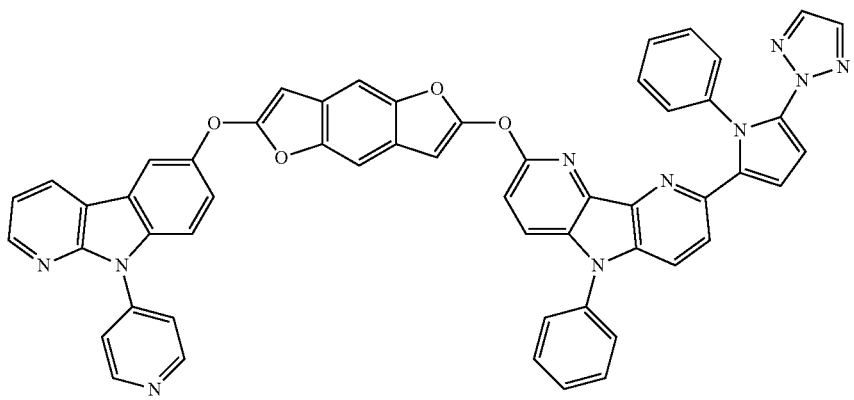
95

[Chemical Formula 26]
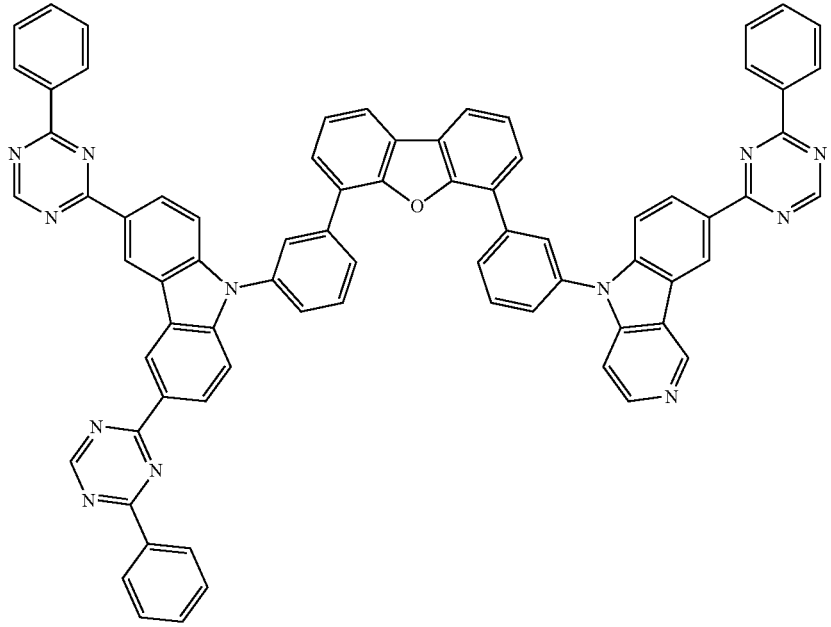
96
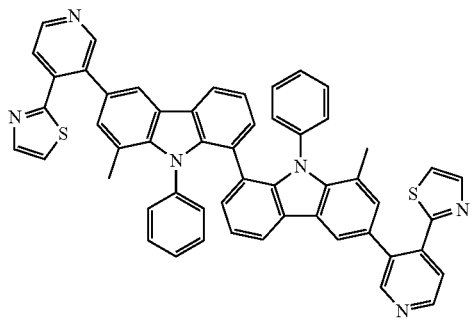
97
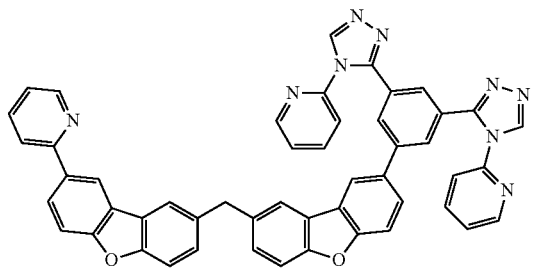
98
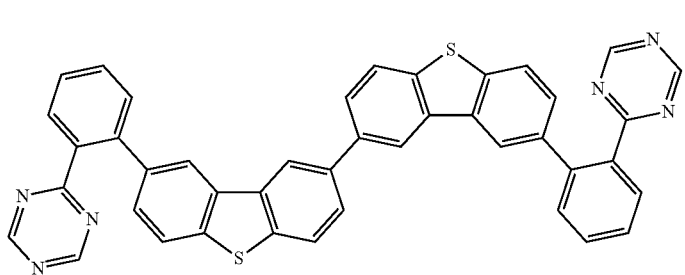
99

[Chemical Formula 27]
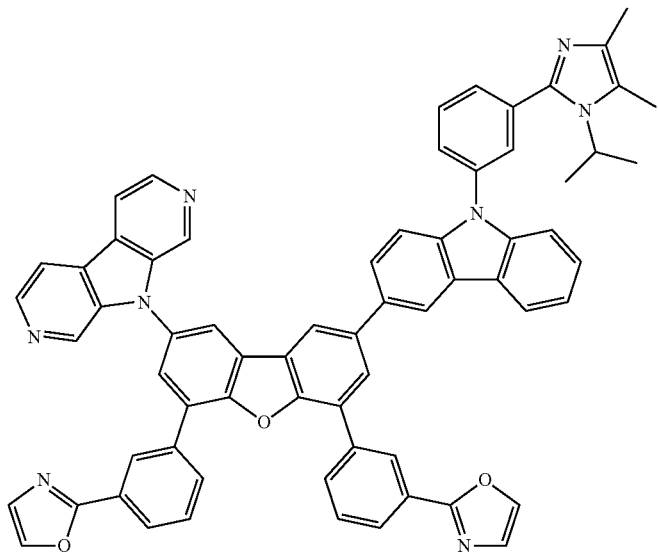
100
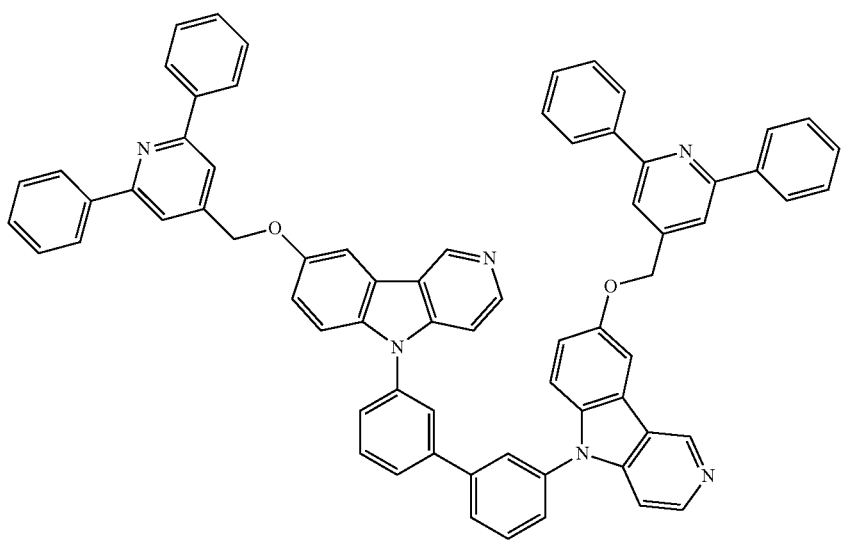
101

-continued
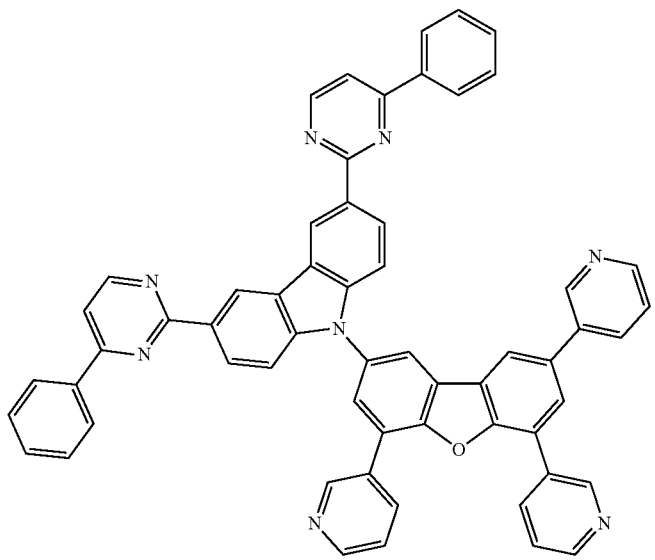
[Chemical Formula 28]
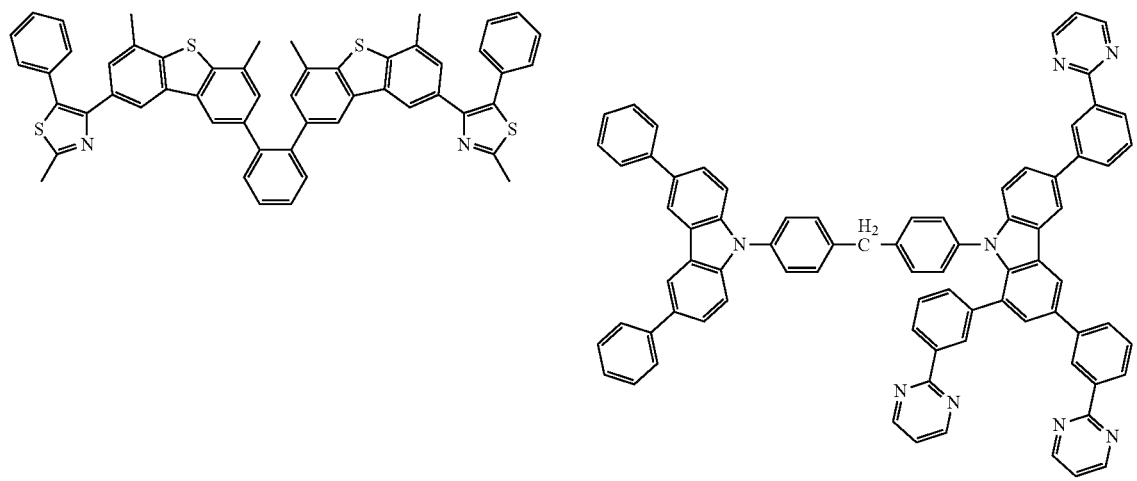
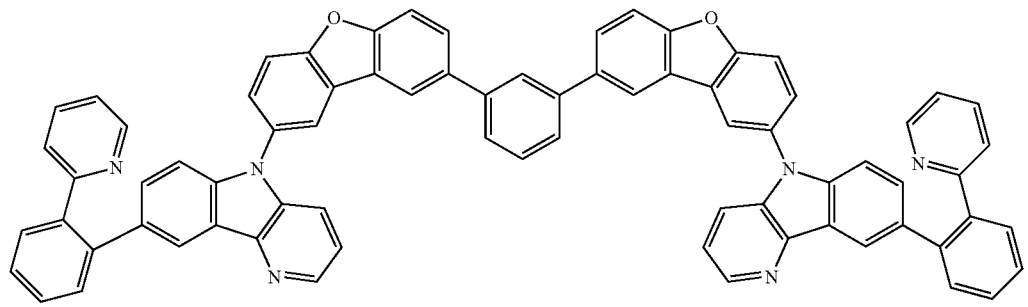

106
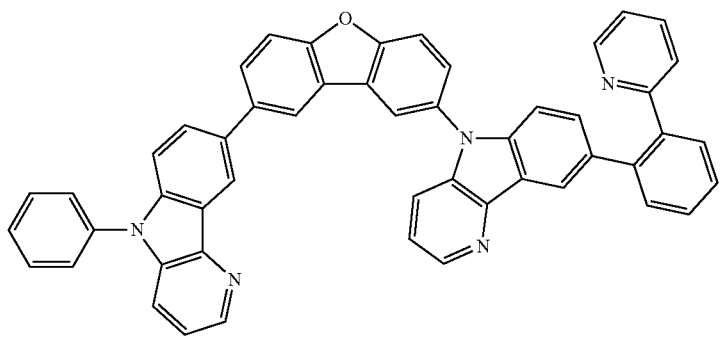
[Chemical Formula 29]
107
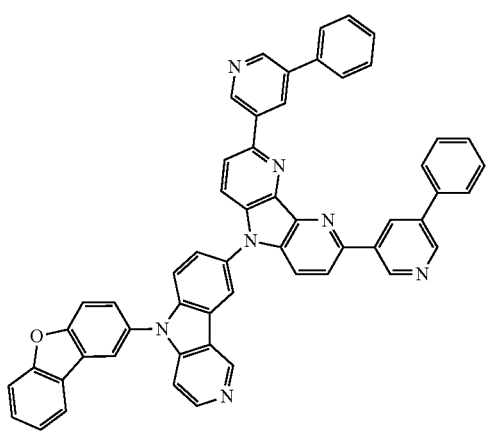
108
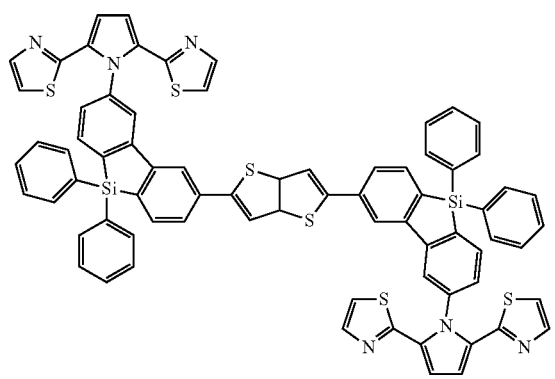
109
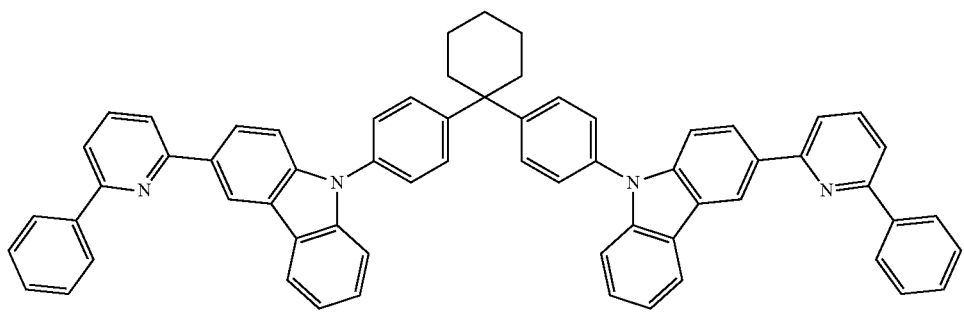
[Chemical Formula 30]
110
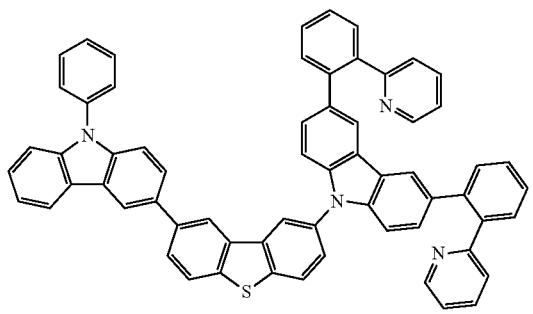
111
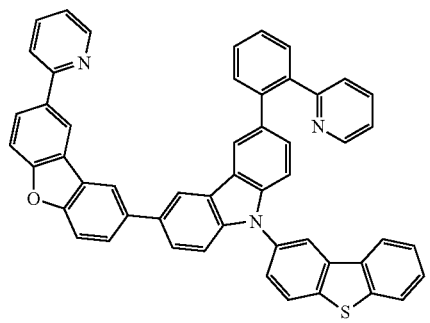

-continued
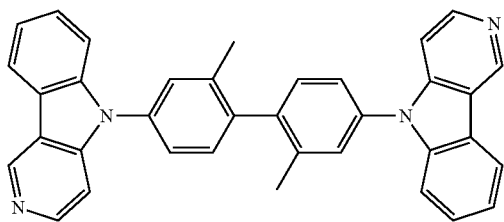
112
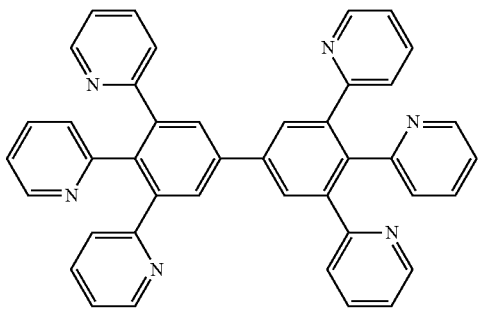
113
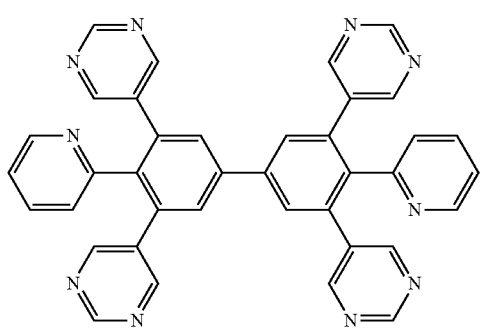
114
[Chemical Formula 31]
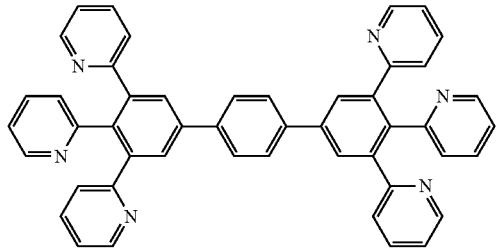
115
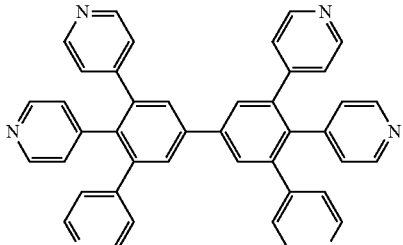
116
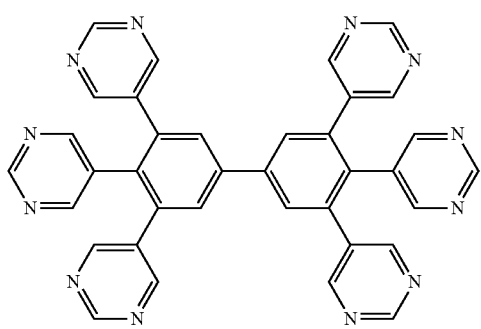
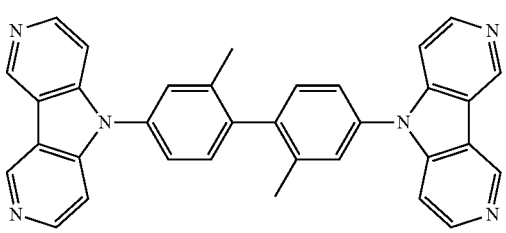
117
118

-continued
119
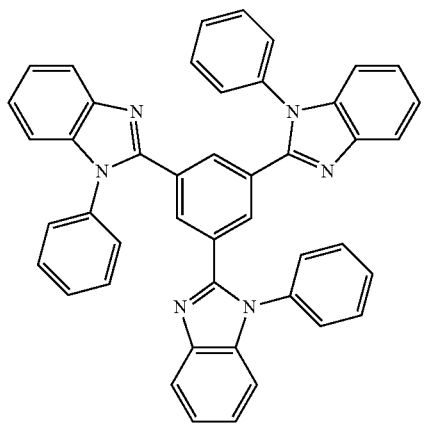
120
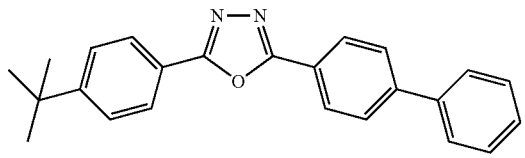
121
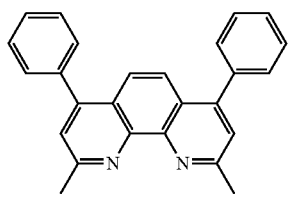
122
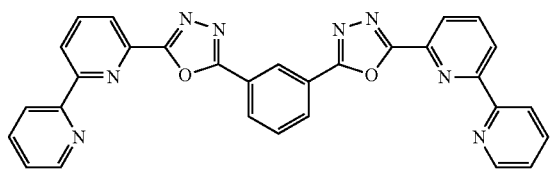
[Chemical Formula 32]
123
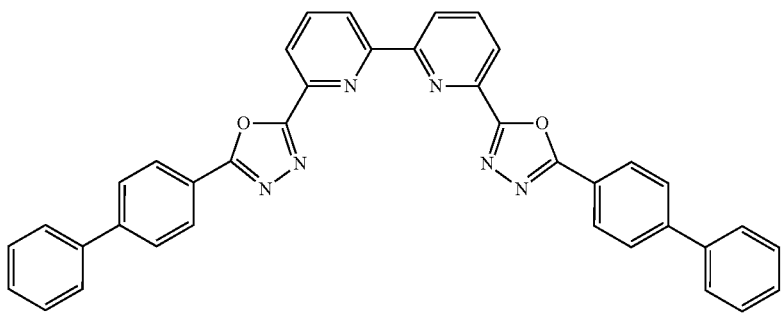
124
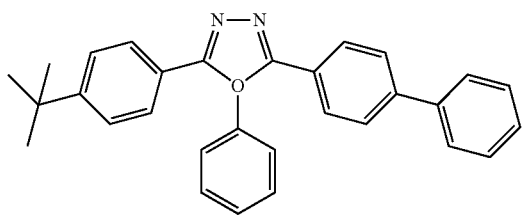
125
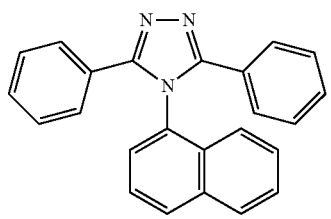
126
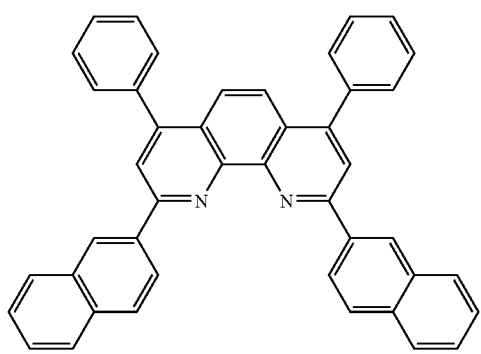

-continued
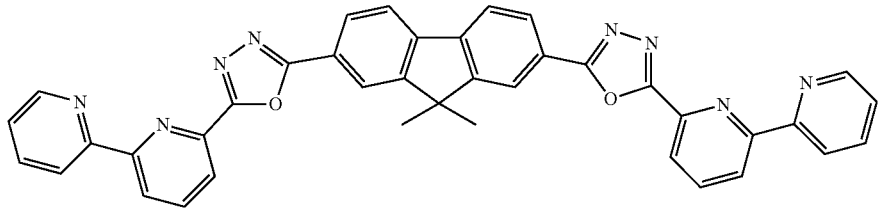
127
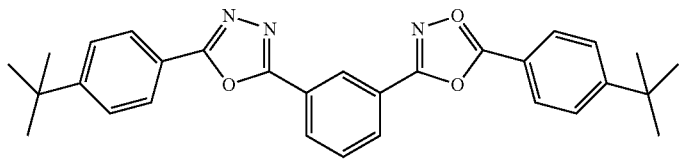
128
[Chemical Formula 33]
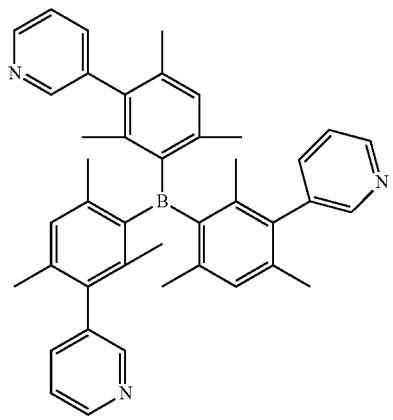
129
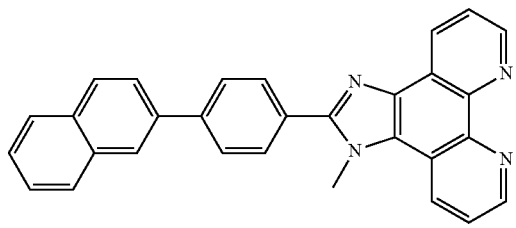
130
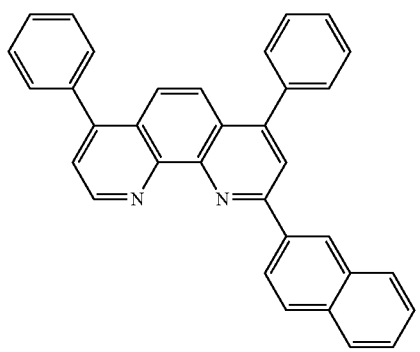
131
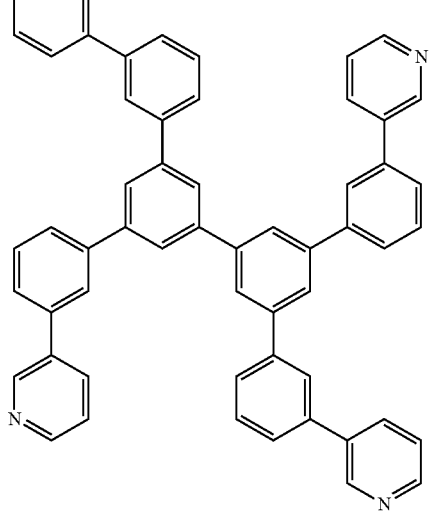
132

-continued
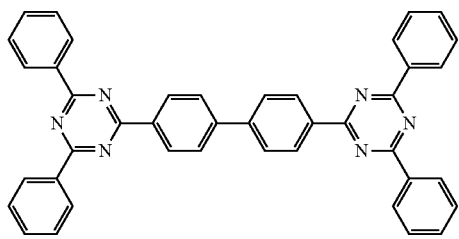
133
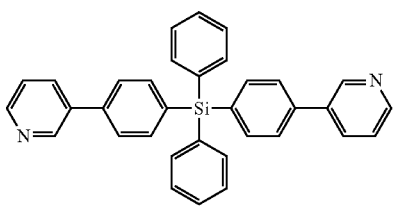
134
[Example of Synthesizing Compound]
As an example of synthesizing a typical compound, a concrete example of synthesizing the compound 5 is described below; however, the present invention is not limited thereto.
[Chemical Formula 34]
Synthesis of compound 5
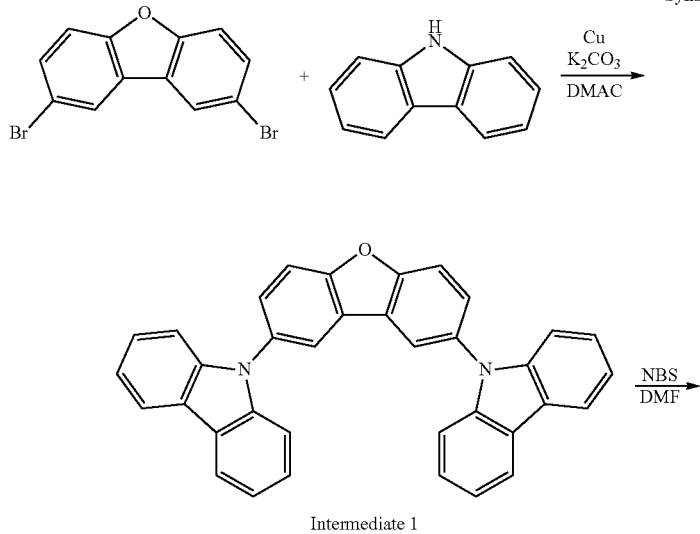
Intermediate 1
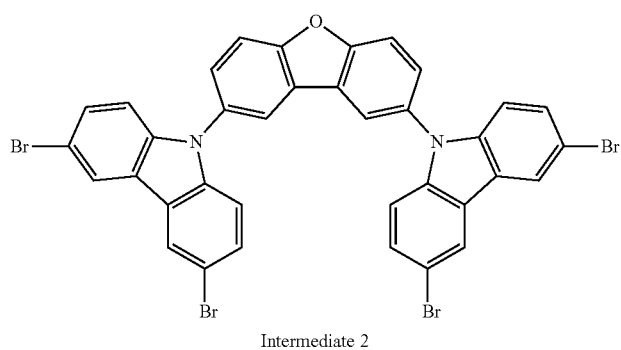
Intermediate 2
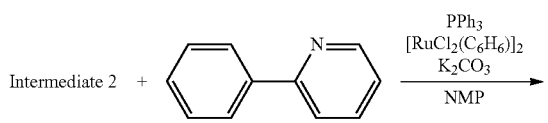

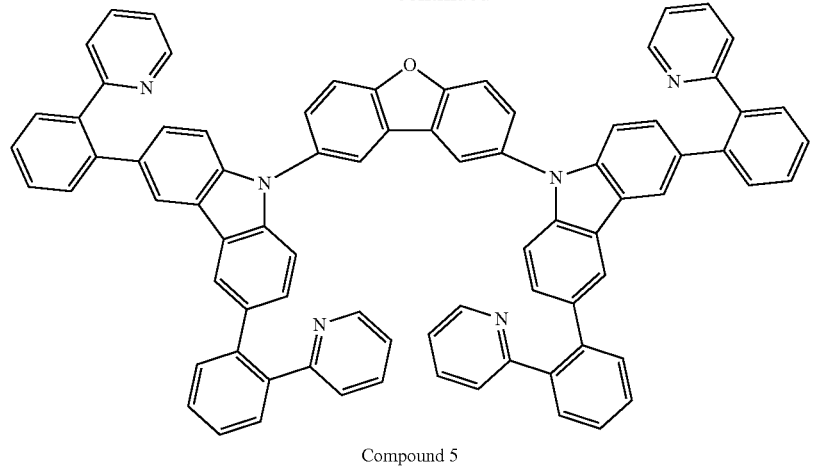

Compound 5

Process 1: (Synthesis of Intermediate 1)

Under nitrogen atmosphere, 2,8-dibromodibenzofuran (1.0 mol), carbazole (2.0 mol), copper powder (3.0 mol) and potassium carbonate (1.5 mol) were mixed in 300 ml of DMAc (dimethylacetamide) and then stirred for 24 hours at 130° C. After the reaction liquid obtained in the above-described manner was cooled to room temperature, 1 liter of toluene was added to the reaction liquid, the resultant substance was washed three times with distilled water, the solvent was distilled off from the washed substance under a reduced pressure, and the residue was purified with silica gel flash chromatography (n-heptane:toluene=4:1 to 3:1) to obtain an intermediate 1 at a yield of 85%.

Process 2: (Synthesis of Intermediate 2)

At room temperature under atmospheric pressure, the intermediate 1 (0.5 mol) was dissolved into 100 ml of DMF (dimethylformamide), and 2.0 mol of NBS (N-bromosuccinimide) was added, and then the resultant liquid was stirred for one night at room temperature. The obtained precipitate was filtered and washed with methanol to obtain an intermediate 2 at a yield of 92%.

Process 3: (Synthesis of Compound 5)

Under nitrogen atmosphere, the intermediate 2 (0.25 mol), 2-phenylpyridine (1.0 mol), ruthenium complex [($\eta_6$-$C_6H_6$)RuCl$_2$]$_2$ (0.05 mol), triphenylphosphine (0.2 mol), and potassium carbonate (12 mol) were mixed in 3 liters of NMP (N-methyl-2-pyrrolidone), and then the mixture was stirred for one night at 140° C.

After the reaction liquid was cooled to room temperature, 5 liters of dichloromethane was added to the reaction liquid, and then the reaction liquid was filtered. Next, the solvent was distilled off from the filtrate under a reduced-pressure atmosphere (800 Pa, 80° C.), and the residue was purified with silica gel flash chromatography (CH$_2$Cl$_2$:Et$_3$N=20:1 to 10:1).

After the solvent had been distilled off from the purified substance under the reduced-pressure atmosphere, the residue was dissolved again into dichloromethane and washed three times with water. The substance obtained by washing was dried with anhydrous magnesium sulfate, and the solvent was distilled off from the dried substance under the reduced-pressure atmosphere to thereby obtain the compound 5 at a yield of 68%.

<Base Material 11>

Examples of the base material 11, on which the aforesaid transparent electrode 1 is formed, include but not limited to glass, plastic and the like. Further, the base material 11 may be either transparent or non-transparent. However, in the case where the transparent electrode 1 of the present invention is applied to an electronic device in which the light is extracted from the side of the base material 11, the base material 11 is preferably transparent. Examples of the material favorably to be used as the transparent base material 11 include a glass, quartz, and a transparent resin film.

Examples of the glass include silica glass, soda-lime-silica glass, lead glass, borosilicate glass, alkali-free glass, and the like. From the viewpoint of durability, smoothness, and adhesiveness with the nitrogen-containing layer 1a, the surface of the aforesaid glass materials is subjected to a physical treatment such as polishing, and/or formed with an inorganic material coat, an organic material coat or a hybrid coat according to necessity, wherein the hybrid coat is obtained by combining the inorganic material coat and the organic material coat.

Examples of the material for the resin film include polyesters (such as polyethylene terephthalate (PET) and polyethylene naphthalate (PEN)), polyethylene, polypropylene, cellophane, cellulose esters and their derivatives (such as cellulose diacetate, cellulose triacetate, cellulose acetate butylate, cellulose acetate propionate (CAP), cellulose acetate phthalate (TAC), and cellulose nitrate), polyvinylidene chloride, polyvinylalcohol, polyethylenevinylalcohol, syndiotactic polystyrene, polycarbonate, norbornane resin, polymethylpentene, polyetherketone, polyimide, polyether sulfone (PES), polyphenylene sulfide, polysulfones, polyether imide, polyetherketone imide, polyamide, fluorine resin, nylon, polymethyl methacrylate, acryl or polyarylates, and cyclo-olefin resins (such as ARTON (trade name, manufactured by JSR Corp.) and APEL (trade name, manufactured by Mitsui Chemicals Inc.)).

The surface of the resin film may be formed with an inorganic material coat, an organic material coat or a hybrid coat, wherein the hybrid coat is obtained by combining the inorganic material coat and the organic material coat. It is preferred that the aforesaid coats and hybrid coat are each a barrier film having a water vapor permeability of 0.01 g/(m$^2$·24 h) or less (at a temperature of 25±0.5° C. and a relative humidity of (90±2)% RH) measured by a method in conformity with JIS K 7129-1992. It is further preferred that the aforesaid coats and hybrid coat are each a high barrier film having an oxygen permeability of 1×10$^{-3}$ ml/(m$^2$·24 h·atm) or less and a water vapor permeability of $1\times10^{-5}$ g/(m²·24 h) or less measured by a method in conformity with JIS K 7126-1987.

Any material capable of preventing penetration of substances that cause the element to degrade, such as moisture, oxygen and the like, may be used to form the aforesaid barrier film, and examples of such material include silicon oxide, silicon dioxide, silicon nitride and the like. Further, in order to reduce the fragility of the barrier film, it is more preferred that the barrier film has a laminated structure composed of the aforesaid inorganic layer and organic material layer (i.e., organic layer). There is no particular limitation on the order of laminating the inorganic layer and organic layer; however, it is preferred that the both layers are alternately laminated multiple times.

There is no particular limitation on the method of forming the barrier film. For example, the barrier film may be formed by a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method or the like; and it is particularly preferred that the barrier film is formed by an atmospheric pressure plasma polymerization method described in Japanese Unexamined Patent Application Publication No. 2004-68143.

On the other hand, in the case where the base material 11 is non-transparent, a metal plate (such as an aluminum plate, a stainless steel plate or the like), a film, a non-transparent resin substrate, a ceramic substrate or the like may be used as the base material 11.

Alternatively, the aforesaid transparent electrode 1 having the electrode layer 1b may have a protective film coated on the top of the electrode layer 1b or have another conductive layer laminated on the top of the electrode layer 1b. In such a case, it is preferred that that the protective film and the conductive layer have light transmissibility so that the light transmissibility of the electrode layer 1b is not impaired. Further, layer(s) may be provided at the bottom of the nitrogen-containing layer 1a (i.e., between the nitrogen-containing layer 1a and the base material 11) according to necessity. Further, although the aforesaid embodiment is described based on an example in which the transparent electrode 1 has a laminated structure composed of the nitrogen-containing layer 1a and the electrode layer 1b, the transparent electrode 1 may also have a single-layer structure composed of only the electrode layer 1b.

<Effect of Transparent Electrode 1>

In the aforesaid transparent electrode 1, by setting the film-thickness of the electrode layer 1b to 12 nm or less at which the sheet resistance of the electrode layer 1b is measurable, the practicability of the electrode layer 1b as an electrode film is ensured while light absorption component or light reflection component of the electrode layer 1b is reduced. Particularly, since the sum of the circumferential length(s) of aperture(s) "a" obtained by performing image processing on the image of the surface region with an area of 500 nm×500 nm of the electrode layer 1b obtained by a scanning electron microscope is 3000 nm or less, the electrode layer 1b is a conductive film with a reliably measurable sheet resistance despite the extremely small thickness of 12 nm or less, as mentioned above. Further, if the sum the circumferential length(s) of aperture(s) "a" is 1000 nm or less, the sheet resistance can be further reduced.

As a result, with the transparent electrode 1 having such an electrode layer 1b, since the electrode layer 1b (which substantially functions as an electrode) has electrical conductivity as well as having light transmissibility due to small film-thickness, it becomes possible to improve both the electrical conductivity and the light transmissibility.

Further, since indium (In), which is a kind of rare metal, is not used, the cost of the transparent electrode 1 is low; and since chemically unstable material, such as ZnO or the like, is not used, the transparent electrode 1 is excellent in long-term reliability.

Further, the electrode layer 1b is formed of silver or an alloy containing silver as a main component; and in the case where the electrode layer 1b is formed adjacent to the nitrogen-containing layer 1a formed by using a compound having nitrogen atom, when forming the electrode layer 1b on the top of the nitrogen-containing layer 1a, the silver constituting the electrode layer 1b will interact with the nitrogen-atom-containing compound constituting the nitrogen-containing layer, so that diffusion distance of silver atom on the surface of the nitrogen-containing layer is reduced, and therefore a continuous film of silver is formed. Therefore, the silver thin-film will be formed in a manner in which the silver thin-film grows in a single-layer growth mode (Frank-van der Merwe: FW mode); while in contrast, the silver thin-film is generally formed in a manner in which the silver thin-film grows in a nuclear growth mode (Volumer-Weber: VW mode) and thereby the silver thin-film tends to be isolated into an island shape. Thus, it is possible to obtain an electrode layer having small yet uniform film-thickness.

Particularly, the effective action energy ΔEef shown in the aforesaid Formula (1) is defined as the interaction energy between the compound constituting the nitrogen-containing layer 1a and silver constituting the electrode layer 1b, and a compound which satisfies a condition of "−0.4≤ΔEef≤−0.10" is used to constitute the nitrogen-containing layer 1a. Thus, it becomes possible to form the nitrogen-containing layer 1a by using a compound with which the effect of "inhibiting aggregation of silver" can be reliably achieved. This is also confirmed by a fact, which is to be described in detail in the below-mentioned examples, that an electrode layer 1b having an extremely small film-thickness yet having a measurable sheet resistance is formed on such a nitrogen-containing layer 1a.

<<2. Applications of Transparent Electrode>>

The transparent electrode 1 having the aforesaid configuration can be used in various kinds of electronic devices. Examples of the electronic devices include organic electroluminescence elements, LED (Light Emitting Diode), liquid crystal elements, solar cells, touch panels and the like; and the transparent electrode 1 can be used as an electrode member of each of these electronic devices wherein the electrode member needs to have light transmissibility.

As an example of the application, an embodiment of the organic electroluminescence element using the transparent electrode an anode and a cathode will be described below.

<<3. First Example of Organic Electroluminescence Element (Top Emission Type)>>

<Configuration of Organic Electroluminescence Element EL-1>

Figure 3:
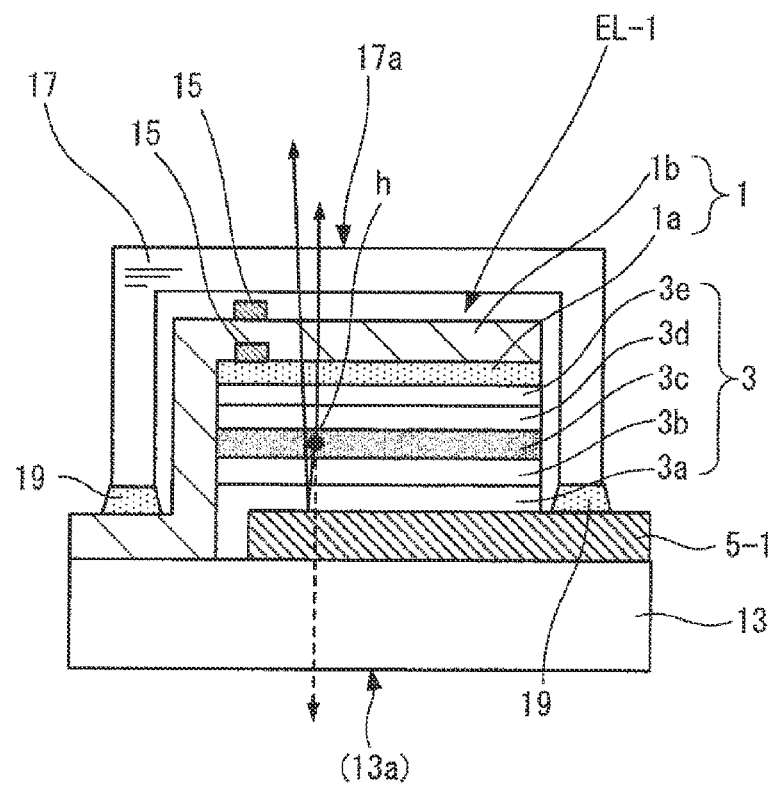
FIG. 3 is a cross-sectional view showing a configuration of a first example of an organic electroluminescence element that uses the transparent electrode according to the present invention.

As an example of the electronic device of the present invention, FIG. 3 shows a cross-sectional configuration of a first example of the organic electroluminescence element using the aforesaid transparent electrode. The configuration of the organic electroluminescence element will be described below with reference to FIG. 3.

An organic electroluminescence element EL-1 shown in FIG. 3 is arranged on a substrate 13, and is formed by laminating an opposite electrode 5-1, a light-emitting functional layer 3 and a transparent electrode 1, in this order, from the side of the substrate 13, wherein the light-emitting functional layer 3 is formed by using an organic material and the like. It is characterized that the aforesaid transparent electrode 1 according to the present invention is used as the transparent electrode 1 of the organic electroluminescence element EL-1. Thus, the organic electroluminescence element EL-1 is configured as a top emission type organic electroluminescence element in which the light emitted thereby (referred to as "emitted light h" hereinafter) is extracted at least from a side opposite to the side of the substrate 13.

Further, the entire layer-structure of the organic electroluminescence element EL-1 is not particularly limited, but may be a generic layer-structure. Here, the transparent electrode 1 is arranged on the side of the cathode, wherein mainly the electrode layer 1*b* functions as the cathode; and the opposite electrode 5-1 functions as the anode.

In such a case, for example, the light-emitting functional layer 3 is formed by laminating [a hole injecting layer 3*a*/a hole transporting layer 3*b*/a light emitting layer 3*c*/an electron transporting layer 3*d*/an electron injecting layer 3*e*], in this order, from the side of the opposite electrode 5-1 (which is the anode); among these layers, the light emitting layer 3*c* formed by using at least an organic material is indispensable. The hole injecting layer 3*a* and the hole transporting layer 3*b* may also be formed as a hole transporting/injecting layer. The electron transporting layer 3*d* and the electron injecting layer 3*e* may also be formed as an electron transporting/injecting layer. Further, among the aforesaid layers of the light-emitting functional layer 3, the electron injecting layer 3*e*, for example, may also be formed of an inorganic material.

Further, in the transparent electrode 1 (as the cathode), the nitrogen-containing layer 1*a* may also serve as an electron injecting layer, or may also serve as an electron transporting/injecting layer.

In addition to the aforesaid layers, the light-emitting functional layer 3 may have other layer(s), such as a hole blocking layer, an electron blocking layer and/or the like, laminated on required place(s) according to necessity. Further, the light emitting layer 3*c* may also be formed as a light emitting layer unit which includes a plurality of emitting layers each emit light of different wavelength range, wherein the plurality of emitting layers are laminated one on another with a non-luminescent intermediate layer interposed between each two layers. The intermediate layer may function as a hole blocking layer or an electron blocking layer. Further, the opposite electrode 5-1 (i.e., the anode) may also have a laminated structure according to necessity. In such a configuration, only a part where the light-emitting functional layer 3 is sandwiched by the transparent electrode 1 and the opposite electrode 5-1 is a light-emitting region of the organic electroluminescence element EL-1.

In the aforesaid layer-structure, in order to reduce the resistance of the transparent electrode 1, an auxiliary electrode 15 may be provided in contact with the electrode layer 1*b* of the transparent electrode 1.

In order to prevent the deterioration of the light-emitting functional layer 3, which is formed by using an organic material and the like, the organic electroluminescence element EL-1 having the aforesaid configuration is sealed by a transparent sealing material 17 (which is to be described later) on the substrate. The transparent sealing material 17 is fixed to the side of the substrate through an adhesive 19. However, the end portions of both the transparent electrode 1 and the opposite electrode 5-1 are exposed from the transparent sealing material 17 in a state where the transparent electrode 1 and the opposite electrode 5-1 are insulated from each other by the light-emitting functional layer 3 on the substrate.

The details of the main layers for constituting the aforesaid organic electroluminescence element EL-1 will be described below in the following order: the substrate 13, the transparent electrode 1, the opposite electrode 5-1, the light emitting layer 3*c* of the light-emitting functional layer 3, the other layers of the light-emitting functional layer 3, the auxiliary electrode 15, and the transparent sealing material 17. Thereafter, a method for producing the organic electroluminescence element EL-1 will be described.

[Substrate 13]

The same material as the base material on which the transparent electrode 1 of the present invention described before is used as the material of the substrate 13 of the present example. Incidentally, in the case where the organic electroluminescence element EL-1 is a dual emission type organic electroluminescence element in which the emitted light h is also extracted from the side of the opposite electrode 5-1, the substrate is formed by a transparent material selected from the examples of the base material 11.

[Transparent Electrode 1 (on Cathode Side)]

The transparent electrode 1 is the transparent electrode 1 described before; and is configured by forming a nitrogen-containing layer 1*a* and an electrode layer 1*b*, in this order, from the side of the light-emitting functional layer 3. Particularly, herein the electrode layer 1*b*, which has the configuration of the present invention, of the transparent electrode 1 is a substantive cathode. In the organic electroluminescence element EL-1 of the present embodiment, the nitrogen-containing layer 1*a* formed by an organic material is disposed between the light-emitting functional layer 3 and the electrode layer 1*b*, which is used as the substantive cathode. Thus, the nitrogen-containing layer 1*a* of the transparent electrode 1 of the present embodiment may also be regarded as a layer which constitutes a portion of the light-emitting functional layer 3. It is preferred that such a nitrogen-containing layer 1*a* is formed by using a material having electron transport performance or electron injection performance selected from the materials which satisfy the aforesaid Formula (1) or Formula (2). Further, such a nitrogen-containing layer 1*a* may also be formed by using a material satisfying Formula (1) or Formula (2) and selected from the below-mentioned materials exemplified as electron transporting materials. In such a case, since the nitrogen-containing layer 1*a* is regarded as a portion of the light-emitting functional layer 3, it can be considered that the transparent electrode 1 has a single-layer structure formed by the electrode layer 1*b* only. Incidentally, the nitrogen-containing layer 1*a* may either be arranged between the light-emitting functional layer 3 and the electrode layer 1*b*, or be arranged adjacent to the whole surface of the electrode layer 1*b*.

[Opposite Electrode 5-1 (Anode)]

The opposite electrode 5-1 is an electrode film functioning as an anode that supplies holes to the light-emitting functional layer 3; and is formed by using a metal, an alloy, an organic or inorganic conductive compound, or a mixture of these materials. To be specific, the opposite electrode 5-1 is formed by using gold, aluminum, silver, magnesium, lithium, a magnesium/copper mixture, a magnesium/silver mixture, a magnesium/aluminum mixture, a magnesium/indium mixture, indium, a lithium/aluminum mixture, a rare earth metal, an oxide semiconductor (such as ITO, ZnO, TiO2, SnO2 and the like) or the like.

The opposite electrode 5-1 can be formed by forming a thin-film using one of the aforesaid conductive materials by a method such as deposition, sputtering or the like. The sheet resistance of the opposite electrode 5-1 is preferably several hundred Ω/sq. or less; and the film-thickness of the opposite electrode 5-1 is generally within a range from 5 nm to 5 μm, preferably within a range from 5 nm to 200 nm.

Incidentally, in the case where the organic electroluminescence element EL-1 is a dual emission type organic electroluminescence element in which the emitted light h is also extracted from the side of the opposite electrode 5-1, the opposite electrode 5-1 may be formed by using a material with good light transmissibility selected from the aforesaid conductive materials.

[Light Emitting Layer 3c]

The light emitting layer 3c used in the present invention contains a phosphorescent compound, for example, as a light emitting material.

The light emitting layer 3c is a layer where electrons injected from the electrode or the electron transporting layer 3d and holes injected from the hole transporting layer 3b are recombined to emit light; and light emitting portion may be either the inside of the light emitting layer 3c or an interface between the light emitting layer 3c and its adjacent layer.

The structure of the light emitting layer 3c is not particularly limited as long as the light emitting material contained therein satisfies light emitting requirements. Further, the light emitting layer 3c may also include a plurality layers having the same emission spectrum and/or emission maximum wavelength. In such a case, it is preferable that a non-luminescent intermediate layer (not shown) is provided between each two adjacent light emitting layers 3c.

The total film-thickness of the light emitting layers 3c is preferably within a range from 1 nm to 100 nm and, and more preferably within a range from 1 nm to 30 nm, this is because a lower driving voltage can be obtained in such range. Incidentally, the total film-thickness of the light emitting layers 3c is, if the non-luminescent intermediate layer is provided between each two adjacent light emitting layers 3c, the total film-thickness including the film-thickness of the intermediate layer(s).

In the case where the light emitting layer 3c has a configuration in which a plurality of layers are laminated one on another, the film-thickness of each emitting layer is preferably to be adjusted to a range from 1 nm to 50 nm, and further preferably to be adjusted to a range from 1 nm to 20 nm. In the case where the plurality of laminated light emitting layers respectively correspond to emission color of blue, emission color of green and emission color of red, the relationship between the film-thickness of the light emitting layer of blue, the film-thickness of the light emitting layer of green and the film-thickness of the light emitting layer of red is not particularly limited.

The aforesaid light emitting layer 3c can be formed by forming a thin film of a light emitting material or a host compound (which are to be described later) using a known thin film forming method such as a vacuum deposition method, a spin coating method, a casting method, an LB method, an ink-jet method or the like.

The light emitting layer 3c may be formed of a plurality of materials in mixture; or a phosphorescent material and a fluorescent material (also referred to as a "fluorescent dopant" or a "fluorescent compound") may be used in mixture in the same light emitting layer 3c.

It is preferred that the light emitting layer 3c contains a host compound (also referred to as light-emitting host or the like) and a light emitting material (also referred to as light-emitting dopant compound), and light is emitted by the light emitting material.

(Host Compound)

It is preferred that the host compound contained in the light emitting layer 3c is a compound whose phosphorescence quantum yield preferably is, when emitting phosphorescence at the room temperature (25° C.), less than 0.1, and further preferably is less than 0.01. Further, it is preferred that the volume ratio of the host compound of the compounds contained in the light emitting layer 3c is 50% or more.

One type of known host compound may be used as the host compound, or a plurality of types of known host compounds may be used as the host compound. By using a plurality of types of known host compounds, it is possible to adjust the transfer of electrical charges, and it is possible to improve the efficiency of the organic electroluminescence element EL-1. Further, by using a plurality of types of below-mentioned light emitting materials, it is possible to mix different colors of emission light, and thereby it is possible to obtain any emission color.

A known low-molecular compound, a high-molecular compound having a repeating unit, or a low-molecular compound having a polymerizable group such as a vinyl group or an epoxy group (a deposition polymerizable emission host) may be used as the host compound.

It is preferred that the known host compound is a compound which has hole transporting capability and electron transporting capability, which prevents increase in emission wavelength, and which has high Tg (glass transition temperature). The glass transition temperature (Tg) herein is a value obtained by using DSC (Differential Scanning Colorimetry) in conformity with JIS-K-7121.

Concrete examples (H1 to H79) of the host compound possible to be used in the present invention are shown below; however, the present invention is not limited thereto. Incidentally, in host compounds H68 to H79, x and y represent ratio of a random copolymer. Such ratio can be set to x:y=1:10, for example.

[Chemical Formula 35]

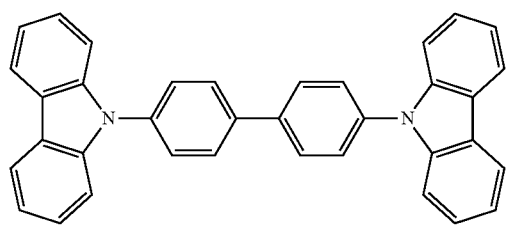

H1

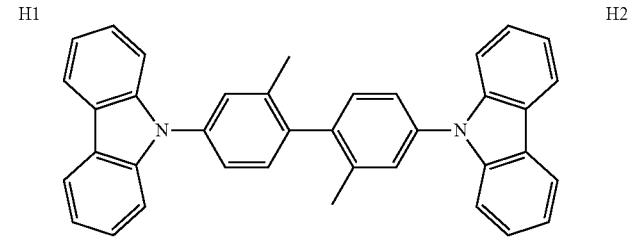

H2

-continued
H3 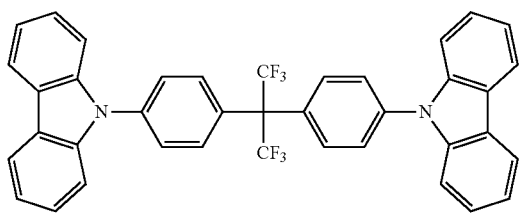
H4 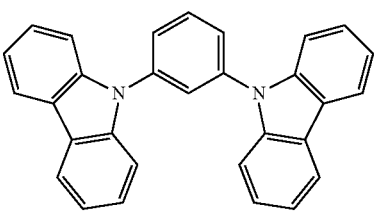
H5 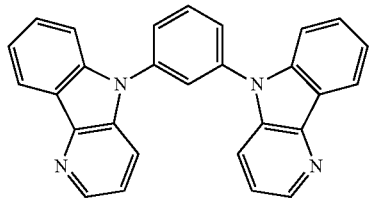
H6 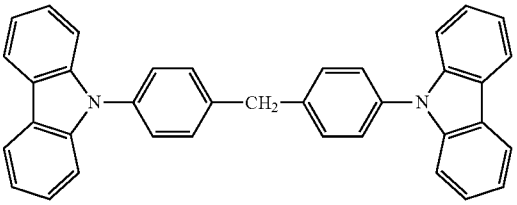
H7 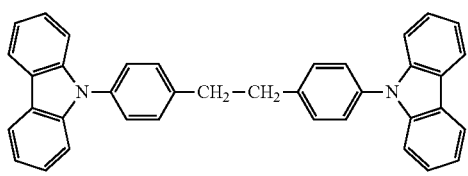
H8 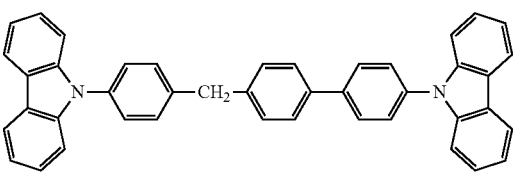
H9 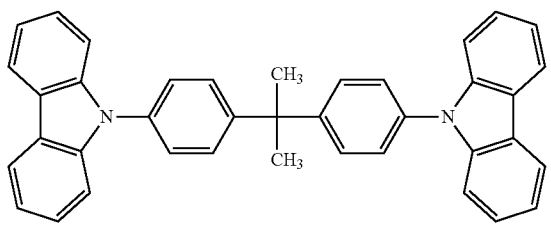
[Chemical Formula 36]
H10 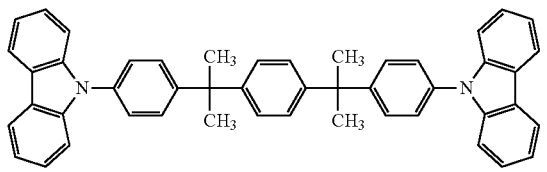
H11 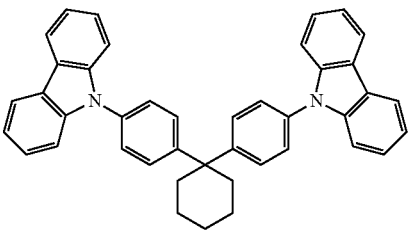
H12 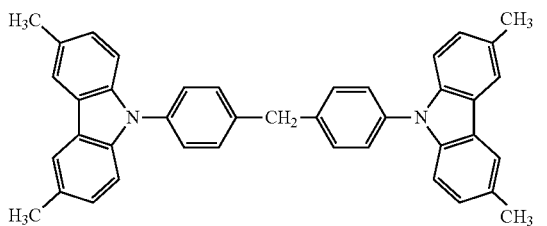
H13 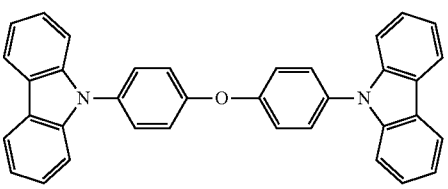

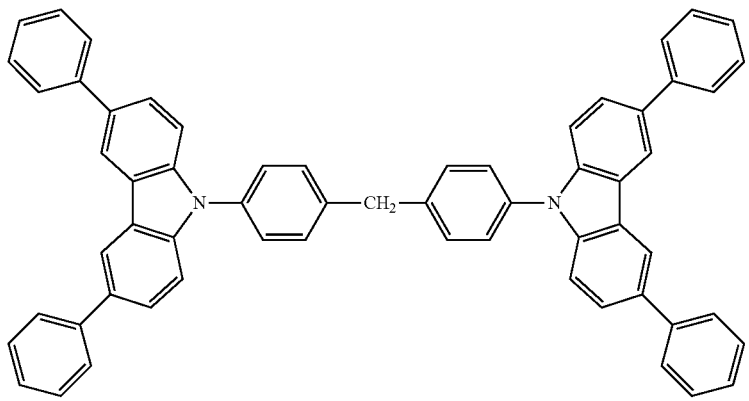
H14
[Chemical Formula 37]
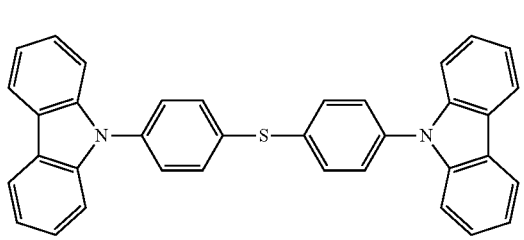
H15
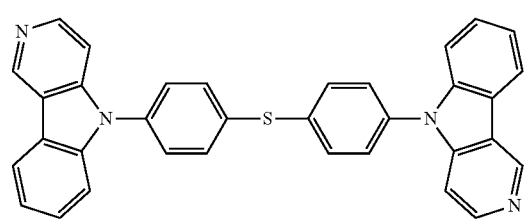
H16
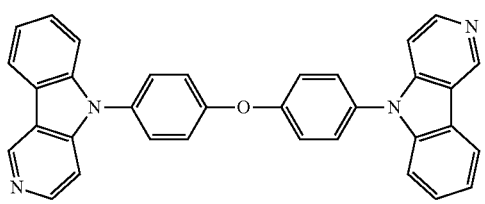
H17
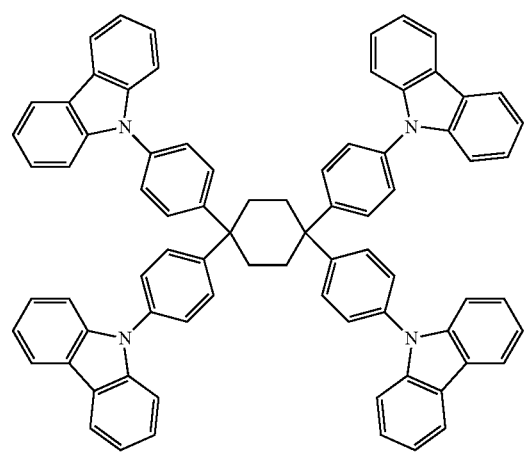
H18
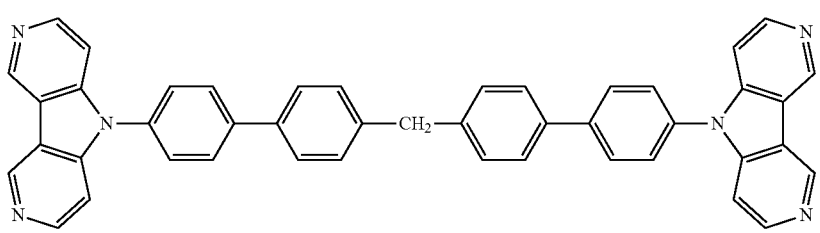
H19
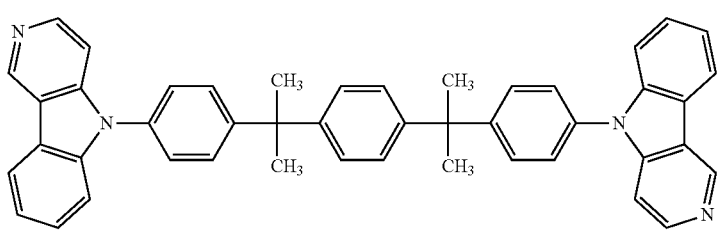
H20

-continued
H21 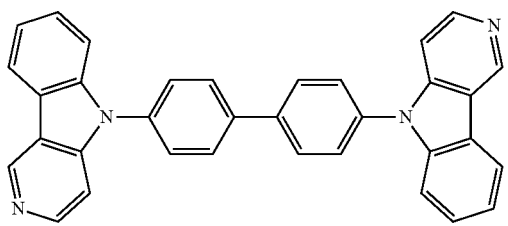 H22 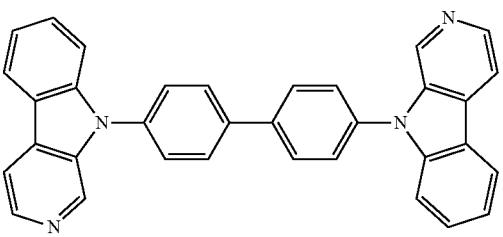
[Chemical Formula 38]
H23 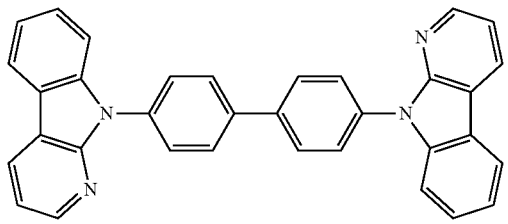 H24 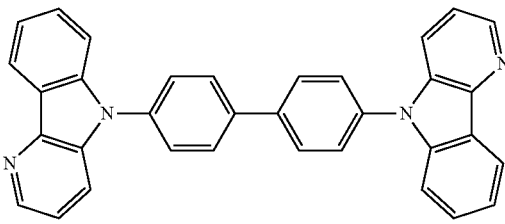
H25 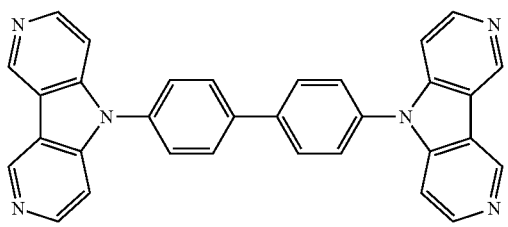 H26 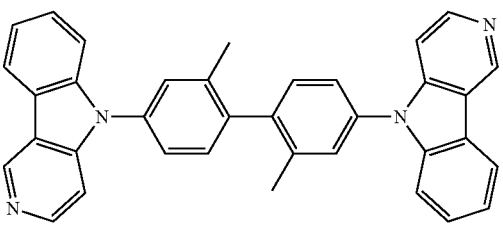
H27 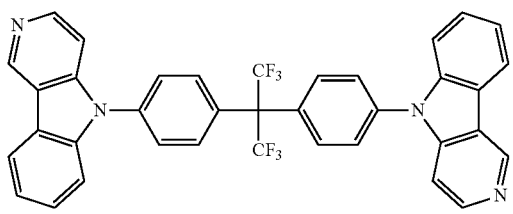 H28 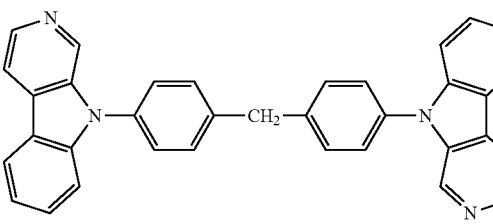
H29 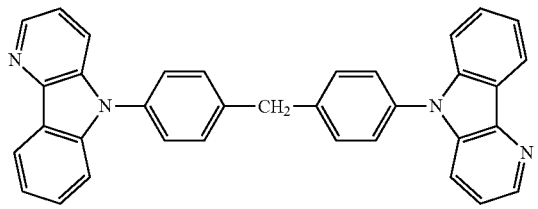 H30 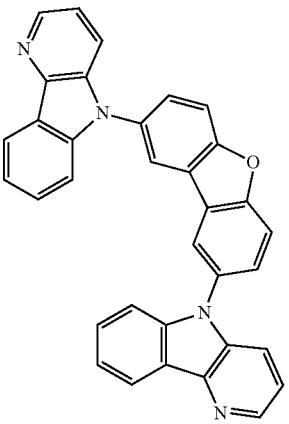

[Chemical Formula 39]
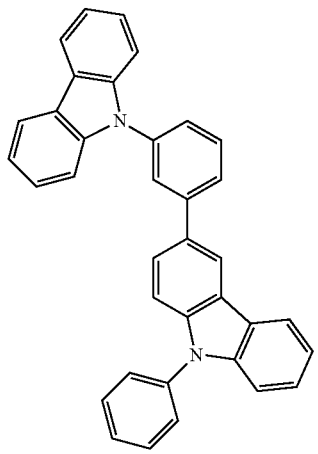
H31
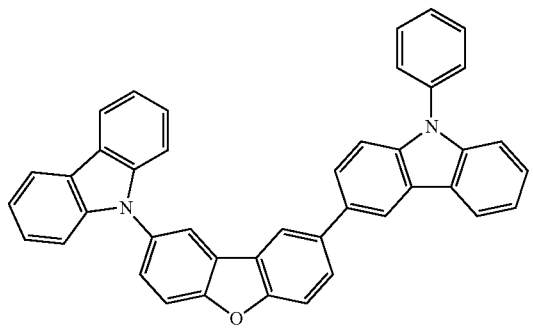
H32
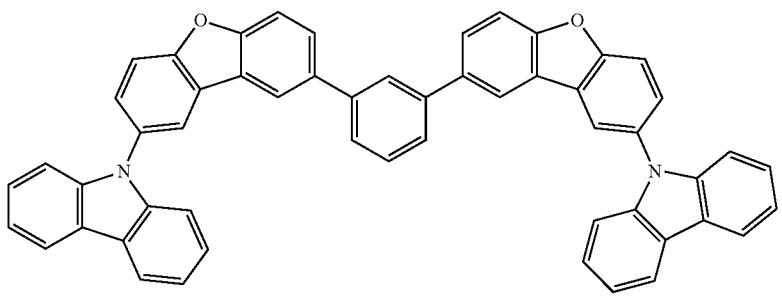
H33
[Chemical Formula 40]
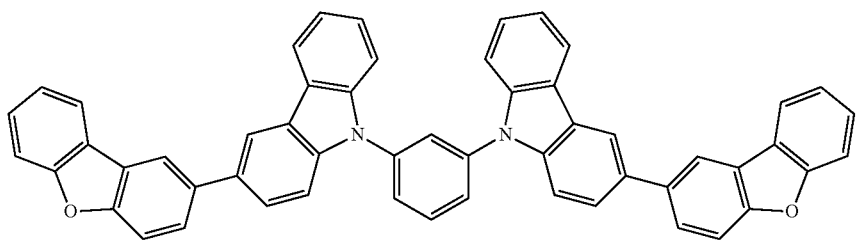
H34
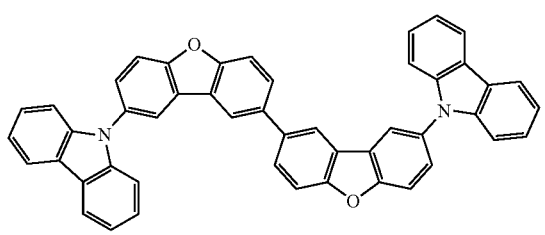
H35
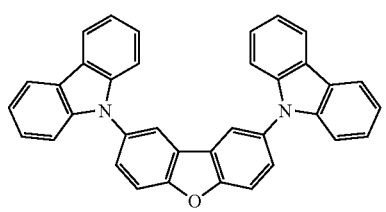
H36

-continued
H37
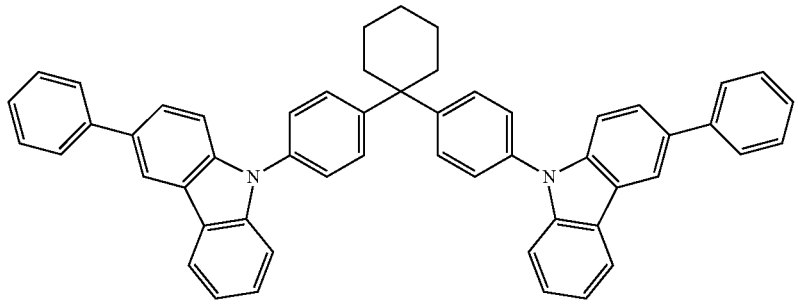
H38
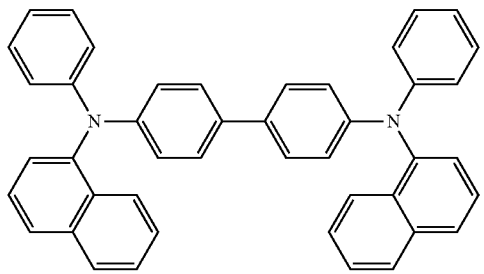
H39
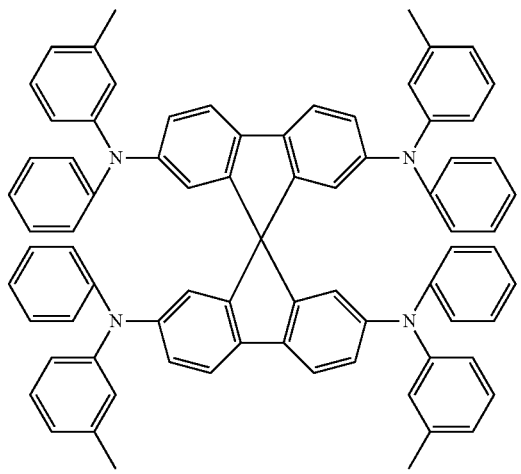
[Chemical Formula 41]
H40
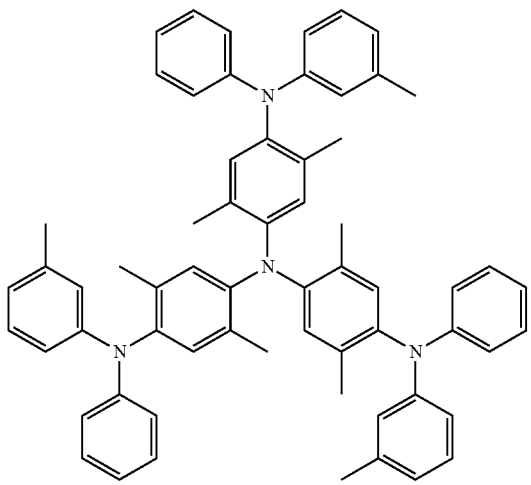
H41
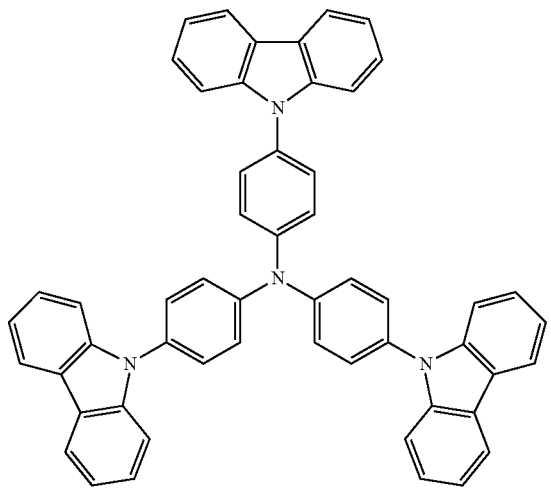
H42
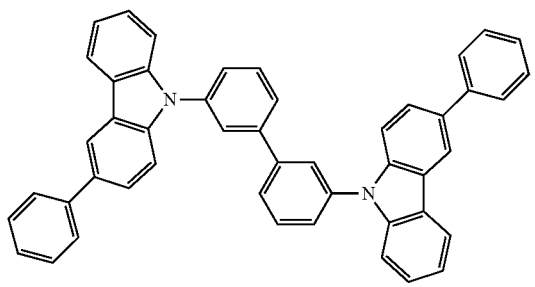
H43
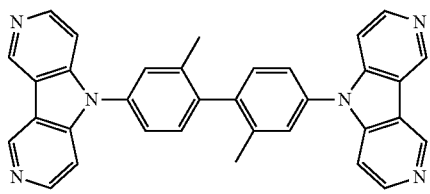

-continued
H44
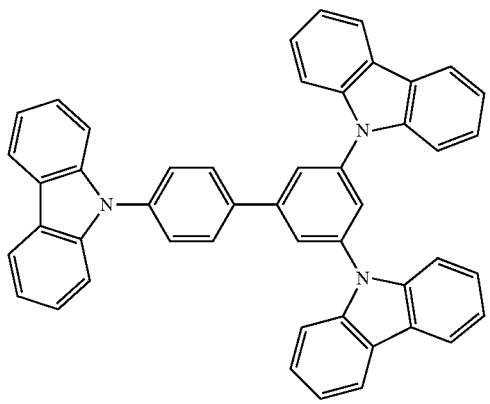
H45
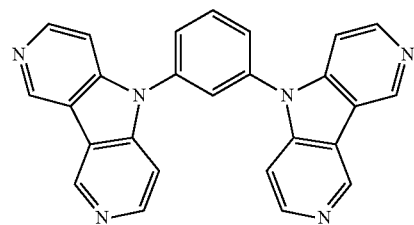
H46
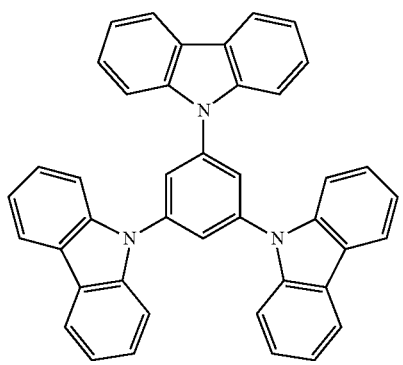
H47
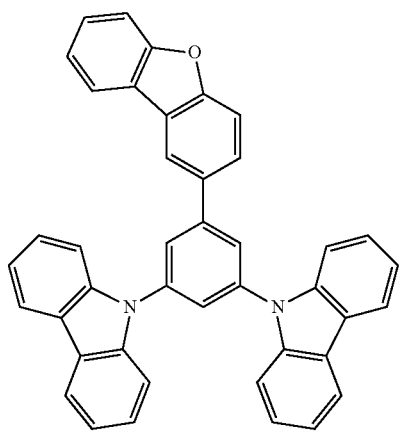
[Chemical Formula 42]
H48
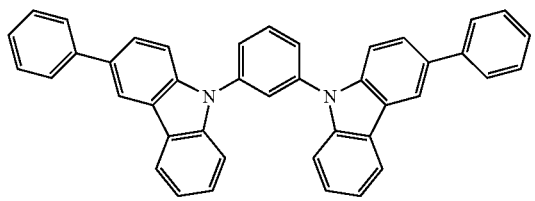
H49
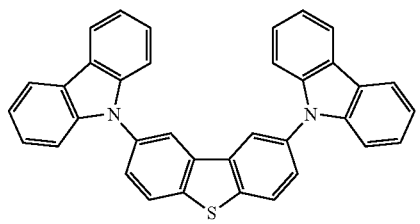
H50
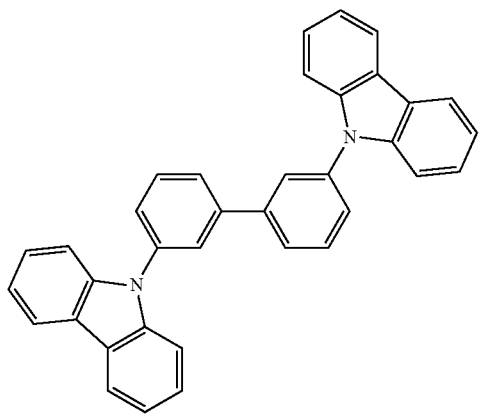
H51
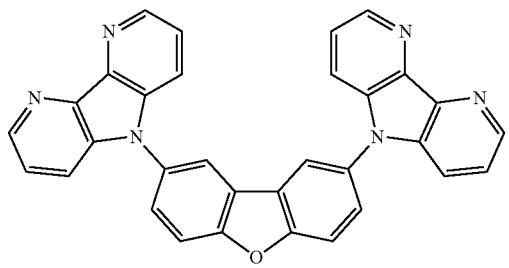

H52
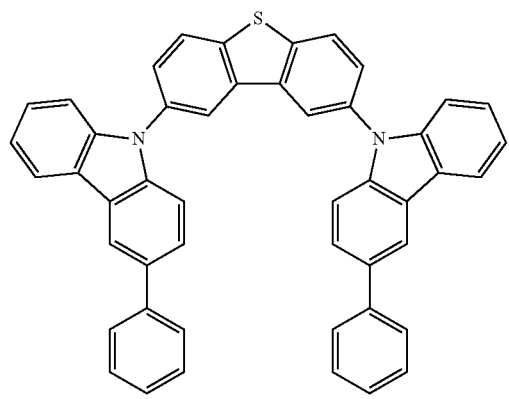
H53
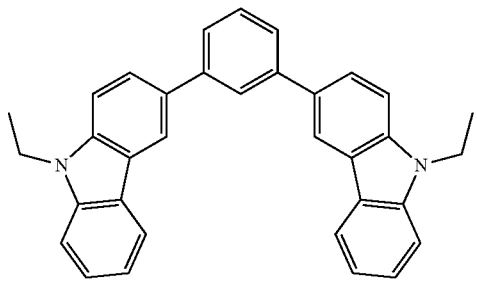
H54
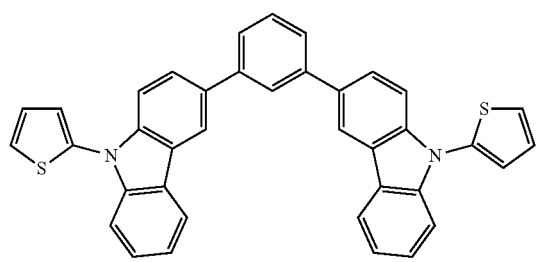
H55
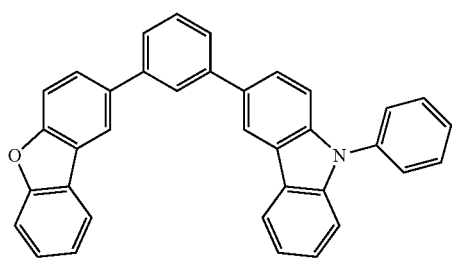
[Chemical Formula 43]
H56
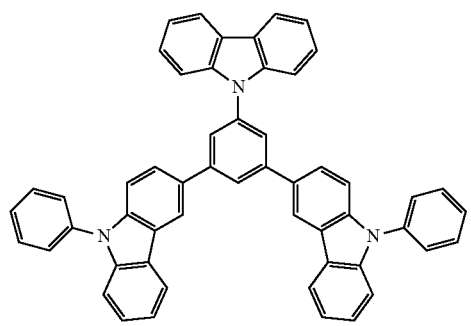
H57
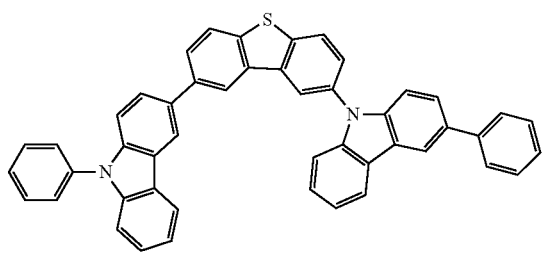
H58
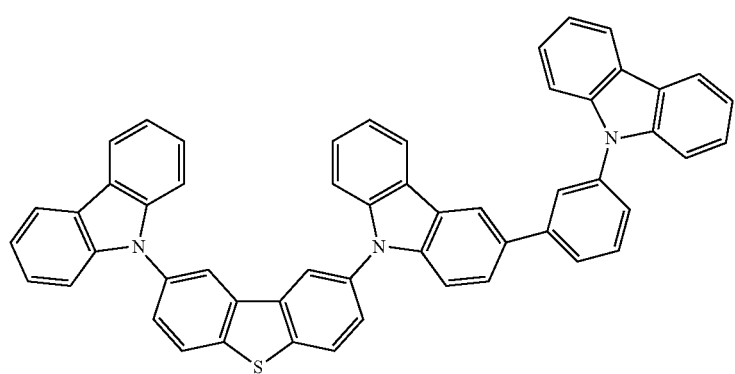

-continued
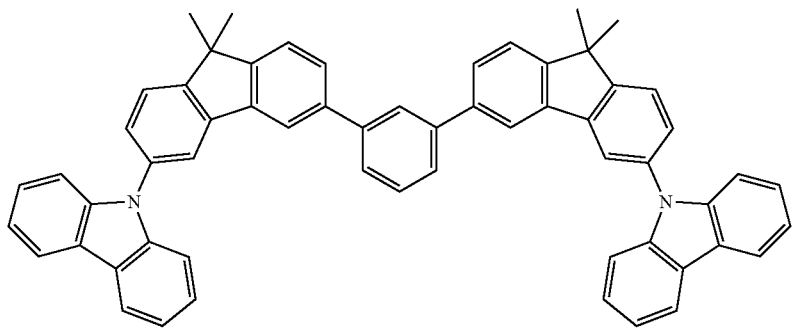
H59
[Chemical Formula 44]
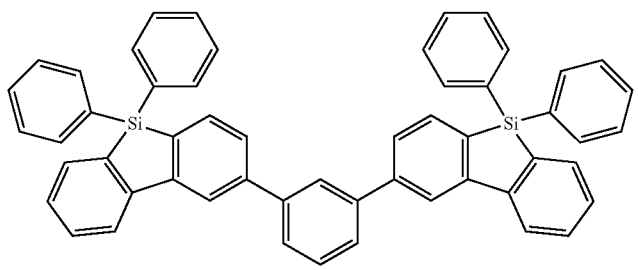
H60
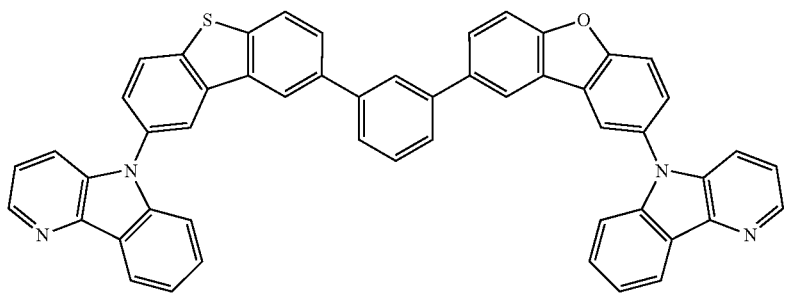
H61
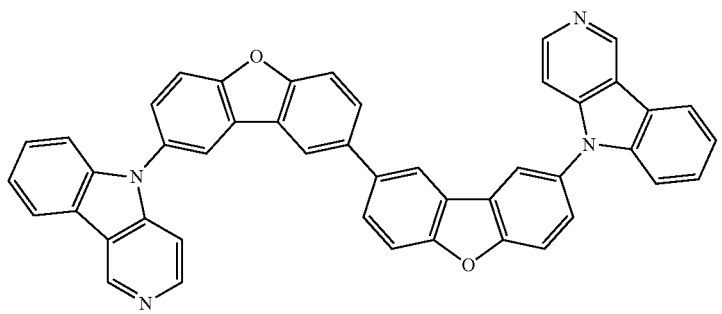
H62
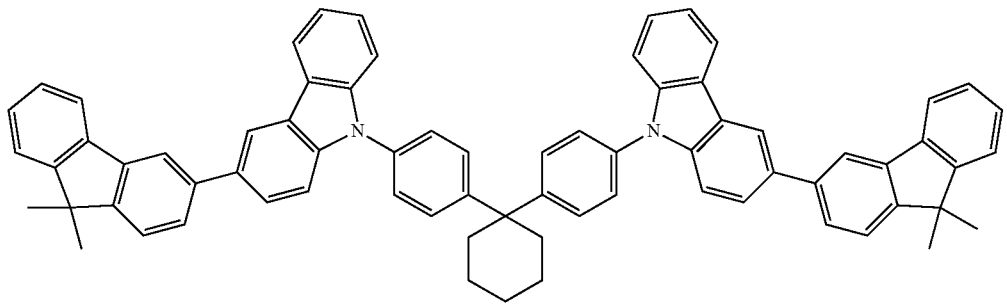
H63

H64
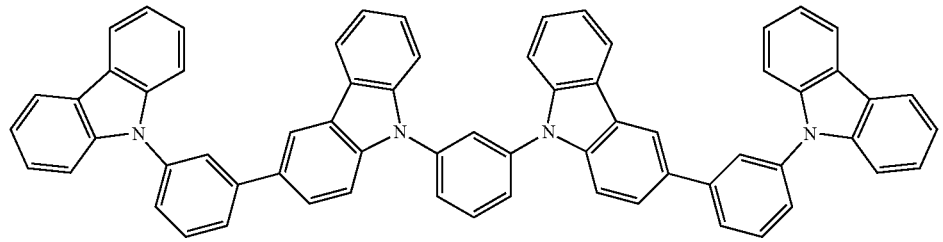
[Chemical Formula 45]
H65
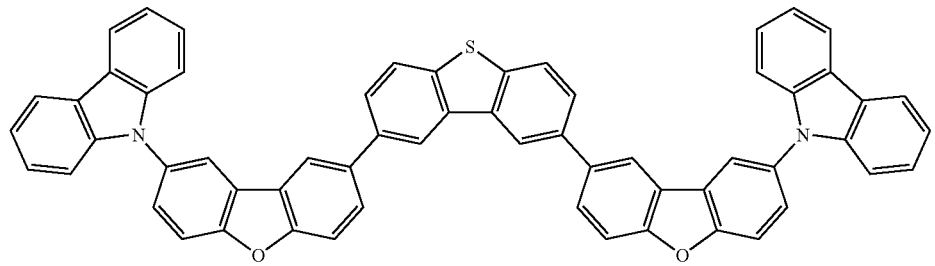
H66
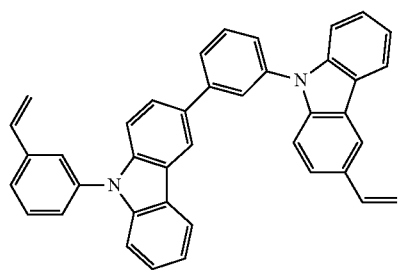
H67
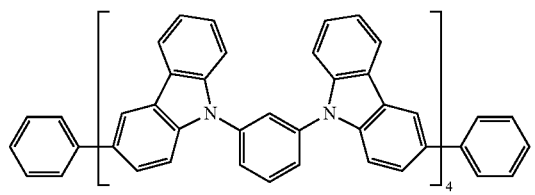
[Chemical Formula 46]
H68
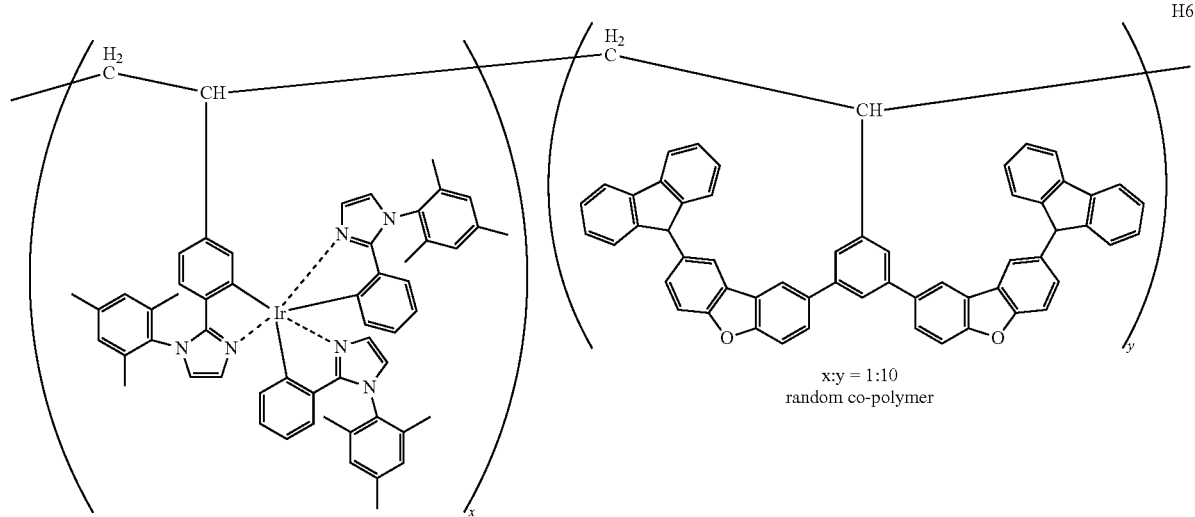
x:y = 1:10
random co-polymer

[Chemical Formula 47]
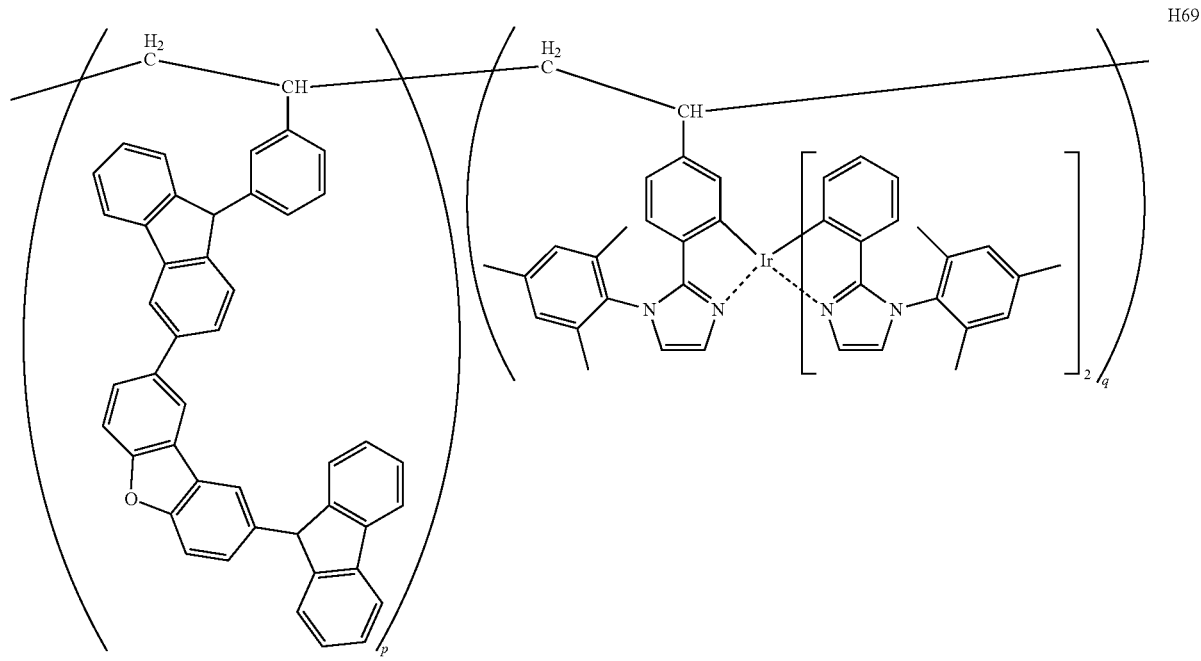
H69
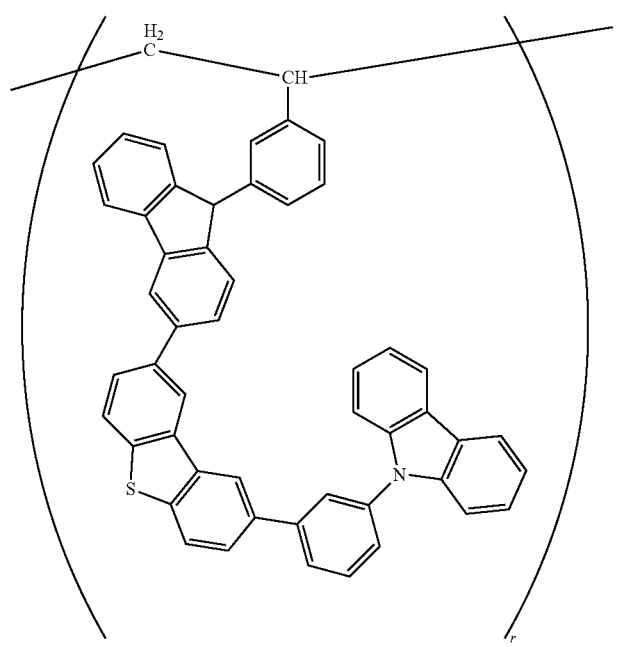

[Chemical Formula 48]
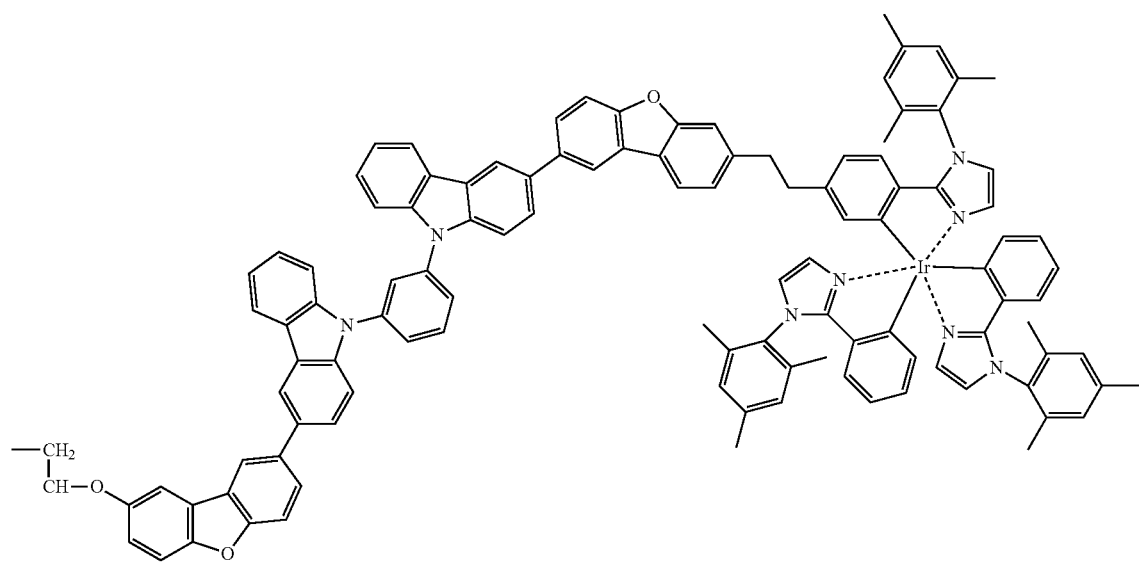
H70
[Chemical Formula 49]
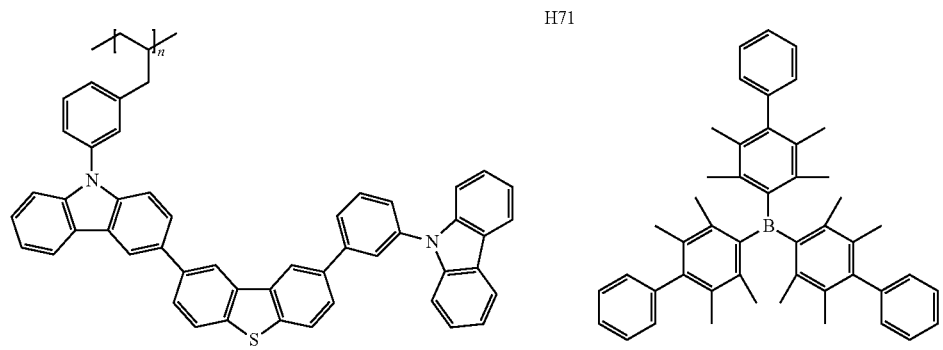
H71
H72
H73
H74
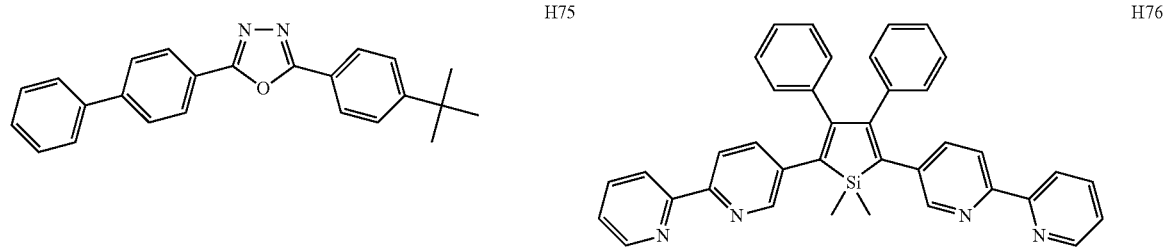
H75
H76

H77

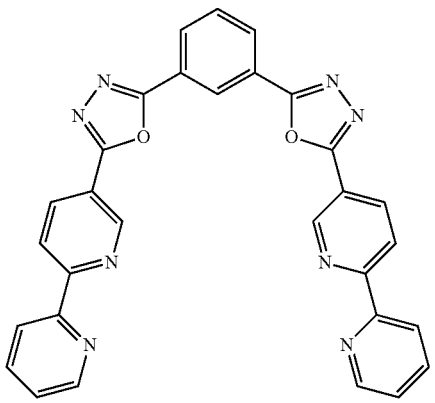

H78

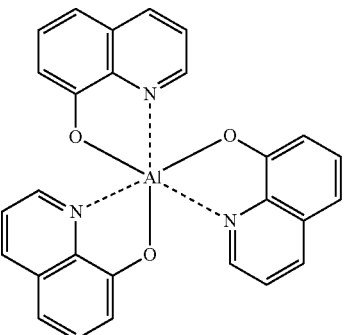

H79

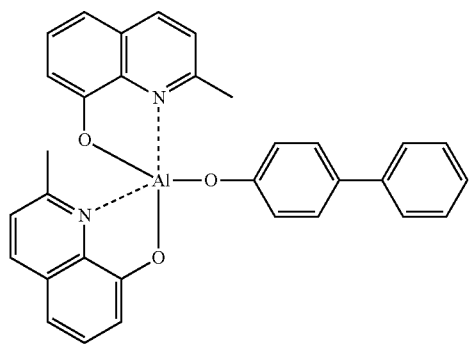

Concrete examples of the known host compound possible to be used are described in the following documents, for example: for example, Japanese Patent Application Laid-Open Publication Nos. 2001-257076, 2002-308855, 2001-313179, 2001-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2001-308837.

(Light Emitting Material)

Examples of the light emitting material possible to be used in the present invention include a phosphorescent compound (also referred to as "phosphorescent material").

A phosphorescent compound is a compound in which light emission from an excited triplet state is observed; to be specific, a phosphorescent compound is a compound which emits phosphorescence at room temperature (25° C.) and which exhibits a phosphorescence quantum yield 0.01 or more at 25° C.; however, preferable phosphorescence quantum yield is 0.1 or more.

The phosphorescence quantum yield can be measured by a method described on page 398 of Spectroscopy II of Lecture of Experimental Chemistry, vol. 7, 4th edition) (1992, published by Maruzen Co., Ltd.). The phosphorescence quantum yield in a solution can be measured by using various solvents. In the present invention, in the case where a phosphorescent compound is used, it is only necessary to achieve the aforesaid phosphorescence quantum yield (0.01 or more) with any one arbitrary solvent.

Examples of light-emitting principle of the phosphorescent compound include the following two: one is an energy transfer type, in which carriers recombine on a host compound that transports the carriers, so as to generate an excited state of the host compound, and the energy is transferred to a phosphorescent compound to thereby emit light from the phosphorescent compound; the other is a carrier trap type, wherein a phosphorescent compound serves as a carrier trap, and carriers recombine on the phosphorescent compound to thereby emit light from the phosphorescent compound. In either case, the energy of the phosphorescent compound in excited state is required to be lower than that of the host compound.

The phosphorescent compound can be suitably selected from the known phosphorescent compounds used for the light emitting layer of a generic organic electroluminescence element; the phosphorescent compound is preferably a complex compound containing a metal of groups 8 to 10 in the periodic table of elements, and further preferably an iridium compound, an osmium compound, a platinum compound (a platinum complex compound) or a rare-earth complex, and most preferably an iridium compound.

In the present invention, at least one light emitting layer 3c may contain two or more types of phosphorescent compounds, and the ratio of concentration of the phosphorescent compounds contained in the light emitting layer 3c may vary in a direction of the thickness of the light emitting layer 3c.

It is preferred that the content of the phosphorescent compounds is equal to or higher than 0.1 vol. % but less than 30 vol. % of the total amount of the light emitting layer 3c.

(Compound Represented by General Formula (3))

It is preferred that the compound (i.e., the phosphorescent compound) contained in the light emitting layer 3c is a compound represented by the following General Formula (3).

It is preferred that the phosphorescent compound (also referred to as "phosphorescent metal complex") represented by General Formula (3) is contained in the light emitting layer 3c of the organic electroluminescence element EL-1 as a light-emitting dopant; however, the phosphorescent compound may also be contained in other layer(s) of the light-emitting functional layer than the light emitting layer 3c.

[Chemical Formula 50]

General Formula (3)

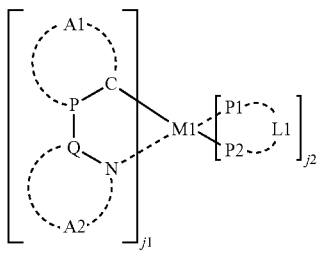

In General Formula (3), P and Q each represent a carbon atom or a nitrogen atom; A1 represents an atom group which forms an aromatic hydrocarbon ring or an aromatic heterocycle with P—C; A2 represents an atom group which forms an aromatic heterocycle with Q-N; P1-L1-P2 represents a bidentate ligand, wherein P1 and P2 each independently represent a carbon atom, a nitrogen atom or an oxygen atom, and L1 represents an atom group which forms the bidentate ligand with P1 and P2; j1 represents an integer of 1 to 3, and j2 represents an integer of 0 to 2, wherein the sum of j1 and j2 is 2 or 3; and M1 represents a transition metal element of groups 8 to 10 in the periodic table of elements.

In General Formula (3), P and Q each represent a carbon atom or a nitrogen atom.

Examples of the aromatic hydrocarbon ring which is formed by A1 with P—C in General Formula (3) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthranthrene ring and the like.

Each of these rings may have a substituent represented by R3 of —C(R3)=represented by each of E51 to E66 and E71 to E88 in General Formula (1).

Examples of an aromatic heterocycle which is formed by A1 with P—C in General Formula (3) include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, a benzimidazole ring, a benzothiazole ring, a benzoxazole ring, a quinoxaline ring, a quinazoline ring, a phthalazine ring, a carbazole ring and an azacarbazole ring.

Here, the azacarbazole ring indicates a ring formed by substituting at least one of carbon atoms of a benzene ring constituting a carbazole ring with a nitrogen atom.

Each of these rings may have a substituent represented by R3 of —C(R3)=represented by each of E51 to E66 and E71 to E88 in General Formula (1).

Examples of the aromatic heterocycle which is formed by A2 with Q-N in General Formula (3) include an oxazole ring, an oxadiazole ring, an oxatriazole ring, an isoxazole ring, a tetrazole ring, a thiadiazole ring, a thiatriazole ring, an isothiazole ring, a pyrrole ring, a pyridine ring, a pyridazine ring, a pyrimidine ring, a pyrazine ring, a triazine ring, an imidazole ring, a pyrazole ring, a triazole ring and the like.

Each of these rings may have a substituent represented by R3 of —C(R3)=represented by each of E51 to E66 and E71 to E88 in General Formula (1).

In General Formula (3), P1-L1-P2 represents a bidentate ligand, P1 and P2 each independently represent a carbon atom, a nitrogen atom or an oxygen atom, and L1 represents an atom group which forms the bidentate ligand with P1 and P2.

Examples of the bidentate ligand represented by P1-L1-P2 include phenylpyridine, phenylpyrazole, phenylimidazole, phenyltriazole, phenyltetrazole, pyrazabole, acetylacetone, picolinic acid and the like.

In General Formula (3), j1 represents an integer of 1 to 3, j2 represents an integer of 0 to 2, and the sum of j1 and j2 is 2 or 3, wherein it is preferred that j2 is 0.

In General Formula (3), M1 represents a transition metal element (also simply referred to as transition metal) of groups 8 to 10 in the periodic table of elements, wherein it is preferred that transition metal element is iridium.

(Compound Represented by General Formula (4))

Among the compounds represented by General Formula (3), a compound represented by the following General Formula (4) is further preferable.

[Chemical Formula 51]

General Formula (4)

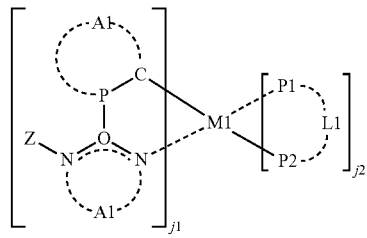

In General Formula (4), Z represents a hydrocarbon ring group or a heterocyclic group; P and Q each represent a carbon atom or a nitrogen atom; A1 represents an atom group which forms an aromatic hydrocarbon ring or an aromatic heterocycle with P—C; A3 represents —C(R01) =C(R02)-, —N=C(R02)-, —C(R01)=N— or —N=N—, wherein R01 and R02 each represent a hydrogen atom or a substituent; P1-L1-P2 represents a bidentate ligand, wherein P1 and P2 each independently represent a carbon atom, a nitrogen atom or an oxygen atom, and L1 represents an atom group which forms the bidentate ligand with P1 and P2; j1 represents an integer of 1 to 3, and j2 represents an integer of 0 to 2, wherein the sum of j1 and j2 is 2 or 3; and M1 represents a transition metal element of groups 8 to 10 in the periodic table of elements.

Examples of the hydrocarbon ring group represented by Z in General Formula (4) include a non-aromatic hydrocarbon ring group and an aromatic hydrocarbon ring group, wherein examples of the non-aromatic hydrocarbon ring group include a cyclopropyl group, a cyclopentyl group, a cyclohexyl group and the like. These groups may each be unsubstituted or may each have a substituent described later.

Examples of the aromatic hydrocarbon ring group (also referred to as aromatic hydrocarbon group, aryl group or the like) include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenyl group and the like.

Each of these groups may be unsubstituted, or may have a substituent represented by R3 of —C(R3)=represented by each of E51 to E66 and E71 to E88 in General Formula (1).

Examples of a heterocyclic group represented by Z in General Formula (4) include a non-aromatic heterocyclic group and an aromatic heterocyclic group; wherein examples of the non-aromatic heterocyclic group include an epoxy ring, an aziridine ring, a thiirane ring, an oxetane ring, an azetidine ring, a thietane ring, a tetrahydrofuran ring, a dioxorane ring, a pyrrolidine ring, a pyrazolidine ring, an imidazolidine ring, an oxazolidine ring, a tetrahydrothiophene ring, a sulforane ring, a thiazolidine ring, an ε-caprolactone ring, an ε-caprolactam ring, a piperidine ring, a hexahydropyridazine ring, a hexahydropyrimidine ring, a piperazine ring, a morpholine ring, a tetrahydropyrane ring, a 1,3-dioxane ring, a 1,4-dioxane ring, a trioxane ring, a tetrahydrothiopyrane ring, a thiomorpholine ring, a thiomorpholine-1,1-dioxide ring, a pyranose ring and a diazabicyclo[2,2,2]-octane ring.

Each of these groups may be unsubstituted, or may have a substituent represented by R3 of —C(R3)=represented by each of E51 to E66 and E71 to E88 in General Formula (1).

Examples of the aromatic heterocyclic group include a pyridyl group, a pyrimidinyl group, a furyl group, a pyrrolyl group, an imidazolyl group, a benzimidazolyl group, a pyrazolyl group, a pyradinyl group, a triazolyl group (for example, a 1,2,4-triazole-1-yl group, a 1,2,3-triazole-1-yl group and the like), an oxazolyl group, a benzoxazolyl group, a triazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring formed by substituting one of carbon atoms constituting a carboline ring of a carbolinyl group with a nitrogen atom), a quinoxalinyl group, a pyridazinyl group, a triazinyl group, a quinazolinyl group, a phthalazinyl group and the like.

Each of these groups may be unsubstituted, or may have a substituent represented by R3 of —C(R3)=represented by each of E51 to E66 and E71 to E88 in General Formula (1).

The group represented by Z is preferably an aromatic hydrocarbon ring group or an aromatic heterocyclic group.

Examples of the aromatic hydrocarbon ring which is formed by A1 with P—C in General Formula (4) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthranthrene ring and the like.

Each of these rings may have a substituent represented by R3 of —C(R3)=represented by each of E51 to E66 and E71 to E88 in General Formula (1).

Examples of an aromatic heterocycle which is formed by A1 with P—C in General Formula (4) include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, a benzimidazole ring, a benzothiazole ring, a benzoxazole ring, a quinoxaline ring, a quinazoline ring, a phthalazine ring, a carbazole ring, a carboline ring and an azacarbazole ring.

Here, the azacarbazole ring indicates a ring formed by substituting at least one of carbon atoms of a benzene ring constituting a carbazole ring with a nitrogen atom.

Each of these rings may have a substituent represented by R3 of —C(R3)=represented by each of E51 to E66 and E71 to E88 in General Formula (1).

The substituent represented by each of R01 and R02 in —C(R01)=C(R02)-, —N=C(R02)- and —C(R01)=N— represented by A3 in General Formula (4) is synonymous with the substituent represented by R3 of —C(R3)=represented by each of E51 to E66 and E71 to E88 in General Formula (1).

Examples of the bidentate ligand represented by P1-L1-P2 in General Formula (4) include phenylpyridine, phenylpyrazole, phenylimidazole, phenyltriazole, phenyltetrazole, pyrazabole, acetylacetone, picolinic acid and the like.

Further, j1 represents an integer of 1 to 3, j2 represents an integer of 0 to 2, and the sum of j1 and j2 is 2 or 3, wherein it is preferred that j2 is 0.

The transition metal element (also simply referred to as transition metal) of groups 8 to 10 in the periodic table of elements represented by M1 in General Formula (4) is synonymous with the transition metal element of groups 8 to 10 in the periodic table of elements represented by M1 in General Formula (3).

(Compound Represented by General Formula (5))

A compound represented by the following General Formula (5) is one of preferable examples of the compounds represented by General Formula (4).

[Chemical Formula 52]

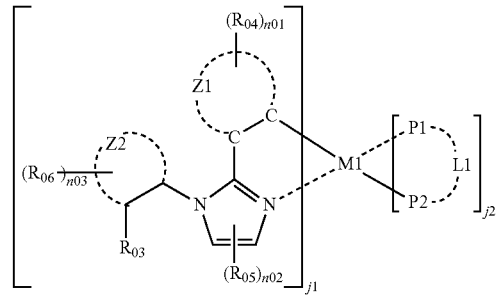

General Formula (5)

In General Formula (5), $R_{03}$ represents a substituent, $R_{04}$ represents a hydrogen atom or a substituent, and a plurality of $R_{04}$ may be bonded to each other to form a ring; n01 represents an integer of 1 to 4; $R_{05}$ represents a hydrogen atom or a substituent, and a plurality of $R_{05}$ may be bonded to each other to form a ring; n02 represents an integer of 1 to 2; $R_{06}$ represents a hydrogen atom or a substituent, and a plurality of $R_{06}$ may be bonded to each other to form a ring; n03 represents an integer of 1 to 4; Z1 represents an atom group necessary to form, along with C—C, a 6-membered aromatic hydrocarbon ring, or a 5-membered or 6-membered aromatic heterocycle; Z2 represents an atom group necessary to form a hydrocarbon ring group or a heterocyclic group; P1-L1-P2 represents a bidentate ligand, wherein P1 and P2 each independently represent a carbon atom, a nitrogen atom or an oxygen atom, and L1 represents an atom group which forms the bidentate ligand with P1 and P2; j1 represents an integer of 1 to 3, and j2 represents an integer of 0 to 2, wherein the sum of j1 and j2 is 2 or 3; and M1 represents a transition metal element of groups 8 to 10 in the periodic table of elements. $R_{03}$ and $R_{06}$ may be bonded to each other to form a ring, $R_{04}$ and $R_{06}$ may be bonded to each other to form a ring, and $R_{05}$ and $R_{06}$ may be bonded to each other to form a ring.

The substituents respectively represented by $R_{03}$, $R_{04}$, $R_{05}$, and $R_{06}$ in General Formula (5) are each synonymous with the substituent represented by R3 of —C(R3)=represented by each of E51 to E66 and E71 to E88 in General Formula (1).

Examples of the 5-membered aromatic hydrocarbon ring which is formed by Z1 with C—C in General Formula (5) include a benzene ring and the like.

Each of these rings may have a substituent represented by R3 of —C(R3)=represented by each of E51 to E66 and E71 to E88 in General Formula (1).

Examples of the 5-membered or 6-membered aromatic heterocycle which is formed by Z1 with C—C in General Formula (5) include an oxazole ring, an oxadiazole ring, an oxatriazole ring, an isoxazole ring, a tetrazole ring, a thiadiazole ring, a thiatriazole ring, an isothiazole ring, a thiophene ring, furan ring, a pyrrole ring, a pyridine ring, a pyridazine ring, a pyrimidine ring, a pyrazine ring, a triazine ring, an imidazole ring, a pyrazole ring and a triazole ring.

Each of these rings may have a substituent represented by R3 of —C(R3)=represented by each of E51 to E66 and E71 to E88 in General Formula (1).

Examples of the hydrocarbon ring group represented by Z2 in General Formula (5) include a non-aromatic hydrocarbon ring group and an aromatic hydrocarbon ring group, wherein examples of the non-aromatic hydrocarbon ring group include a cyclopropyl group, a cyclopentyl group, a cyclohexyl group and the like. These groups may each be unsubstituted or may each have a substituent described later.

Examples of the aromatic hydrocarbon ring group (also referred to as aromatic hydrocarbon group, aryl group or the like) include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenyl group and the like. Each of these groups may be unsubstituted, or may have a substituent represented by R3 of —C(R3)=represented by each of E51 to E66 and E71 to E88 in General Formula (1).

Examples of a heterocyclic group represented by Z2 in General Formula (5) include a non-aromatic heterocyclic group and an aromatic heterocyclic group; wherein examples of the non-aromatic heterocyclic group include an epoxy ring, an aziridine ring, a thiirane ring, an oxetane ring, an azetidine ring, a thietane ring, a tetrahydrofuran ring, a dioxorane ring, a pyrrolidine ring, a pyrazolidine ring, an imidazolidine ring, an oxazolidine ring, a tetrahydrothiophene ring, a sulforane ring, a thiazolidine ring, an ε-caprolactone ring, an ε-caprolactam ring, a piperidine ring, a hexahydropyridazine ring, a hexahydropyrimidine ring, a piperazine ring, a morpholine ring, a tetrahydropyrane ring, a 1,3-dioxane ring, a 1,4-dioxane ring, a trioxane ring, a tetrahydrothiopyrane ring, a thiomorpholine ring, a thiomorpholine-1,1-dioxide ring, a pyranose ring and a diazabicyclo [2,2,2]-octane ring. Each of these groups may be unsubstituted, or may have a substituent represented by R3 of —C(R3)=represented by each of E51 to E66 and E71 to E88 in General Formula (1).

Examples of the aromatic heterocyclic group include a pyridyl group, a pyrimidinyl group, a furyl group, a pyrrolyl group, an imidazolyl group, a benzimidazolyl group, a pyrazolyl group, a pyradinyl group, a triazolyl group (for example, a 1,2,4-triazole-1-yl group, a 1,2,3-triazole-1-yl group and the like), an oxazolyl group, a benzoxazolyl group, a triazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (indicating a ring formed by substituting one of carbon atoms constituting a carboline ring of a carbolinyl group with a nitrogen atom), a quinoxalinyl group, a pyridazinyl group, a triazinyl group, a quinazolinyl group, a phthalazinyl group and the like.

Each of these rings may be unsubstituted, or may have a substituent represented by R3 of —C(R3)=represented by each of E51 to E66 and E71 to E88 in General Formula (1).

It is preferred that, in General Formula (5), the group formed by Z1 and Z2 is a benzene ring.

The bidentate ligand represented by P1-L1-P2 in General Formula (5) is synonymous with the bidentate ligand represented by P1-L1-P2 in General Formula (3).

The transition metal element of groups 8 to 10 in the periodic table of elements represented by M1 in General Formula (5) is synonymous with the transition metal element of groups 8 to 10 in the periodic table of elements represented by M1 in General Formula (3).

The phosphorescent compound may be suitably selected from the known phosphorescent compounds used for the light emitting layer 3c of the organic electroluminescence element EL-1.

The phosphorescent compound of the present invention is preferably a complex compound containing a metal of groups 8 to 10 in the periodic table of elements, further preferably an iridium compound, an osmium compound, a platinum compound (a platinum complex compound) or a rare-earth complex, and most preferably an iridium compound.

Concrete examples (Pt-1 to Pt-3, A-1, Ir-1 to Ir-50) of the phosphorescent compound of the present invention are shown below; however, the present invention is not limited thereto. Note that, in these compounds, m and n each represent number of replication.

[Chemical Formula 53]

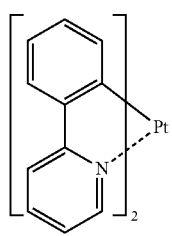

Pt-1

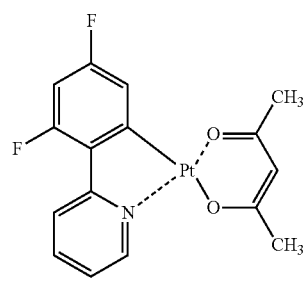

Pt-2

-continued
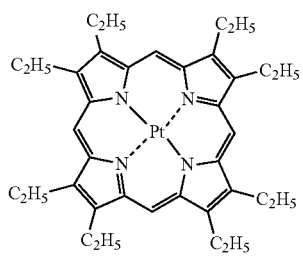
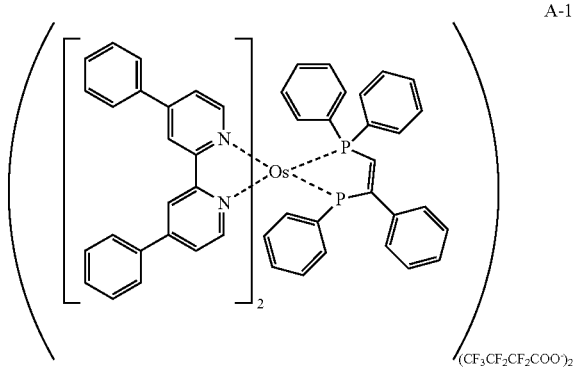
Pt-3　　　　　　　　　　　　　　　A-1
[Chemical Formula 54]
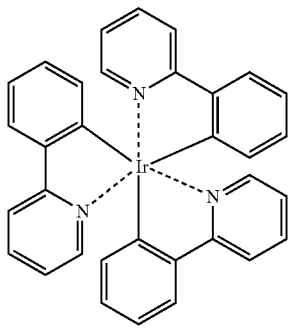
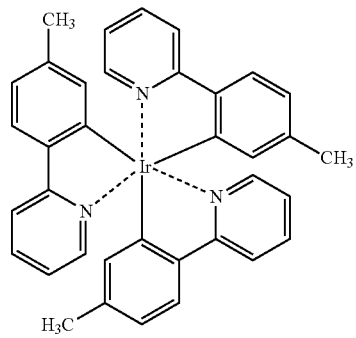
Ir-1　　　　　　　　　　　　　　　Ir-2
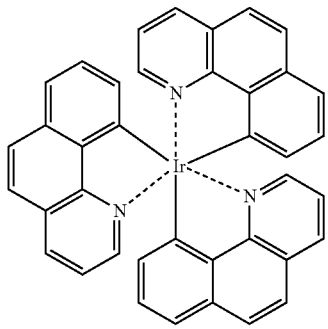
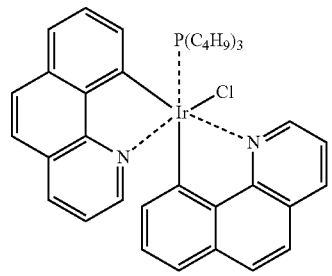
Ir-3　　　　　　　　　　　　　　　Ir-4
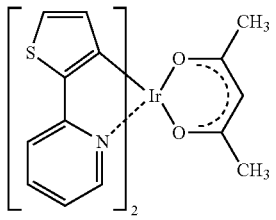
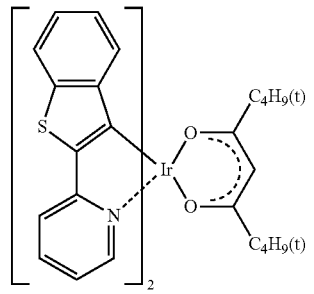
Ir-5　　　　　　　　　　　　　　　Ir-6

[Chemical Formula 55]
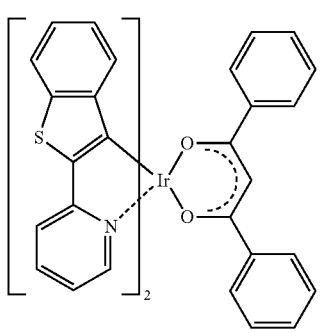 Ir-7
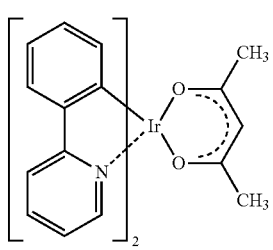 Ir-8
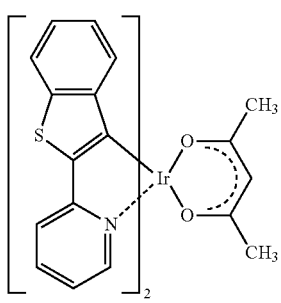 Ir-9
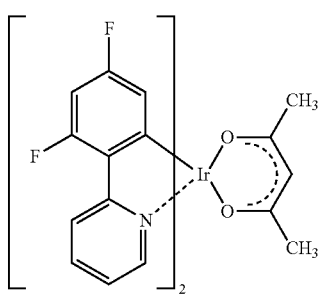 Ir-10
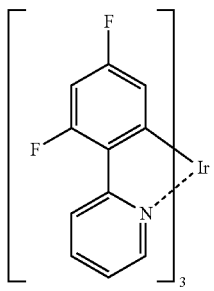 Ir-11
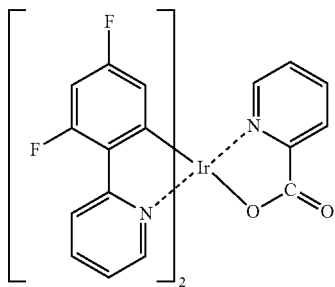 Ir-12
[Chemical Formula 56]
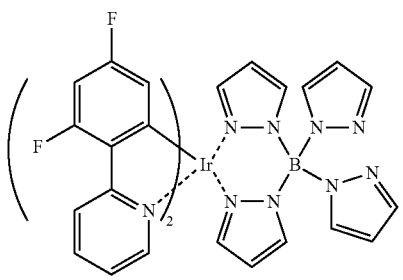 Ir-13
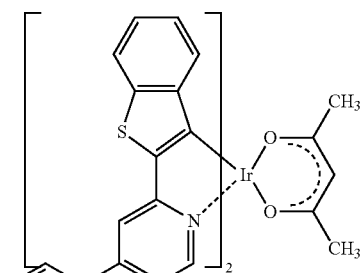 Ir-14
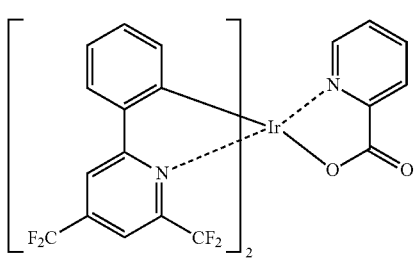 Ir-15
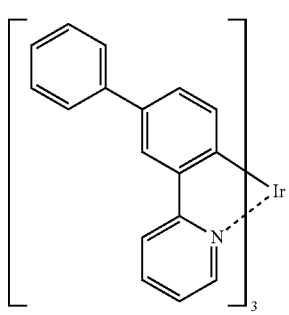 Ir-16

-continued
Ir-17
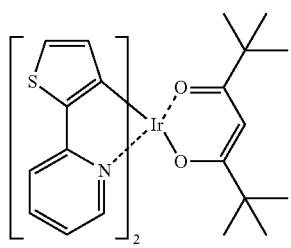
Ir-18
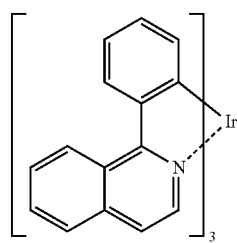
Ir-19
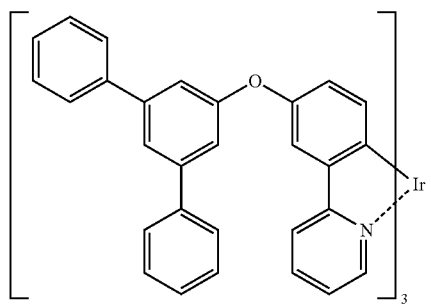
Ir-20
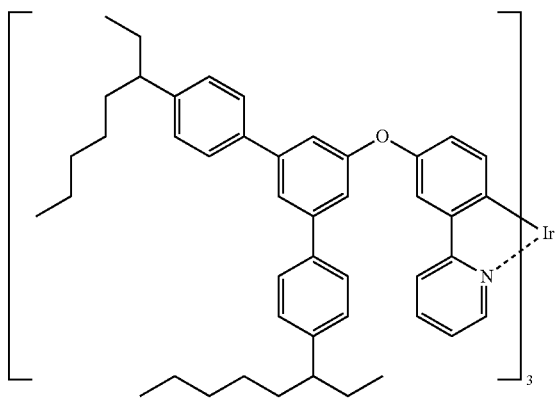
Ir-21
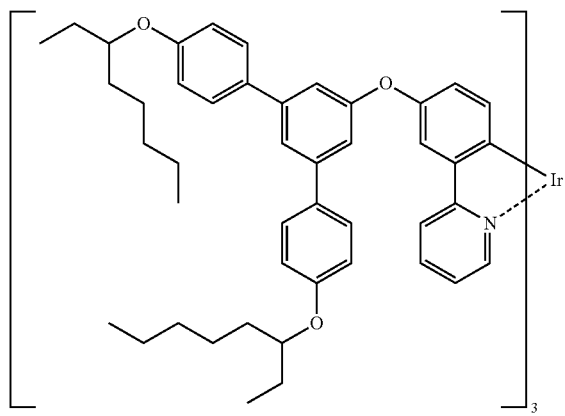
[Chemical Formula 57]
Ir-22
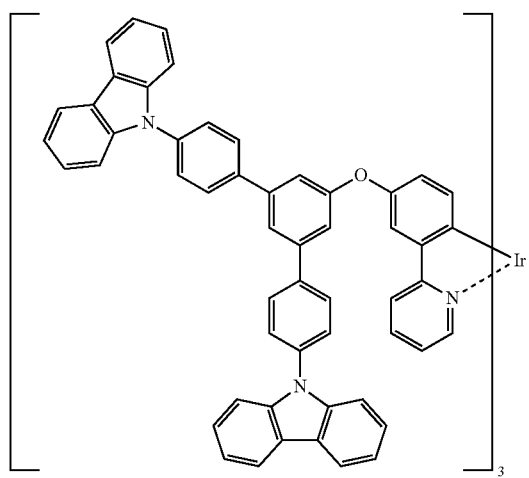
Ir-23
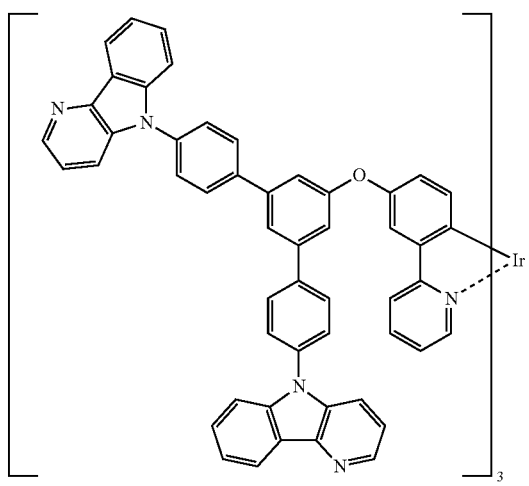

-continued
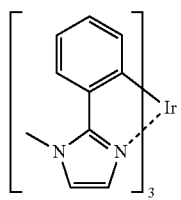
Ir-24
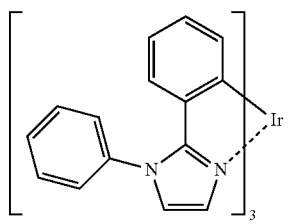
Ir-25
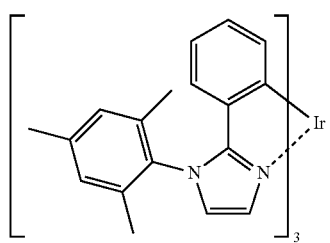
Ir-26
[Chemical Formula 58]
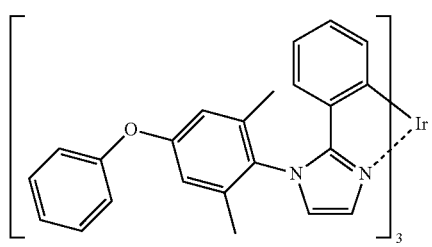
Ir-27
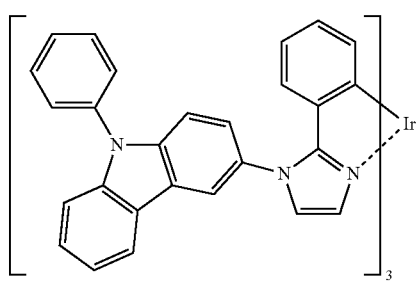
Ir-28
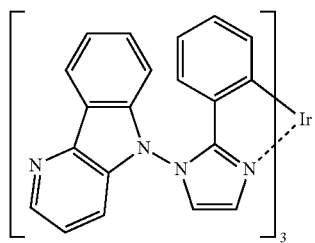
Ir-29
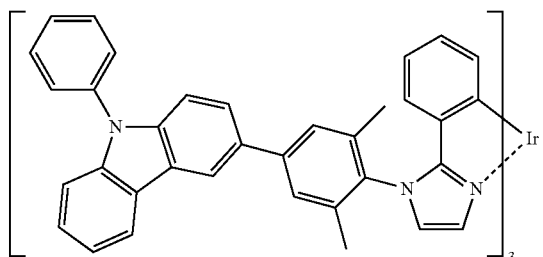
Ir-30
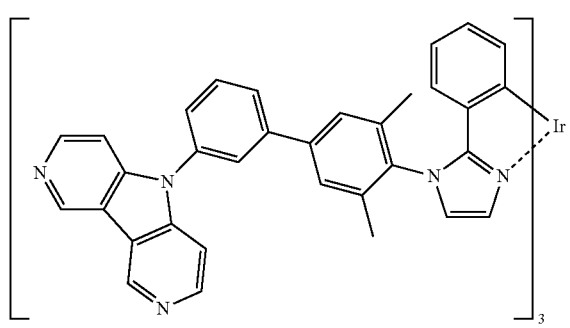
Ir-31

-continued
Ir-32
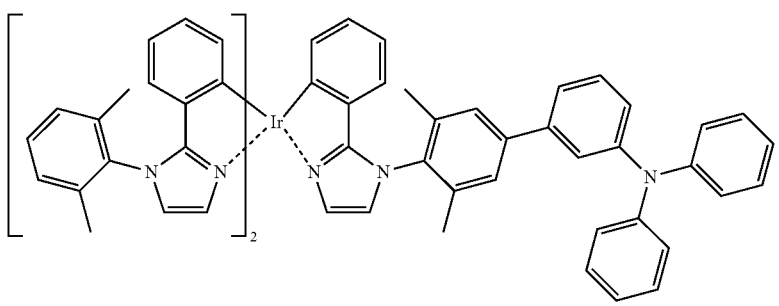
Ir-33
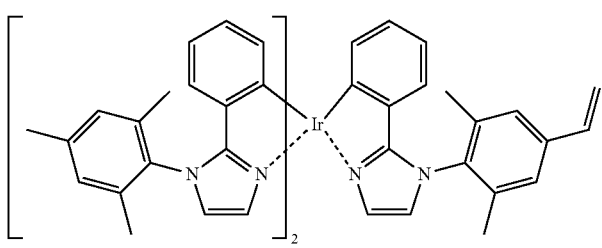
[Chemical Formula 59]
Ir-34
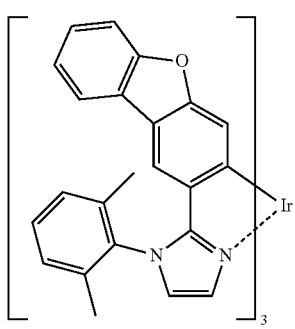
Ir-35
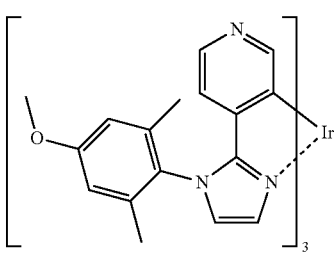
Ir-36
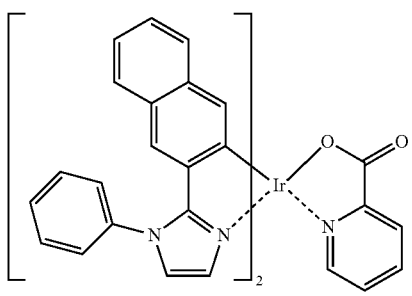
Ir-37
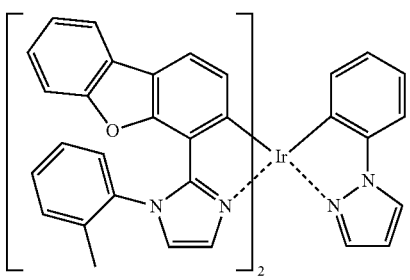
Ir-38
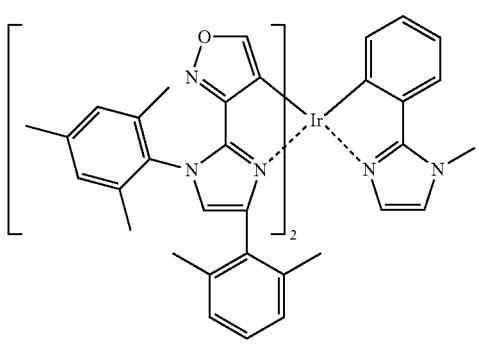
Ir-39
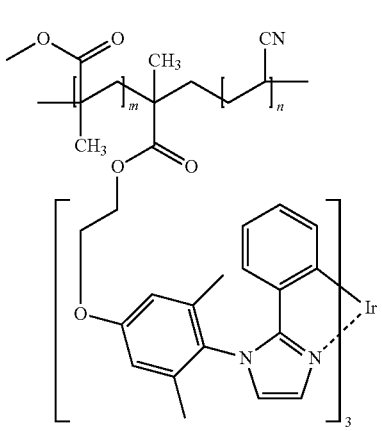

[Chemical Formula 60]
Ir-40
Ir-41
Ir-42
Ir-43
Ir-44
Ir-45
[Chemical Formula 61]
Ir-46
Ir-47
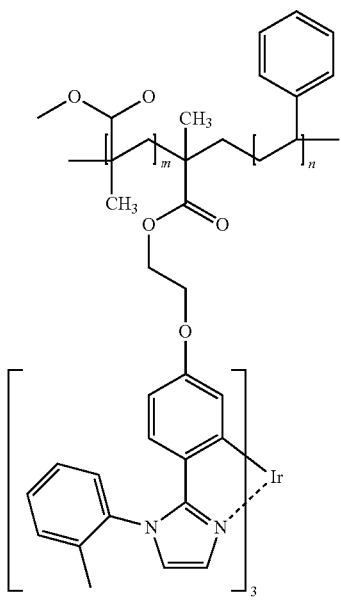
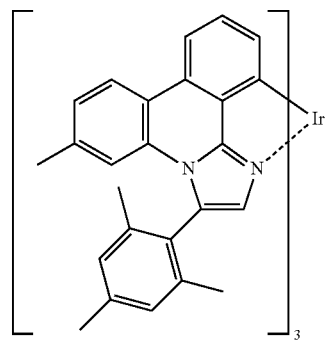
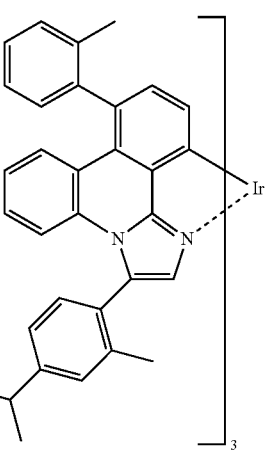
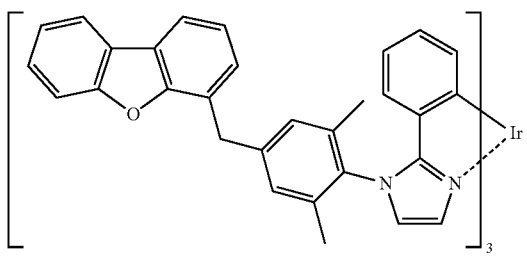
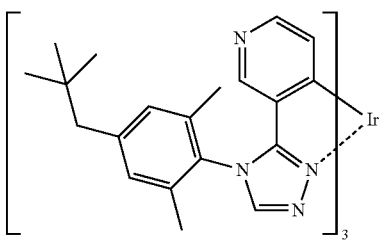
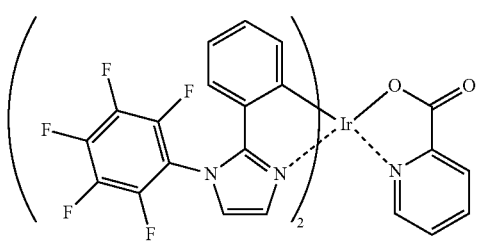
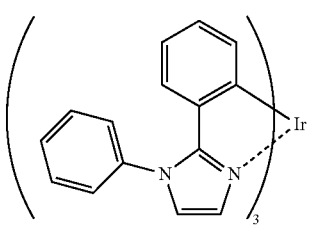

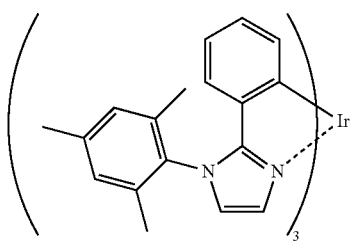 Ir-48

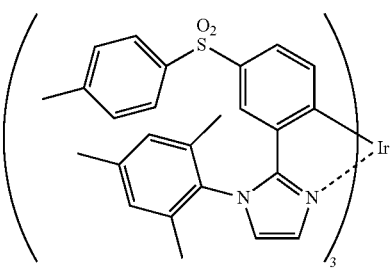 Ir-49

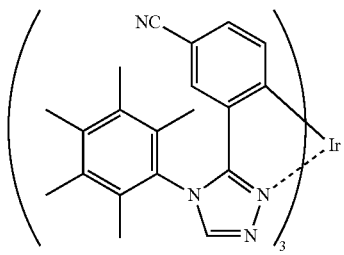 Ir-50

The aforesaid phosphorescent compounds (also referred to as phosphorescent metal complexes or the like) can be synthesized by employing methods described in documents such as Organic Letters, vol. 3, No. 16, pp. 2579-2581 (2001); Inorganic Chemistry, vol. 30, No. 8, pp. 1685-1687 (1991); J. Am. Chem. Soc., vol. 123, pp. 4304 (2001); Inorganic Chemistry, vol. 40, No. 7, pp. 1704-1711 (2001); Inorganic Chemistry, vol. 41, No. 12, pp. 3055-3066 (2002); New Journal of Chemistry, vol. 26, pp. 1171 (2002); and European Journal of Organic Chemistry, vol. 4, pp. 695-709 (2004); and reference documents described in these documents.

(Fluorescent Material)

Examples of the fluorescent material include a coumarin dye, a pyran dye, a cyanine dye, a chloconium dye, a squarylium dye, an oxobenzanthracene dye, a fluorescein dye, a rhodamine dye, a pyrylium dye, a perylene dye, a stilbene dye, a polythiophene dye, a rare earth complex based phosphor and the like.

[Injecting Layer: Hole Injecting Layer 3a and Electron Injecting Layer 3e]

An injecting layer is a layer arranged between an electrode and the light emitting layer 3c in order to decrease driving voltage and improve brightness of the emitted light; the details of the injecting layer are described in "Electrode Material" (pp. 123-166, Part 2, Chapter 2 of "Organic EL Element and Front of Industrialization thereof" Nov. 30, 1998, published by N. T. S Co., Ltd.), and examples of the injecting layer include the hole injecting layer 3a and the electron injecting layer 3e.

The injecting layer can be provided according to necessity. If the injecting layer is the hole injecting layer 3a, the injecting layer may be arranged between the anode and the light emitting layer 3c or the hole transporting layer 3b; and if the injecting layer is the electron injecting layer 3e, the injecting layer may be arranged between the cathode and the light emitting layer 3c or the electron transporting layer 3d.

The details of the hole injecting layer 3a is also described in documents such as Japanese Unexamined Patent Application Publication Nos. 9-45479, 9-260062 and 8-288069; and concrete examples of the hole injecting layer 3a include a layer of a phthalocyanine represented by copper phthalocyanine, a layer of an oxide represented by vanadium oxide, a layer of an amorphous carbon and a layer of a polymer employing conductive polymer such as polyaniline (emeraldine), polythiophene and the like.

The details of the electron injecting layer 3e is also described in documents such as Japanese Unexamined Patent Application Publication Nos. 6-325871, 9-17574 and 10-74586; and concrete examples of the electron injecting layer 3e include a layer of a metal represented by strontium, aluminum or the like; a layer of an alkali metal halide represented by potassium fluoride; a layer of an alkali earth metal compound represented by magnesium fluoride; and a layer of an oxide represented by molybdenum oxide. It is preferred that the electron injecting layer 3e is an extremely thin film; specifically, it is preferred that the film-thickness of the electron injecting layer 3e is within a range from 1 nm to 10 μm depending on the material thereof.

[Hole Transporting Layer 3b]

The hole transporting layer 3b is formed of a hole transporting material having a function of transporting holes; in a broad sense, the hole injecting layer 3a and the electron blocking layer are included in the hole transporting layer 3b. The hole transporting layer 3b may either include only one layer or include a plurality of layers.

The hole transporting material is a material either having a capability of injecting or transporting holes, or having a barrier property against electrons; the hole transporting material may either be an organic material or an inorganic material. Examples of the hole transporting material include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer, a conductive oligomer such as a thiophene oligomer, and the like.

Although the aforesaid compounds can be used as the hole transporting material, it is preferred that a porphyrin compound, an aromatic tertiary amine compound or a styrylamine compound is used as hole transporting material, and wherein it is particularly preferred that an aromatic tertiary amine compound is used as the hole transporting material.

Typical examples of the aromatic tertiary amine compound and the styrylamine compound include: N,N,N',N'-tetraphenyl-4,4'-diaminophenyl; N,N'-diphenyl-N,N'-bis(3-methylphenyl)-[1,1'-biphenyl]-4,4'-diamine (TDP); 2,2-bis(4-di-p-tolylaminophenyl)propane; 1,1-bis(4-di-p- tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; N-phenylcarbazole; those having two condensed aromatic rings in a molecule described in U.S. Pat. No. 5,061,569, such as 4,4'-bis[N-(1-naphthyl)-N-phenylamino]biphenyl (NDP); and 4,4',4"-tris[N-(3-methylphenyl)-N-phenylamino]triphenylamine (MTDATA) in which three triphenylamine units are bonded in a star burst form described in Japanese Patent Application Laid-Open Publication No. 4-308688.

Further, a polymer material in which any of these materials is introduced into a polymer chain or a polymer material in which a polymer main chain is constituted by any of these materials may also be used as the material of the electron transporting layer 3d. Further, inorganic compounds such as a p-type Si and a p-type SiC may also be used as the hole injecting material and the hole transporting material.

Further, it is also possible to use a so-called p-type hole transporting material described Japanese Unexamined Patent Application Publication No. 11-251067 and Applied Physics Letters 80 (2002), pp. 139 by J. Huang et. al. In the present invention, it is preferable to use these materials in order to produce a light-emitting element having high efficiency.

The hole transporting layer 3b can be formed by forming a thin film of the aforesaid hole transporting material using a known method such as a vacuum deposition method, a spin coating method, a casting method, a printing method (which includes an ink-jet method), a LB method or the like. The film-thickness of the hole transporting layer 3b is not particularly limited; however, the film-thickness of the hole transporting layer 3b is typically within a range about from 5 nm to 5 µm, preferably within a range from 5 nm to 200 nm. The hole transporting layer 3b may have a single-layer structure formed of one type of the aforesaid materials, or formed of two or more types of the aforesaid materials.

Further, it is also possible to dope impurities into the material of the hole transporting layer 3b to improve its p-property. Examples of doping impurities into the material of the hole transporting layer 3b include those described in documents such as Japanese Unexamined Patent Application Publication Nos. 4-297076, 2000-196140 and 2001-102175 and J. Appl. Phys., 95, 5773 (2004).

It is preferred to dope impurities into the material of the hole transporting layer 3b, because improved p-property of the hole transporting layer 3b makes it possible to produce an element which consumes less electric power.

[Electron Transporting Layer 3d]

The electron transporting layer 3d is formed of a material having a function to transport electrons; in a broad sense, the electron injecting layer 3e and the hole blocking layer (not shown) are included in the electron transporting layer 3d. The electron transporting layer 3d may have either a single-layer structure or a laminated structure composed of a plurality of layers.

In either an electron transporting layer 3d having a single-layer structure or an electron transporting layer 3d having a laminated structure, an electron transporting material (which also functions as a hole blocking material) constituting a layer-portion adjacent to the light emitting layer 3c may be a material having a function of transferring electrons injected from the cathode to the light emitting layer 3c. Such material can be selected from known compounds. Examples of the known compounds include a nitro-substituted fluorene derivative, a diphenylquinone derivative, a thiopyrandioxide derivative, carbodiimide, a fluorenylidenemethane derivative, anthraquinonedimethane, an anthrone derivative, an oxadiazole derivative and the like. Further, in the aforesaid oxadiazole derivative, a thiadiazole derivative formed by substituting an oxygen atom of an oxadiazole ring with a sulfur atom and a quinoxaline derivative having a quinoxaline ring which is known as an electron withdrawing group may also be used as the material of the electron transporting layer 3d. Further, a polymer material in which any of these materials is introduced into a polymer chain or a polymer material in which a polymer main chain is constituted by any of these materials may also be used as the material of the electron transporting layer 3d.

Further, metal complexes of an 8-quinolinol derivative such as tris(8-quinolinol)aluminum ($Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq) and the like, as well as metal complexes formed by substituting the central metal of the aforesaid metal complexes with In, Mg, Cu, Ca, Sn, Ga or Pb may also be used as the material of the electron transporting layer 3d.

Further, metal-free or metal phthalocyanine and those formed by substituting the terminal of metal-free or metal phthalocyanine with an alkyl group, a sulfonic acid group or the like may be preferably used as the material of the electron transporting layer 3d. Further, the distyrylpyrazine derivative mentioned as an example of the material for the light emitting layer 3c may also be used as the material of the electron transporting layer 3d; and, similar to the cases of the hole injecting layer 3a and the hole transporting layer 3b, inorganic semiconductors such as an n-type Si and an n-type SiC may also be used as the material of the electron transporting layer 3d.

The electron transport layer 3d can be formed by forming the aforesaid material into a thin film by a known method such as a vacuum deposition method, a spin coating method, a casting method, a printing method (which includes an ink-jet method), an LB method or the like. The thickness of the electron transporting layer 3d is not particularly limited; however, the thickness of the electron transporting layer 3d is typically within a range about from 5 nm to 5 µm, preferably within a range from 5 nm to 200 nm. The electron transporting layer 3d may have a single-layer structure formed of one type of the aforesaid materials, or formed of two or more types of the aforesaid materials.

Further, it is also possible to dope impurities into the material of the electron transporting layer 3d to improve its n-property. Examples of doping impurities into the electron transporting layer 3d include those described in documents such as Japanese Unexamined Patent Application Publication Nos. 4-297076, 10-270172, 2000-196140 and 2001-102175 and J. Appl. Phys., 95, 5773 (2004). Further, it is preferred that the electron transporting layer 3d contains kalium, kalium compound and/or the like. For example, potassium fluoride or the like can be used as the kalium compound. If the n-property of the electron transporting layer 3d is improved in the aforesaid manner, it is possible to produce an element which consumes less electric power.

Further, a compound represented by the following General Formula (6) can be preferably used as the material of the electron transporting layer 3d (the electron transporting compound).

$$(Ar1)n1-Y1 \qquad \text{General Formula (6)}$$

In General Formula (6), n1 represents an integer of 1 or greater; Y1 represents a substituent if n1 is equal to 1, or a bond or an n1-valent linking group if n1 is equal to or greater than 2; Ar1 represents a group represented by below-mentioned General Formula (A), and if n1 is equal to or greater than 2, a plurality of pieces of Ar1 may either be the same, or be different from each other. However, the compound represented by General Formula (6) has, in the molecule, at least two condensed aromatic heterocycles each formed by condensing three or more rings.

The substituent represented by Y1 in General Formula (6) is synonymous with the substituent represented by R3 of —C(R3)=represented by each of E51 to E66 and E71 to E88 in General Formula (3) which represents a compound constituting the nitrogen-containing layer 1a of the transparent electrode 1.

Concrete examples of the n1-valent linking group represented by Y1 in General Formula (6) include a divalent linking group, a trivalent linking group, a tetravalent linking group and the like.

Examples of the divalent linking group represented by Y1 in General Formula (6) include: an alkylene group (for example, an ethylene group, a trimethylene group, a tetramethylene group, a propylene group, an ethylethylene group, a pentamethylene group, a hexamethylene group, a 2,2,4-trimethylhexamethylene group, a heptamethylene group, an octamethylene group, nonamethylene group, a decamethylene group, an undecamethylene group, a dodecamethylene group, a cyclohexylene group (for example, a 1,6-cyclohexanediyl group and the like), a cyclopenthylene group (for example, a 1,5-cyclopentanediyl group and the like) and the like); an alkenylene group (for example, a vinylene group, a propenylene group, a butenylene group, a pentenylene group, a 1-methylvinylene group, a 1-methylpropenylene group, a 2-methylpropenylene group, a 1-methylpentenylene group, a 3-methylpentenylene group, a 1-ethylvinylene group, a 1-ethylpropenylene group, a 1-ethylbutenylene group, a 3-ethylbutenylene group and the like); an alkynylene group (for example, an ethynylene group, a 1-propynylene group, a 1-butynylene group, a 1-pentynylene group, a 1-hexynylene group, a 2-butynylene group, a 2-pentynylene group, a 1-methylethynylene group, a 3-methyl-1-propynylene group, a 3-methyl-1-butynylene group and the like); an arylene group (for example, an o-phenylene group, a p-phenylene group, a naphthalenediyl group, an anthracenediyl group, a naphthacenediyl group, a pyrenediyl group, a naphthylnaphthalenediyl group, a biphenyldiyl group (for example, a [1,1'-biphenyl]-4,4'-diyl group, a 3,3'-biphenyldiyl group and, 3,6-biphenyldiyl group and the like), a terphenyldiyl group, a quaterphenyldiyl group, a quinquephenyldiyl group, a sexiphenyldiyl group, a septiphenyldiyl group, an octiphenyldiyl group, a nobiphenyldiyl group, a deciphenyldiyl group and the like); a heteroarylene group (for example, a divalent group derived from a group consisting of a carbazole group, a carboline ring, a diazacarbazole ring (also referred to as a monoazacarboline group, indicating a ring formed by substituting one of carbon atoms constituting a carboline ring with a nitrogen atom), a triazole ring, a pyrrole ring, a pyridine ring, a pyrazine ring, a quinoxaline ring, a thiophene ring, an oxadiazole ring, a dibenzofuran ring, a dibenzothiophene ring, an indole ring and the like), a chalcogen atom such as oxygen, sulfur or the like, a group derived from a condensed aromatic heterocycle formed by condensing three or more, and the like (herein, it is preferred that the condensed aromatic heterocycle formed by condensing three or more rings is a condensed aromatic heterocycle which contains a hetero atom selected from N, O and S as an element constituting a condensed ring; concrete examples of such condensed aromatic heterocycle include an acridine ring, a benzoquinoline ring, a carbazole ring, a phenazine ring, a phenanthridine ring, a phenanthroline ring, a carboline ring, a cycladine ring, a quindoline ring, a thebenidine ring, a quinindoline ring, a triphenodithiazine ring, a triphenodioxazine ring, a phenanthrazine ring, an anthrazine ring, a perimizine ring, a diazacarbazole ring (indicating a ring formed by substituting one of carbon atoms constituting a carboline ring with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiin ring, a thiophanthrene ring (naphthothiophene ring) and the like).

Examples of the trivalent linking group represented by Y1 in General Formula (6) include an ethanetriyl group, a propanetriyl group, a butanetriyl group, a pentanetriyl group, a hexanetriyl group, a heptanetriyl group, an octanetriyl group, a nonanetriyl group, a decanetriyl group, an undecanetriyl group, a dodecanetriyl group, a cyclohexanetriyl group, a cyclopentanetriyl group, a benzenetriyl group, a naphthalenetriyl group, a pyridinetriyl group, a carbazoletriyl group and the like.

The tetravalent linking group represented by Y1 in General Formula (6) is a group having a linking group added to any one of the above-mentioned trivalent linking groups. Examples of the tetravalent linking group include a propandiylidene group, a 1,3-propandiyl-2-ylidene group, a butanediylidene group, a pentanediylidene group, a hexanediylidene group, a heptanediylidene group, an octanediylidene group, a nonanediylidene group, a decanediylidene group, an undecanediylidene group, a dodecanediylidene group, a cyclohexanediylidene group, a cyclopentanediylidene group, a benzenetetrayl group, a naphthalenetetrayl group, a pyridinetetrayl group, a carbazoletetrayl group and the like.

Incidentally, the aforesaid divalent, trivalent and tetravalent linking groups may each have a substituent represented by R3 of —C(R3)=represented by each of E51 to E66 and E71 to E88 in General Formula (1).

In the compound represented by General Formula (6), it is preferred that Y1 represent a group derived from a condensed aromatic heterocycle formed by condensing three or more rings, and it is preferred that the condensed aromatic heterocycle formed by condensing three or more rings is a dibenzofuran ring or a dibenzothiophene ring. Further, it is preferred that n1 is 2 or more.

Further, the compound represented by General Formula (6) has, in the molecule, at least two condensed aromatic heterocycles each formed by condensing three or more rings.

When Y1 represents an n1-valent linking group, Y1 is preferably non-conjugated in order to keep the triplet excitation energy of the compound represented by General Formula (6) high, and is preferably constituted of aromatic rings (an aromatic hydrocarbon ring+an aromatic heterocycle) in order to improve Tg (also referred to as glass transition point or glass transition temperature).

Here, the "non-conjugated" indicates that a linking group cannot be expressed with alternation of single and double bonds, or that a conjugation of aromatic rings which constitute a linking group is sterically broken.

[Group Represented by General Formula (A)]

Ar1 in General Formula (6) is a group represented by the following General Formula (A).

[Chemical Formula 62]

General Formula (A)

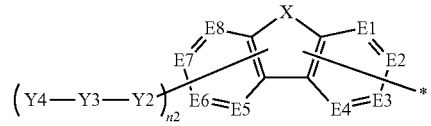

In General Formula (A), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; * represents a linking site with Y1; Y2 merely represents a bond or a divalent linking group; Y3 and Y4 each represent a group derived from a 5-membered or 6-membered aromatic ring, wherein at least one of Y3 and Y4 represents a group derived from an aromatic heterocycle containing a nitrogen atom as a ring constituent atom; and n2 represents an integer of 1 to 4.

Here, the substituents represented by R, R' or R1 both in —N(R)— or —Si(R)(R')— represented by X and in —C(R1)=represented by each of E1 to E8 in General Formula (A) are each synonymous with the substituent represented by R3 of —C(R3)=represented by each of E51 to E66 and E71 to E88 in General Formula (1).

Further, the divalent linking group represented by Y2 in General Formula (A) is synonymous with the divalent linking group represented by Y1 in General Formula (6).

Examples of the 5-membered or 6-membered aromatic ring used to form a group derived from a 5-membered or 6-membered aromatic ring represented by each of Y3 and Y4 in General Formula (A) include a benzene ring, an oxazole ring, a thiophene ring, a furan ring, a pyrrole ring, a pyridine ring, a pyridazine ring, a pyrimidine ring, a pyrazine ring, a diazine ring, a triazine ring, an imidazole ring, an isoxazole ring, a pyrazole ring, a triazole ring and the like.

At least one of the groups derived from 5-membered or 6-membered aromatic rings respectively represented by Y3 and Y4 is a group derived from an aromatic heterocycle containing a nitrogen atom as a ring constituent atom. Examples of the aromatic heterocycle containing a nitrogen atom as a ring constituent atom include an oxazole ring, a pyrrole ring, a pyridine ring, a pyridazine ring, a pyrimidine ring, a pyrazine ring, the diazine ring, a triazine ring, an imidazole ring, an isoxazole ring, a pyrazole ring, a triazole ring and the like.

(Preferred Group Represented by Y3)

In General Formula (A), the group represented by Y3 is preferably a group derived from the aforesaid 6-membered aromatic ring, and further preferably a group derived from a benzene ring.

(Preferred Group Represented by Y4)

In General Formula (A), the group represented by Y4 is preferably a group derived from the aforesaid 6-membered aromatic ring, and further preferably a group derived from the aromatic heterocycle containing a nitrogen atom as a ring constituent atom, and particularly preferably a group derived from a pyridine ring.

(Preferred Group Represented by General Formula (A))

Examples of preferred group represented by General Formula (A) include a group represented by one of the following General Formulas (A-1), (A-2), (A-3) and (A-4).

[Chemical Formula 63]

General Formula (A-1)

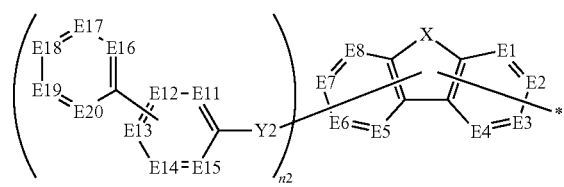

In General Formula (A-1), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E11 to E20 each represent —C(R2)= or —N=, wherein at least one of E11 to E20 represents —N=, and wherein R2 represents a hydrogen atom, a substituent or a linking site; wherein at least one of E11 and E12 represents —C(R2)=, where R2 represents a linking site; n2 represents an integer of 1 to 4; and * represents a linking site with Y1 in General Formula (6).

[Chemical Formula 64]

General Formula (A-2)

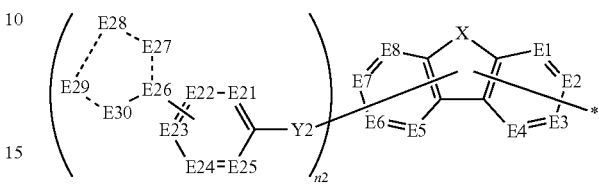

In General Formula (A-2), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E21 to E25 each represent —C(R2)= or —N=, and E26 to E30 each represent —C(R2)=, —N=, —O—, —S— or —Si(R3)(R4)-, wherein at least one of E21 to E30 represents —N=, and wherein R2 represents a hydrogen atom, a substituent or a linking site, and R3 and R4 each represent a hydrogen atom or a substituent; wherein at least one of E21 and E22 represents —C(R2)=, where R2 represents a linking site; n2 represents an integer of 1 to 4; and * represents a linking site with Y1 in General Formula (6).

[Chemical Formula 65]

General Formula (A-3)

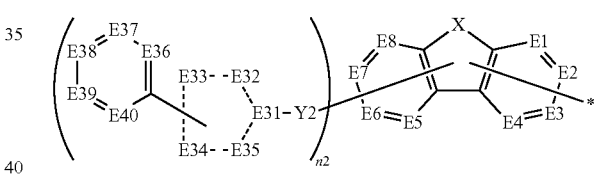

In General Formula (A-3), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E31 to E35 each represent —C(R2)=, —N=, —O—, —S— or —Si(R3) (R4)-, and E36 to E40 each represent —C(R2)= or —N=, wherein at least one of E31 to E40 represents —N=, and wherein R2 represents a hydrogen atom, a substituent or a linking site, and R3 and R4 each represent a hydrogen atom or a substituent; wherein at least one of E32 and E33 represents —C(R2)=, where R2 represents a linking site; n2 represents an integer of 1 to 4; and * represents a linking site with Y1 in General Formula (6).

[Chemical Formula 65]

General Formula (A-4)

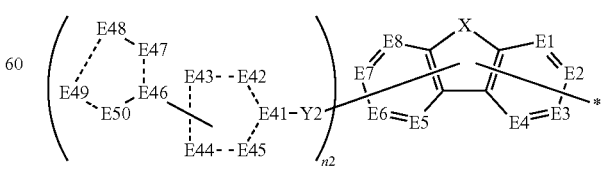

In General Formula (A-4), X represents —N(R)—, —O—, —S— or —Si(R)(R')—, and E1 to E8 each represent —C(R1)= or —N=, wherein R, R' and R1 each represent a hydrogen atom, a substituent or a linking site with Y1; Y2 merely represents a bond or a divalent linking group; E41 to E50 each represent —C(R2)=, —N=, —O—, —S— or —Si(R3)(R4)-, wherein at least one of E41 to E50 represents —N=, and wherein R2 represents a hydrogen atom, a substituent or a linking site, and R3 and R4 each represent a hydrogen atom or a substituent; wherein at least one of E42 and E43 represents —C(R2)=, where R2 represents a linking site; n2 represents an integer of 1 to 4; and * represents a linking site with Y1 in General Formula (6).

The group represented by any one of General Formulas (A-1) to (A-4) is described below.

The substituents represented by R, R' or R1 both in —N(R)— or —Si(R)(R')— represented by X and in —C(R1)= represented by each of E1 to E8 of the group represented by any one of General Formulas (A-1) to (A-4) are each synonymous with the substituent represented by R3 of —C(R3)= represented by each of E51 to E66 and E71 to E88 in General Formula (1).

The divalent linking group represented by Y2 of the group represented by any one of General Formulas (A-1) to (A-4) is synonymous with the divalent linking group represented by Y1 in General Formula (6).

The substituent represented by R2 of —C(R2)=represented by each of E11 to E20 in General Formula (A-1), each of E21 to E30 in General Formula (A-2), each of E31 to E40 in General Formula (A-3) or each of E41 to E50 in General Formula (A-4) is synonymous with the substituent represented by R3 of —C(R3)=represented by each of E51 to E66 and E71 to E88 in General Formula (1).

Further preferred compound represented by General Formula (6) will be described below.

[Compound Represented by General Formula (7)]

In the present invention, among the compounds represented by General Formula (6), a compound represented by General Formula (7) is preferable. General Formula (7) includes General Formula (1) shown as the compound constituting the nitrogen-containing layer 1a of the transparent electrode 1. The compound represented by General Formula (7) will be described below.

[Chemical Formula 67]

General Formula (7)

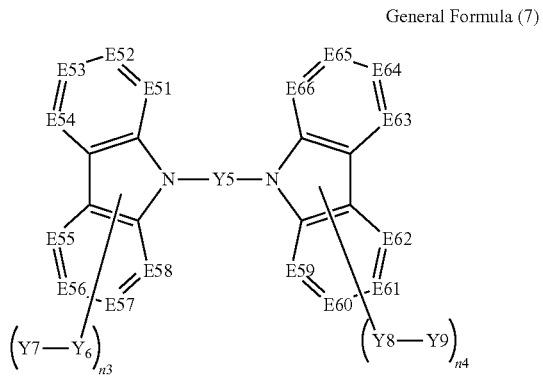

In General Formula (7), Y5 represents a divalent linking group which is an arylene group, a heteroarylene group or a combination of the arylene group and the heteroarylene group; E51 to E66 each represent —C(R3)= or —N=, wherein R3 represents a hydrogen atom or a substituent; Y6 to Y9 each represent a group derived from an aromatic hydrocarbon ring or a group derived from an aromatic heterocycle, wherein at least one of Y6 and Y7 and at least one of Y8 and Y9 each represent a group derived from an aromatic heterocycle containing a nitrogen atom; and n3 and n4 each represent an integer of 0 to 4, wherein the sum of n3 and n4 is 2 or more.

Y5 in General Formula (7) is synonymous with Y5 in General Formula (1).

E51 to E66 in General Formula (7) is synonymous with E51 to E66 in General Formula (1).

In General Formula (7), it is preferable that as groups represented by E51 to E66, six or more of E51 to E58 and six or more of E59 to E66 are each represented by —C(R3)=.

Examples of aromatic hydrocarbon ring used to form the group derived from an aromatic hydrocarbon ring represented by each of Y6 to Y9 in General Formula (7) include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, an m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthranthrene ring and the like.

Further, the aforesaid aromatic hydrocarbon ring may have a substituent represented by R3 of —C(R3)=represented by each of E51 to E66 in General Formula (1).

Examples of aromatic heterocycle used to form the group derived from an aromatic heterocycle represented by each of Y6 to Y9 in General Formula (7) include a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring naphthylidine ring, a carbazole ring, a carboline ring, a diazacarbazole ring (which is a ring formed by further substituting one of carbon atoms constituting a carboline ring with a nitrogen atom) and the like.

Further, the aforesaid aromatic hydrocarbon ring may have a substituent represented by R3 of —C(R3)=represented by each of E51 to E66 in General Formula (1).

Examples of aromatic heterocycle containing an N atom used to form a group derived from an aromatic heterocycle containing an N atom represented by each of at least one of Y6 and Y7 and at least one of Y8 and Y9 in General Formula (7) include an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthalazine ring, a naphthylidine ring, a carbazole ring, a carboline ring, a diazacarbazole ring (which is a ring formed by further substituting one of carbon atoms constituting a carboline ring with a nitrogen atom) and the like.

In General Formula (7), it is preferred that the groups represented by Y7 and Y9 are each a group derived from a pyridine ring.

In General Formula (7), it is preferred that the groups represented by Y6 and Y8 are each a group derived from a benzene ring.

The compound represented by General Formula (1), as the compound constituting the nitrogen-containing layer 1a of the transparent electrode 1, is exemplified as a further preferable example of the compound represented by General Formula (7).

The compounds (1 to 134) exemplified above are shown as concrete examples of the compound represented by General Formula (6), (7), or General Formula (1).

[Blocking Layer: Hole Blocking Layer and Electron Blocking Layer]

As described above, a blocking layer is a layer provided according to necessity in addition to the basic constituent layers of the thin-film of the organic compound. Examples of the blocking layer include a hole blocking layer described in documents such as Japanese Unexamined Patent Application Publication Nos. 11-204258 and 11-204359 and pp. 273 of "Organic EL Element and Front of Industrialization thereof" (Nov. 30, 1998, published by N. T. S Co., Ltd.)".

The hole blocking layer has, in a broad sense, the function of the electron transporting layer $3d$. The hole blocking layer is formed of a hole blocking material having a function of transporting electrons with very little capability of transporting holes; the hole blocking layer transports electrons while blocking holes, so that probability of recombination of electrons and holes can be increased. Further, the configuration of the electron transporting layer $3d$ (which is to be described later) can be used as the hole blocking layer according to necessity. It is preferred that the hole blocking layer is formed adjacent to the light emitting layer $3c$.

On the other hand, the electron blocking layer has, in a broad sense, the function of the hole transporting layer $3b$. The electron blocking layer is made of a material having a function of transporting holes with very little capability of transporting electrons; the electron blocking layer transports holes while blocking electrons, so that probability of recombination of electrons and holes can be increased. Further, the configuration of the hole transporting layer $3b$ (which is to be described later) can be used as the electron blocking layer according to necessity. The film-thickness of the hole blocking layer of the present invention is preferably within a range from 3 to 100 nm, and further preferably within a range from 5 to 30 nm.

[Auxiliary Electrode 15]

The auxiliary electrode 15 is provided for reducing resistance of the transparent electrode 1, and is arranged in contact with the electrode layer $1b$ of the transparent electrode 1. It is preferred that the auxiliary electrode 15 is formed of a metal having low resistance, such as aurum, platinum, silver, copper, aluminum or the like. Since each of these metals has low light transmissibility, the auxiliary electrode 15 is formed into a pattern in a range where the emitted light h is not prevented from being extracted from a light extracting face $17a$. Examples of the method for forming such an auxiliary electrode include a deposition method, a sputtering method, a printing method, an ink-jet method, an aerosol jet method and the like. In view of aperture ratio of light extraction, it is preferred that the line width of the auxiliary electrode 15 is 50 μm or less; while in view of electrical conductivity, it is preferred that the film-thickness of the auxiliary electrode 15 is 1μ or more.

[Transparent Sealing Material 17]

The transparent sealing material 17 is provided to cover the organic electroluminescence element EL-1; the transparent sealing material 17 may either be a plate-like (film-like) sealing member to be fixed to the side of the substrate 13 by the adhesive 19, or be a sealing film. The surface of the transparent sealing material 17 is the light extracting face $17a$ from which the emitted light h of the organic electroluminescence element EL-1 is extracted. The transparent sealing material 17 is arranged in a manner to at least cover the light-emitting functional layer 3 in a state where the end portions of both the transparent electrode 1 and the opposite electrode 5-1 of the organic electroluminescence element EL-1 are exposed to the outside. The present invention also includes a configuration in which the transparent sealing material 17 is provided with electrodes, and end portions of the transparent electrode 1 and the opposite electrode 5-1 of an organic electroluminescence element EL-1 are brought into conduction with the electrodes.

Concrete examples of the plate-like (film-like) transparent sealing material 17 include a glass substrate, a polymer substrate and the like; and each of these substrate materials may also be formed into a further thinner film. Examples of the glass substrate include a soda-lime glass substrate, a barium/strontium-containing glass substrate, a lead glass substrate, an aluminosilicate glass substrate, a borosilicate glass substrate, a barium borosilicate glass substrate, a quartz substrate, and the like. Examples of the polymer substrate include a polycarbonate substrate, an acryl resin substrate, a polyethylene terephthalate substrate, a polyether sulfide substrate, a polysulfone substrate and the like.

Among these materials, a thin-film-like polymer substrate can be preferably used as the transparent sealing material 17 in order to reduce the thickness of the element.

Further, it is preferred that the film-like polymer substrate has an oxygen permeability of $1 \times 10^{-3}$ ml/($m^2 \cdot 24$ h·atm) or less measured by a method in conformity with JIS K 7126-1987 and a water vapor permeability of $1 \times 10^{-3}$ g/($m^2 \cdot 24$ h) or less (at temperature of 25±0.5° C. and relative humidity of (90±2)% RH) measured by a method in conformity with JIS K 7129-1992.

Further, the aforesaid substrate material may also be formed into a concave plate so as to be used as the transparent sealing material 17. In such a case, the aforesaid substrate member is subjected to a sand blasting process, a chemical etching process and/or the like, and formed into a concave shape.

The adhesive 19 for fixing the plate-like transparent sealing material 17 to the side of the substrate 13 is used as a sealing agent for sealing the organic electroluminescence element EL-1 sandwiched between the transparent sealing material 17 and the substrate 13. Concrete examples of the adhesive 19 include a photo-curable or thermo-curable adhesive agent containing a reactive vinyl group such as an acrylic acid oligomer or a methacrylic acid oligomer, and a moisture curable adhesive agent such as 2-cyanoacrylate.

Concrete examples of the adhesive 19 also include an epoxy based thermally and chemically (two liquid type) curable adhesive agents; a hot-melt type polyamide, polyester or polyolefin adhesive agents; and a cationic curable type UV-curable epoxy adhesive.

Incidentally, since there is a possibility that the organic material constituting the organic electroluminescence element EL-1 might be degraded by heat treatment, it is preferred that the adhesive 19 is an adhesive possible to be cured in a temperature from room temperature to 80° C. Further, a drying agent may be dispersed in the adhesive 19.

The adhesive 19 may be coated onto the adhesion portion between the transparent sealing material 17 and the substrate 13 either by a commercially available dispenser, or by printing such as screen printing.

In the case where a gap is formed between the transparent sealing material 17, the substrate 13 and the adhesive 19, it is preferred that an inert gas (such as nitrogen, argon or the like) or an inert liquid (such as fluorinated hydrocarbon, silicone oil or the like) is injected, in the form of gas or liquid phase, into the gap. Alternatively, the gap may also be in a vacuum state, or may have a hygroscopic compound enclosed therein.

Examples of the hygroscopic compound include a metal oxide (such as sodium oxide, potassium oxide, calcium oxide, barium oxide, magnesium oxide and aluminum oxide), a sulfate (such as sodium sulfate, calcium sulfate, magnesium sulfate and cobalt sulfate), a metal halide (such as calcium chloride, magnesium chloride, cesium fluoride, tantalum fluoride, cerium bromide, magnesium bromide, barium iodide and magnesium iodide), a perchloric acid (such as barium perchlorate and magnesium perchlorate) and the like; wherein if the sulfate, the metal halide or the perchlorate is used, anhydrides thereof will be preferable.

On the other hand, in the case where a sealing film is used as the transparent sealing material 17, the sealing film is formed on the substrate 13 in a state where the light-emitting functional layer 3 of the organic electroluminescence element EL-1 is completely covered, and the end portions of the transparent electrode 1 and the opposite electrode 5-1 of the organic electroluminescence element EL-1 are exposed to the outside.

Such a sealing film is formed of an inorganic material or an organic material. Particularly, such a sealing film is formed of a material capable of inhibiting penetration of substances, such as moisture, oxygen and the like, which cause the light-emitting functional layer 3 of the organic electroluminescence element EL-1 to degrade. Examples of such material include silicon oxide, silicon dioxide, silicon nitride and the like. Further, in order to reduce the fragility of the sealing film, the sealing film may have a laminated structure composed of the film(s) formed of one of the aforesaid inorganic materials and the film(s) formed of an organic material.

There is no particular limitation on the method of forming the aforesaid films. For example, the aforesaid films may be formed by a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method or the like.

[Protective Film, Protective Plate]

Incidentally, although not shown in the drawings, a protective film or protective plate may be provided so that the organic electroluminescence element EL and the transparent sealing material 17 are sandwiched between the substrate 13 and the protective film or protective plate. The protective film or protective plate is provided for mechanically protecting the organic electroluminescence element EL; it is preferred that such protective film or protective plate is provided particularly in the case where the transparent sealing material 17 is a sealing film, because in such a case mechanical protection to the organic electroluminescence element EL is not sufficient.

A glass plate, a polymer plate, a polymer film (which is thinner than the polymer plate), a metal plate, a metal film (which is thinner than the metal plate), a polymer material film or a metal material film may be used as the aforesaid protective film or protective plate. Among these options, the polymer film is preferably used in order to reduce the weight and thickness.

[Method for Producing Organic Electroluminescence Element]

As one example, a method for producing the organic electroluminescence element EL-1 shown in FIG. 3 will be described below.

First, the opposite electrode 5-1 (which is the anode) is formed on the substrate 13 by a suitable film-forming method such as a deposition method, a sputtering method or the like.

Next, the hole injecting layer 3a, the hole transporting layer 3b, the light emitting layer 3c, the electron transporting layer 3d and the electron injecting layer 3e are formed, in this order, on the opposite electrode 5-1 to thereby form the light-emitting functional layer 3. Examples of the method for forming each of these layers include a spin coating method, a casting method, an ink-jet method, a deposition method, a printing method and the like; however, a vacuum deposition method or a spin coating method is particularly preferable because by such method, it is easy to form a uniform film and unlikely to cause pinholes. Further, these layers may each be formed by a different film-forming method. When the deposition method is used to form each of these layers, the deposition conditions vary depending on the type of the compound used; generally, it is preferred that the boat heating temperature is selected in a range from 50° C. to 450° C., the vacuum degree is selected in a range from $10^{-6}$ Pa to $10^{-2}$ Pa, the deposition rate is selected in a range from 0.01 nm/sec to 50 nm/sec, the substrate temperature is selected in a range from −50° C. to 300° C., and the film-thickness is selected in a range from 0.1 μm to 5 μm.

Then, the nitrogen-containing layer 1a composed of a compound containing nitrogen atom is formed on the light-emitting functional layer 3 so that the film-thickness of the nitrogen-containing layer 1a is 1 μm or less, preferably between 10 nm and 100 nm. Thereafter, the electrode layer 1b composed of silver (or an alloy containing silver as a main component) is formed so that the film-thickness of the electrode layer 1b is in a range of 4 nm to 12 nm, and thereby the transparent electrode 1 on the side of the cathode is formed. Examples of the method for forming the nitrogen-containing layer 1a and the electrode layer 1b include a spin coating method, a casting method, an ink-jet method, a deposition method, a printing method and the like; however, a vacuum deposition method is particularly preferable, because by such method, it is easy to form a uniform film and unlikely to cause pinholes.

Particularly, when forming the electrode layer 1b, the electrode layer 1b is formed into a pattern such that the electrode layer 1b is insulated from the opposite electrode 5-1 by the light-emitting functional layer 3, and the end portion of the electrode layer 1b is drawn out to the edge of the substrate 13 from the top of the light-emitting functional layer 3. Further, before and after the formation of the electrode layer 1b, the auxiliary electrode 15 is formed into a pattern if necessary. By performing the above processes, the organic electroluminescence element EL-1 is obtained. Thereafter, the transparent sealing material 17 is arranged to cover at least the light-emitting functional layer 3 in a state where the end portion of the electrode layer 1b of the transparent electrode 1 and the end portion of the opposite electrode 5-1 of the organic electroluminescence element EL are exposed to the outside. At this time, the adhesive 19 is used to bond the transparent sealing material 17 to the side of the transparent substrate 13, so that the organic electroluminescence element EL-1 is sealed between the transparent sealing material 17 and the substrate 13.

By performing the above process, a desired organic electroluminescence element EL-1 is obtained on the substrate 13. It is preferred that, when producing the organic electroluminescence element EL-1, the layers from the light-emitting functional layer 3 to the opposite electrode 5-1 are continuously formed with one vacuuming operation; however, it is also possible to take out the substrate from the vacuum atmosphere during production to perform different film-forming method. In such a case, necessary considerations (such as performing the production process in dry inert gas atmosphere) should be taken into account.

In the case where a DC voltage is applied to the organic electroluminescence element EL-1 obtained in the aforesaid manner, light emission can be observed if a voltage of about 2 V to 40 V is applied, wherein the electrode "+" is connected to the opposite electrode 5-1 (which is the anode) and the electrode "−" is connected to the electrode layer 1b (which is the cathode). Also, an AC voltage may be applied to the organic electroluminescence element EL-1, wherein the AC voltage may have any waveform.

<Advantage of Organic Electroluminescence Element EL-1>

The organic electroluminescence element EL-1 described above has a configuration in which the electrode layer 1b of the transparent electrode 1 of the present invention, which has both the electrical conductivity and the light transmissibility, is used as the cathode, and the light-emitting functional layer 3 and the opposite electrode 5-1 (which is the anode) are formed, in this order, on the side of the nitrogen-containing layer 1a of the transparent electrode 1. Thus, it is possible to increase brightness by applying sufficient voltage between the electrode layer 1b and the opposite electrode 5-1 to achieve high-brightness emission of the organic electroluminescence element EL-1 while increasing the extraction efficiency of the emitted light h from the side of the transparent electrode 1. Further, it is also possible to increase the light-emitting lifetime by reducing the driving voltage for obtaining a given brightness.

<<4. Second Example of Organic Electroluminescence Element (Bottom Emission Type)>>

<Configuration of Organic Electroluminescence Element>

Figure 4:
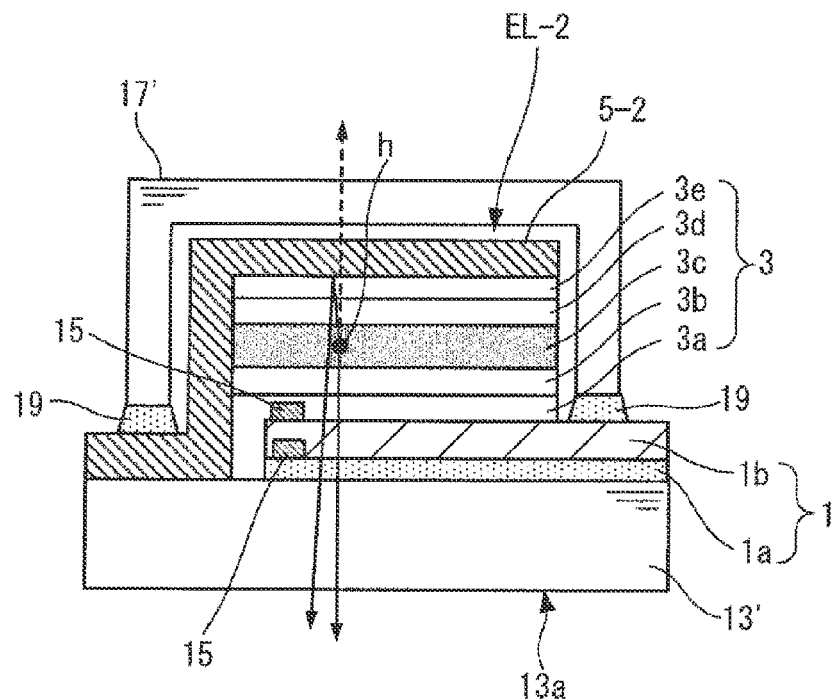
FIG. 4 is a cross-sectional view showing a configuration of a second example of the organic electroluminescence element that uses the transparent electrode according to the present invention.

As an example of the electronic device of the present invention, FIG. 4 shows a cross-sectional configuration of a second example of the organic electroluminescence element using the aforesaid transparent electrode. An organic electroluminescence element EL-2 of the second example shown in FIG. 4 differs from the organic electroluminescence element EL-1 of the first example described with reference to FIG. 3 in that a transparent electrode 1 is arranged on a transparent substrate 13', and a light-emitting functional layer 3 and an opposite electrode 5-2 are laminated, in this order, on the top of the transparent electrode 1. In the following paragraphs, components identical to those of the first example will not be described repeatedly, and description will be focused on characteristic configurations of the organic electroluminescence element EL-2 of the second example.

The organic electroluminescence element EL-2 shown in FIG. 4 is arranged on the transparent substrate 13', and is obtained by laminating the transparent electrode 1 having the electrode layer 1b (which is the anode), the light-emitting functional layer 3, and the opposite electrode 5-2 (which is the cathode), in this order, from the side of the transparent substrate 13'. It is characterized that, among these layers, the aforesaid transparent electrode 1 of the present invention is used as the transparent electrode 1 of the organic electroluminescence element EL-2. Thus, the organic electroluminescence element EL-2 is configured as a bottom emission type organic electroluminescence element in which the emitted light h is extracted at least from the side of the transparent substrate 13'.

Similar to the first example, the entire layer-structure of the organic electroluminescence element EL-2 is not particularly limited, but may be a generic layer-structure. As one example of the second example, a configuration shown here is obtained by laminating a hole injecting layer 3a/a hole transporting layer 3b/a light emitting layer 3c/an electron transporting layer 3d/an electron injecting layer 3e, in this order, on the top of the electrode layer 1b of the transparent electrode 1 which functions as the anode, and further laminating the opposite electrode 5-2 (as the cathode) on the top of the electron injecting layer 3e. However, among these layers, the light emitting layer 3c composed of at least an organic material is indispensable. Further, the electron transporting layer 3d may be provided as an electron transporting layer 3d having electron injection performance, so that the electron transporting layer 3d also serves as the electron injecting layer 3e.

Note that, similar to the first example, in addition to these layers, the light-emitting functional layer 3 may also be provided with a hole blocking layer (not shown) and/or an electron blocking layer (not shown) according to necessity. In such a configuration, similar to the first example, only the portion where the light-emitting functional layer 3 is sandwiched by the transparent electrode 1 and the opposite electrode 5-2 is a light-emitting region of the organic electroluminescence element EL-2.

In the organic electroluminescence element EL-2 according to the present embodiment, the light-emitting functional layer 3 is directly formed on the electrode layer 1b (which substantially functions as the anode) of the transparent electrode 1. Thus, the nitrogen-containing layer 1a of the electrode layer 1b may be formed by using a material that satisfies the aforesaid Formula (1) or Formula (2), without the need to be formed by using a material having electron transport performance and/or electron injection performance. Further, if the transparent electrode 1 is provided with the electrode layer 1b having the aforesaid configuration, the transparent electrode 1 may be configured by the electrode layer 1b only without the nitrogen-containing layer 1a.

Further, similar to the first example, in the aforesaid layer-structure, in order to reduce the resistance of the transparent electrode 1, the auxiliary electrode 15 may be provided in contact with the electrode layer 1b of the transparent electrode 1.

Further, the opposite electrode 5-2 (as the cathode) formed on the top of the light-emitting functional layer 3 is composed of a metal, an alloy, an organic or inorganic conductive compound, or a mixture of these materials. To be specific, the opposite electrode 5-2 is composed of a metal (such as gold (Au) and the like), copper iodide (CuI), an oxide semiconductor (such as ITO, ZnO, TiO2, SnO2 and the like) or the like.

The opposite electrode 5-2 described above can be produced by forming a thin-film with the aforesaid conductive material by a deposition method, a sputtering method or the like. The sheet resistance of the opposite electrode 5-2 is preferably several hundred Ω/sq. or less; and the film-thickness of the opposite electrode 5-1 is generally within a range from 5 nm to 5 μm, preferably within a range from 5 nm to 200 nm.

Further, a sealing material 17' for sealing the bottom emission type organic electroluminescence element EL-2 does not have to have light transmissibility. In addition to the same material as the transparent sealing material used in the first example, metal material may also be used as the material of such a sealing material 17'. Examples of the metal material include one or more kinds of metals selected from the group consisting of stainless steel, iron, copper, aluminum, magnesium, nickel, zinc, chromium, titanium, molybdenum, silicon, germanium, tantalum, and alloys thereof. By using thin film of the aforesaid metal material as the sealing material 17', the thickness of the whole light-emitting panel on which the organic electroluminescence element is arranged can be reduced.

Incidentally, in the case where the organic electroluminescence element EL-2 is to be configured so that the emitted light h is also extracted from the side of the opposite electrode 5-2, the opposite electrode 5-2 may be formed by a conductive material with good light transmissibility selected from the aforesaid conductive materials. Further, in such a case, a transparent sealing material having light transmissibility is used as the sealing material 17'.

<Advantage of Organic Electroluminescence Element EL-2>

The organic electroluminescence element EL-2 described above has a configuration in which the electrode layer 1b of the transparent electrode 1, which has both the electrical conductivity and the light transmissibility, of the present invention is used as the anode, and the light-emitting functional layer 3 and the opposite electrode 5-2 (which is the cathode) are formed on the top of the electrode layer 1b. Thus, similar to the first example, it is possible to increase the brightness by applying sufficient voltage between the transparent electrode 1 and the opposite electrode 5-2 to achieve high-brightness emission of the organic electroluminescence element EL-2 while increasing the extraction efficiency of the emitted light h from the side of the transparent electrode 1. Further, it is also possible to increase the light-emitting lifetime by reducing the driving voltage for obtaining a given brightness.

<<5. Third Example of Organic Electroluminescence Element (Dual Emission Type)>>

<Configuration of Organic Electroluminescence Element>

Figure 5:
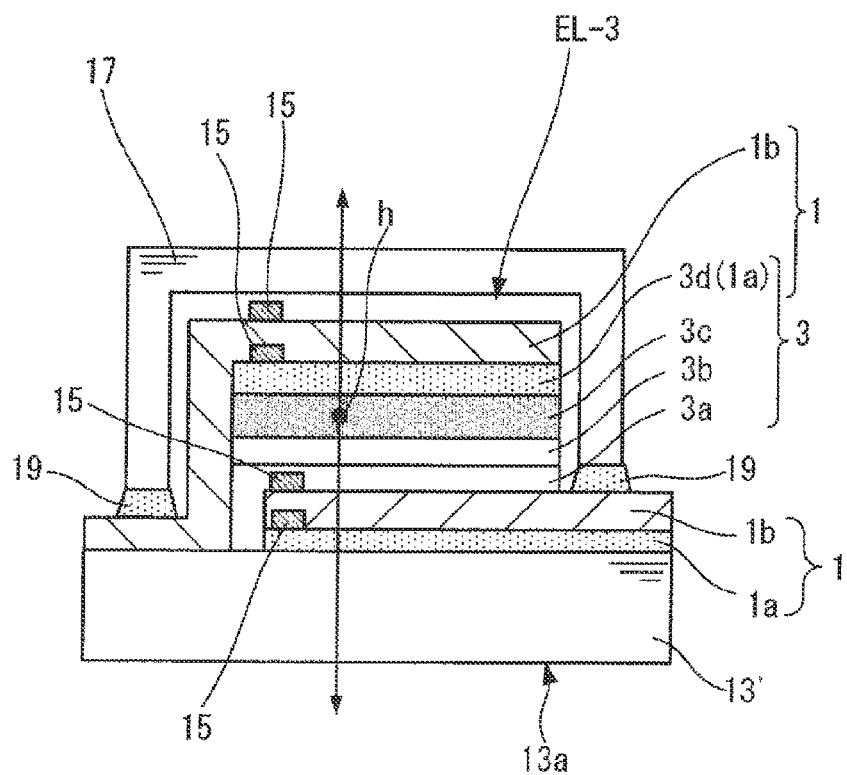
FIG. 5 is a cross-sectional view showing a configuration of a third example of the organic electroluminescence element that uses the transparent electrode according to the present invention.

As one example of the electronic device of the present invention, FIG. 5 shows a cross-sectional configuration of a third example of the organic electroluminescence element using the aforesaid transparent electrode. An organic electroluminescence element EL-3 of the third example shown in FIG. 5 differs from the organic electroluminescence element EL-1 of the first example described with reference to FIG. 3 in that another transparent electrode 1 is arranged on the side of the transparent substrate 13', and the light-emitting functional layer 3 is sandwiched between the two transparent electrodes 1. In the following paragraphs, components identical to those of the first example will not be described repeatedly, and description will be focused on characteristic configurations of the organic electroluminescence element EL-3 of the third example.

An organic electroluminescence element EL-3 shown in FIG. 5 is arranged on a transparent substrate 13', and is obtained by laminating a transparent electrode 1 having an electrode layer 1b and functioning as the anode, a light-emitting functional layer 3, and a transparent electrode 1 having an electrode layer 1b and functioning as the cathode, in this order, from the side of the transparent substrate 13'. It is characterized that, among these layers, the aforesaid transparent electrode 1 of the present invention is used as each of the two transparent electrodes 1 of the organic electroluminescence element EL-3. Thus, the organic electroluminescence element EL-3 is configured as a dual emission type organic electroluminescence element in which the emitted light h is extracted from both the side of the transparent substrate 13' and the side of the transparent sealing material 17, which is opposite to the side of the transparent substrate 13'.

Similar to the first example, the entire layer-structure of the organic electroluminescence element EL-3 is not particularly limited, but may be a generic layer-structure. As one example of the third example, a configuration shown here is obtained by laminating the hole injecting layer 3a/the hole transporting layer 3b/the light emitting layer 3c/the electron transporting layer 3d, in this order, on the top of the transparent electrode 1 functioning as the anode, and further laminating the transparent electrode 1 functioning as the cathode on the top of the electron transporting layer 3d. In the example shown in FIG. 5, the electron transporting layer 3d not only functions as an electron injecting layer, but also functions as the nitrogen-containing layer 1a of the transparent electrode 1.

Note that, similar to the first example, various configurations according to necessity may be adopted as the light-emitting functional layer 3; the light-emitting functional layer 3 may also be provided with a hole blocking layer (not shown) and/or an electron blocking layer (not shown). In the aforesaid configuration, similar to the first example, only the portion where the light-emitting functional layer 3 is sandwiched by the two transparent electrodes 1 is a light-emitting region of the organic electroluminescence element EL-3.

In the organic electroluminescence element EL-3 of the present embodiment, the transparent electrode 1 arranged on the side of the transparent substrate 13' is formed by forming the nitrogen-containing layer 1a and the electrode layer 1b, in this order, from the side of the transparent substrate 13'; and the light-emitting functional layer 3 is directly formed on the top of the electrode layer 1b, which substantially functions as the anode. Thus, the nitrogen-containing layer 1a of the electrode layer 1b may be formed by using a material that satisfies the aforesaid Formula (1) or Formula (2), without the need to be formed by using a material having electron transport performance and/or electron injection performance. Incidentally, in the third embodiment, although the transparent electrode 1 arranged on the side of the transparent substrate 13' is described based on an example in which the transparent electrode 1 has a laminated structure including the nitrogen-containing layer 1a and the electrode layer 1b, the transparent electrode 1 may also have a single-layer structure including only the electrode layer 1b.

In contrast, the transparent electrode 1 arranged on the light-emitting functional layer 3 is formed by forming the nitrogen-containing layer 1a and the electrode layer 1b, in this order, from the side of the light-emitting functional layer 3, so that the nitrogen-containing layer 1a is arranged between the electrode layer 1b, which substantially functions as the cathode, and the light-emitting functional layer 3. Thus, the nitrogen-containing layer 1a is a layer that also constitutes a portion of the light-emitting functional layer 3. It is preferred that such a nitrogen-containing layer 1a is formed by using a material having electron transport performance or electron injection performance and selected from the materials which satisfy the aforesaid Formula (1) or Formula (2). Thus, the nitrogen-containing layer 1a is formed by, for example, a material satisfying Formula (1) or Formula (2) and selected from the electron transporting materials represented by General Formula (6) or (7), or the electron transporting materials represented by General Formula (1). In such a case, since the nitrogen-containing layer 1a arranged on the light-emitting functional layer 3 is regarded as a portion of the light-emitting functional layer 3, it can be considered that the transparent electrode 1 arranged on the light-emitting functional layer 3 has a single-layer structure configured by the electrode layer 1b only.

Further, similar to the first example, in the aforesaid layer-structure, the auxiliary electrode 15 may be provided in contact with the electrode layer 1b of each of the two transparent electrodes 1 in order to reduce the resistance of the transparent electrode 1.

Further, since the organic electroluminescence element EL-3 is a dual emission type organic electroluminescence element, it is sealed by the transparent sealing material 17 having light transmissibility.

<Advantage of Organic Electroluminescence Element EL-3>

The organic electroluminescence element EL-3 is configured by sandwiching the light-emitting functional layer 3 between two transparent electrodes 1 having the electrical conductivity and the light transmissibility (one is used as the anode and the other is used as the cathode). Thus, similar to the first example, it is possible to increase the brightness by applying sufficient voltage between the two transparent electrodes 1 to achieve high-brightness emission of the organic electroluminescence element EL-3 while increasing the extraction efficiency of the emitted light h from the sides of the two transparent electrodes 1. Further, it is also possible to increase the light-emitting lifetime by reducing the driving voltage for obtaining a given brightness.

<<6. Fourth Example of Organic Electroluminescence Element (Inversely Laminated Configuration)>>

<Configuration of Organic Electroluminescence Element>

Figure 6:
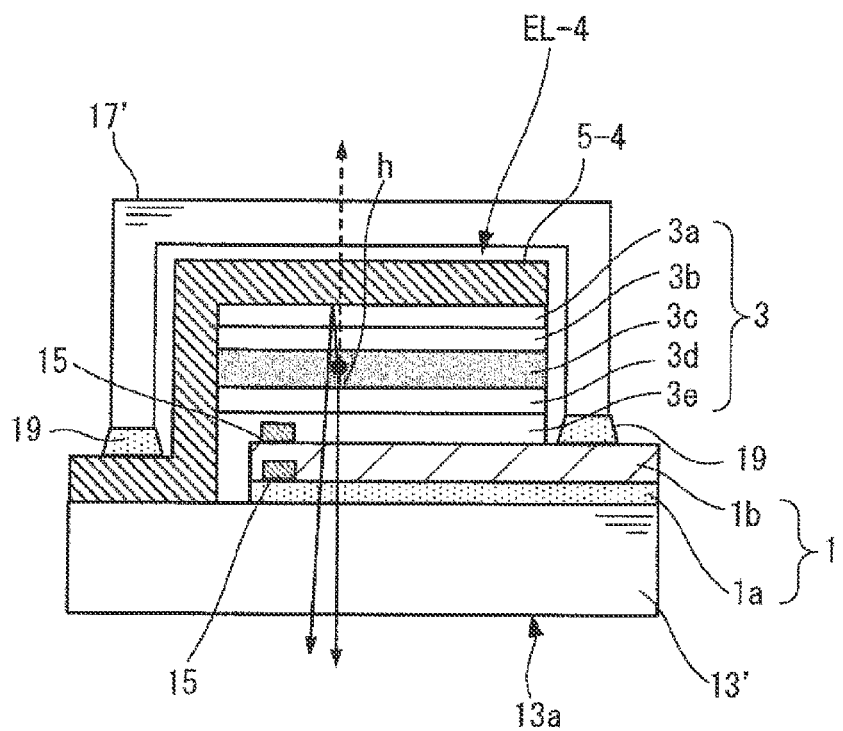
FIG. 6 is a cross-sectional view showing a configuration of a fourth example of the organic electroluminescence element that uses the transparent electrode according to the present invention.

As an example of the electronic device of the present invention, FIG. 6 shows a cross-sectional configuration of a fourth example of the organic electroluminescence element using the aforesaid transparent electrode. An organic electroluminescence element EL-4 of the fourth example shown in FIG. 6 differs from the organic electroluminescence element EL-1 of the first example described with reference to FIG. 3 in that a cathode (a transparent electrode 1), a light-emitting functional layer 3 and an anode (an opposite electrode 5-4) are formed from the side of the transparent substrate 13' in this order, which is an order reverse to that of the organic electroluminescence element EL-1. In the following paragraphs, components identical to those of the first example will not be described repeatedly, and description will be focused on characteristic configurations of the organic electroluminescence element EL-4 of the fourth example.

The organic electroluminescence element EL-4 shown in FIG. 6 is arranged on the transparent substrate 13', and is obtained by laminating the transparent electrode 1 having the electrode layer 1b (as the cathode), the light-emitting functional layer 3, and the opposite electrode 5-4 (as the anode), in this order, from the side of the transparent substrate 13'. It is characterized that, among these layers, the aforesaid transparent electrode 1 of the present invention is used as the transparent electrode 1 of the organic electroluminescence element EL-4. Thus, the organic electroluminescence element EL-4 is configured as a bottom emission type organic electroluminescence element in which the emitted light h is extracted at least from the side of the transparent substrate 13'.

Similar to the first example, the entire layer-structure of the organic electroluminescence element EL-4 is not particularly limited, but may be a generic layer-structure. As one example of the fourth example, a configuration shown here is formed by laminating an electron injecting layer 3e/an electron transporting layer 3d/a light emitting layer 3c/a hole transporting layer 3b/a hole injecting layer 3a, in this order, on the top of the electrode layer 1b (as the cathode), and further laminating the opposite electrode 5-4 (as the anode) on the top of the hole injecting layer 3a.

Note that, similar to the first example, various configurations according to necessity may be adopted as the light-emitting functional layer 3; for example, the light-emitting functional layer 3 may also be provided with a hole blocking layer (not shown) and/or an electron blocking layer (not shown). In such a configuration, similar to the first example, only the portion sandwiched by the transparent electrode 1 and the opposite electrode 5-4 is a light-emitting region of the organic electroluminescence element EL-4.

In the organic electroluminescence element EL-4 of the present embodiment, the transparent electrode 1 arranged on the side of the transparent substrate 13' is in a state where the light-emitting functional layer 3 is directly formed on the electrode layer 1b, which substantially functions as the anode. Thus, the nitrogen-containing layer 1a of the electrode layer 1b may be formed by using a material that satisfies the aforesaid Formula (1) or Formula (2), without the need to be formed by using a material having hole transport performance and/or hole injection performance. Incidentally, in the fourth embodiment, although the transparent electrode 1 arranged on the side of the transparent substrate 13' is described based on an example in which the transparent electrode 1 has a laminated structure including the nitrogen-containing layer 1a and the electrode layer 1b, the transparent electrode 1 may also have a single-layer structure including only the electrode layer 1b.

Similar to the first example, in the aforesaid layer-structure, the auxiliary electrode 15 may be provided in contact with the electrode layer 1b of the transparent electrode 1 in order to reduce the resistance of the transparent electrode 1.

Further, the opposite electrode 5-4 (as the anode) formed on the top of the light-emitting functional layer 3 is composed of the same material as the anode of the first example, i.e., a metal, an alloy, an organic or inorganic conductive compound, or a mixture of these materials.

Incidentally, as a modification of the present embodiment, the present invention includes a configuration in which the anode above the light-emitting functional layer 3 is also the transparent electrode 1. In such a case, the electrode layer 1b formed on the light-emitting functional layer 3 through the nitrogen-containing layer 1a is a substantive anode. Further, the nitrogen-containing layer 1a formed on the light-emitting functional layer 3 also constitutes a portion of the light-emitting functional layer 3. It is preferred that such a nitrogen-containing layer 1a is formed by using a material having hole transport performance or hole injection performance and selected from the materials which satisfy the aforesaid Formula (1) or Formula (2). In such a case, since the nitrogen-containing layer 1a arranged on the light-emitting functional layer 3 is regarded as a portion of the light-emitting functional layer 3, it can be considered that the transparent electrode 1 arranged on the light-emitting functional layer 3 has a single-layer structure composed of the electrode layer 1b only.

<Advantage of Organic Electroluminescence Element EL-4>

The organic electroluminescence element EL-4 described above has a configuration in which the transparent electrode 1, which has both the electrical conductivity and the light transmissibility, of the present invention is used as the cathode, and the light-emitting functional layer 3 and the opposite electrode 5-4 (as the anode) are formed, in this order, on the top of the transparent electrode 1. Thus, similar to the first example, it is possible to increase the brightness by applying sufficient voltage between the transparent electrode 1 and the opposite electrode 5-4 to achieve high brightness light-emitting of the organic electroluminescence element EL-4 while increasing extraction efficiency of the emitted light h from the side of the transparent electrode 1. Further, it is also possible to increase the light-emitting lifetime by reducing the driving voltage for obtaining a given brightness.

<<7. Applications of Organic Electroluminescence Element>>

As mentioned above, since the organic electroluminescence elements having the aforesaid configurations are each a planar light-emitting body, they can be used as various kinds of luminescent light sources. Examples of the various kinds of luminescent light sources include, but not limited to, an illumination device (such as a home lighting fixture, a car lighting fixture or the like), a backlight for timepiece or liquid crystal, an illumination for billboard, a light source for traffic light, a light source for optical storage medium, a light source for electrophotographic copier, a light source for optical communication processor and a light source for optical sensor; particularly, the light emitting source can be effectively used as a backlight for a liquid crystal display device combined with a color filter, and as a light source for illumination.

Further, the organic electroluminescence element according to the present invention may either be used as a kind of lamp such as an illuminating source, an exposing source or the like, or be used as a projection device where an image is projected, a display device (a display) where a still image or dynamic image is directly viewed, or the like. In such a case, as the size of the illumination devices and displays becomes large in recent years, the area of the light-emitting face may be increased by a method of so-called "tiling", in which a plurality of light-emitting panels each having an organic electroluminescence element are planarly connected with each other.

In the case where the organic electroluminescence element is used as a display device for replaying dynamic image, the driving method may either be a simple matrix driving method (i.e., passive matrix driving method) or an active matrix driving method. Further, it is possible to produce a color or full color display device by using two or more organic electroluminescence elements of the present invention each having different emission color.

As an example of the applications, an illumination device will be described below, and thereafter an illumination device whose light-emitting face is made large by tiling will be described.

<<8. Illumination Device 1>>

The illumination device of the present invention has an aforesaid organic electroluminescence element.

The organic electroluminescence element used in the illumination device according to the present invention may also have a design in which each of the organic electroluminescence elements having the aforesaid configurations is provided with a resonator structure. Examples of the intended use of the organic electroluminescence element configured as the resonator structure include, but not limited to, a light source for an optical storage medium, a light source for an electrophotographic copier, a light source for an optical communication processor, a light source for an optical sensor, and the like. Further, the illumination device may also be used for the aforesaid purpose by laser-oscillating.

Incidentally, the material used in the organic electroluminescence element of the present invention may be used for an organic electroluminescence element which substantially emits while light (also referred to as a "white organic electroluminescence element"). For example, it is possible to cause a plurality of emission colors to be simultaneously emitted by a plurality of light emitting materials so as to obtain a white light emission by mixed color. The combination of the plurality of emission colors may be a combination including three light emission maximum wavelengths of three primary colors of blue, green and red, or a combination including two light emission maximum wavelengths using the complementary color relationship such as blue and yellow, bluish-green and orange, or the like.

Further, the combination of light emitting materials for obtaining a plurality of emission colors may be a combination of a plurality of materials which emit a plurality of phosphorescent lights or fluorescent lights, or a combination of a light emitting material which emits phosphorescent light or fluorescent light and a dye material which emits light with the light emitted from the light emitting material as exciting light; however, in a white organic electroluminescence element, the combination of light emitting materials for obtaining a plurality of emission colors may also be a combinations of a plurality of light-emitting dopants.

In such a white organic electroluminescence element, the organic electroluminescence element itself emits white light, in contrast to a configuration in which a plurality of organic electroluminescence elements each emitting different color are parallelly arranged in array to obtain white-light emission. Thus, almost all layers constituting the element can be formed without mask, and it is possible to form an electrode film, for example, on one surface by a deposition method, a casting method, a spin coating method, an ink-jet method, a printing method or the like, so that productivity can be improved.

The light emitting material used in the light emitting layer of such a white organic electroluminescence element is not particularly limited; for example, if the light emitting material is used for the back light of a liquid crystal display element, arbitrary light emitting materials may be selected from the metal complexes of the present invention or known light emitting materials and combined to obtain white light in a manner in which the light is matched to the wavelength range corresponding to CF (color filter) characteristics.

By using the white organic electroluminescence element described above, it is possible to produce an illumination device which substantially emits white light.

<<9. Illumination Device 2>>

Figure 7:
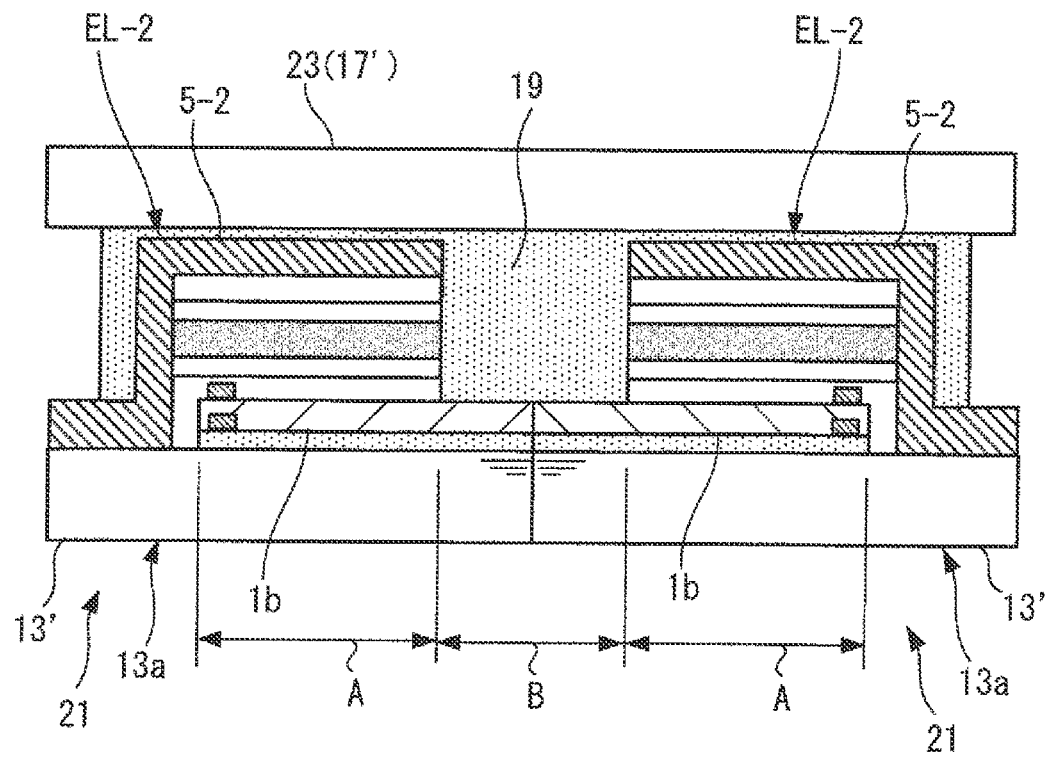
FIG. 7 is a cross-sectional view showing a configuration of an illumination device whose light-emitting face is enlarged in area by using a plurality of organic electroluminescence elements.

FIG. 7 shows a cross-sectional configuration of an illumination device whose light-emitting face is made large by using a plurality of organic electroluminescence elements each having aforesaid configuration. The illumination device shown in FIG. 7 has a configuration in which the area of the light-emitting face is increased by arranging (i.e., so-called "tiling") a plurality of light-emitting panels 21 on a supporting substrate 23, wherein each light-emitting panel 21 is formed by, for example, arranging an organic electroluminescence element EL-2 of the second example on a transparent substrate 13'. The supporting substrate 23 may also serves as the material 17'; and the light-emitting panels 21 are tiled in a state where the organic electroluminescence elements EL-2 are sandwiched between the supporting substrate 23 and the transparent substrates 13' of the light-emitting panels 21. The adhesive 19 may be filled between the supporting substrate 23 and the transparent substrates 13', and thereby the organic electroluminescence elements EL-2 are sealed. Incidentally, the end portion of the transparent electrode 1b of the transparent electrode 1 (which is the anode) and the end portion of the opposite electrode 5-2 (which is the cathode) are exposed from the periphery of the light-emitting panels 21. However, only the exposed portion of the opposite electrode 5-2 is shown in FIG. 7.

In the illumination device with such a configuration, the center of each light-emitting panel 21 is a light-emitting region A, and the region between adjacent light-emitting panels 21 is a light non-emitting region B. Thus, a light extraction member for increasing the amount of the light extracted from the light non-emitting region B may be arranged in the light non-emitting region B of the light extracting face 13a. A light-collecting sheet, a light-diffusing sheet or the like can be used as the light extraction member.

Note that, although the example described above has a configuration in which each light-emitting panel 21 to be tiled on the supporting substrate 23 has an organic electroluminescence element EL-2, any one of the aforesaid various kinds of organic electroluminescence elements can be used in the light-emitting panel 21; and in the case where the light is extracted from the side of the supporting substrate 23, a supporting substrate 23 having light transmissibility may be used.

Example 1

<<Production of Transparent Electrode: Part 1>>

As described below, each transparent electrode of Samples 1-1 to 1-12 was produced so that the area of the conductive region of the transparent electrode became 5 cm×5 cm.

In Samples 1-1, 1-16, 1-17, 1-18 and 1-19, a transparent electrode having a single-layer structure configured by an electrode layer composed of silver was produced. In each of Samples 1-2 to 1-15, as shown in Table 1 given below, a transparent electrode having a laminated structure was produced, wherein the laminated structure was configured by a nitrogen-containing layer (or a ground layer) and an electrode layer formed on the top of the nitrogen-containing layer (or the ground layer), the nitrogen-containing layer (or a ground layer) being composed of a compound, and the electrode layer being composed of silver.

In the production of the transparent electrode of Sample 1-2, instead of the nitrogen-containing layer, a ground layer was formed by using anthracene, which contained no nitrogen. In the production of the transparent electrode of Sample 1-3, instead of the nitrogen-containing layer, a ground layer was formed by using the following spiro-DPVBi, which contained no nitrogen.

[Chemical Formula 68]

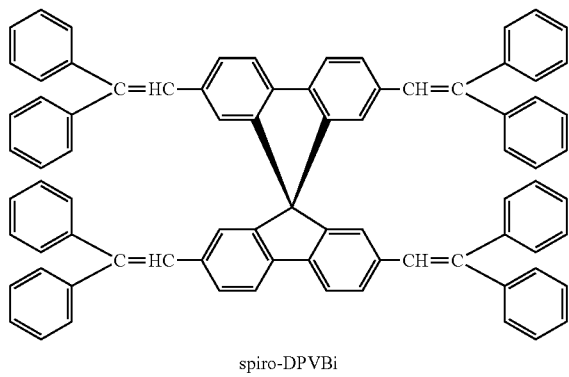

spiro-DPVBi

In the production of the respective transparent electrodes of Samples 1-4 to 1-15, the following TPD (diamine derivative), porphyrin derivative, compounds 99, 94, 10 (which have been shown before as materials constituting the nitrogen-containing layer) and compound No. 11 were used as the compound constituting the nitrogen-containing layer. These compounds each contain nitrogen.

[General Formula 69]

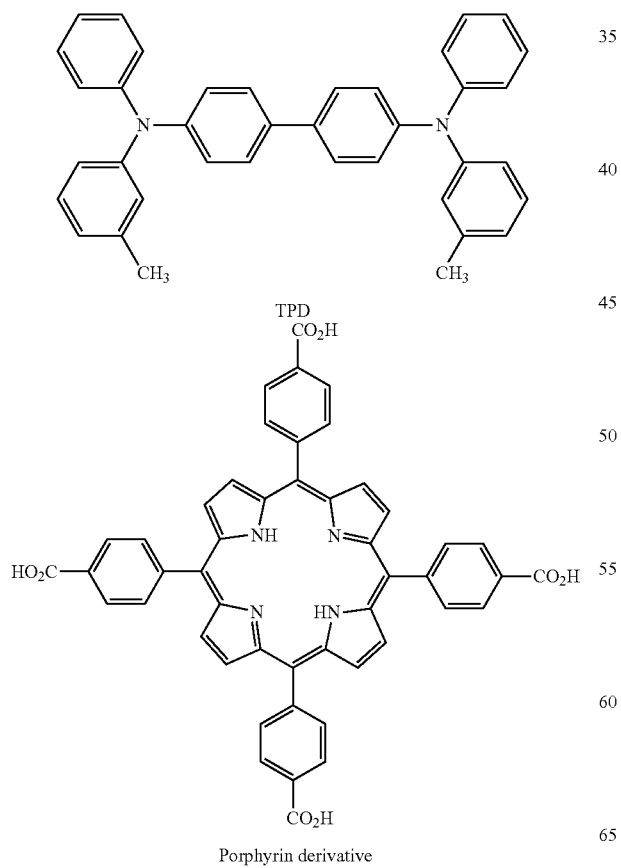

TPD

Porphyrin derivative

-continued

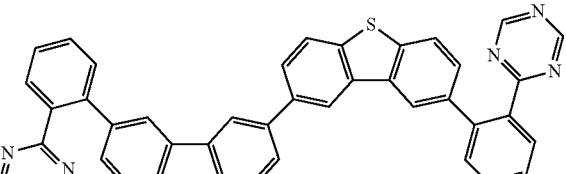
99

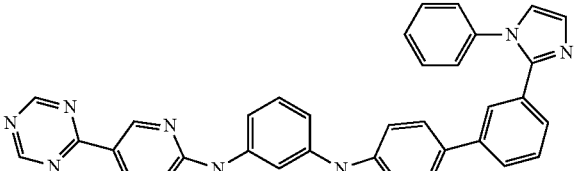
94

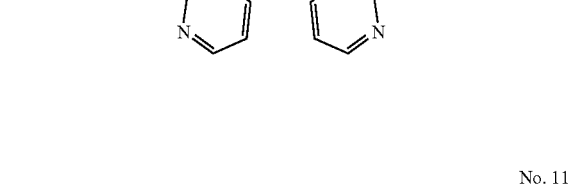
10

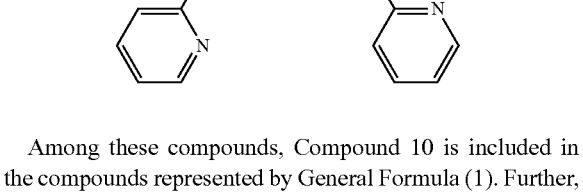
No. 11

Among these compounds, Compound 10 is included in the compounds represented by General Formula (1). Further, among these compounds, Compound No. 11 is included in the compounds represented by General Formula (2), and will be used in Example 2 described later.

TABLE 1

Figure 9A:
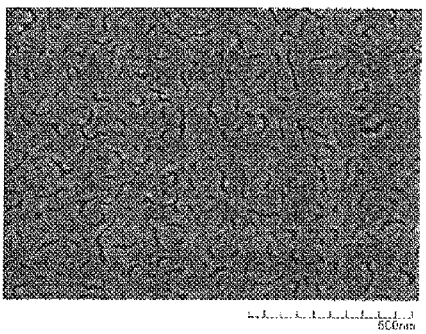
FIG. 9A is a SEM image of a transparent electrode of Sample 1-4 produced in Example 1.
Figure 9B:
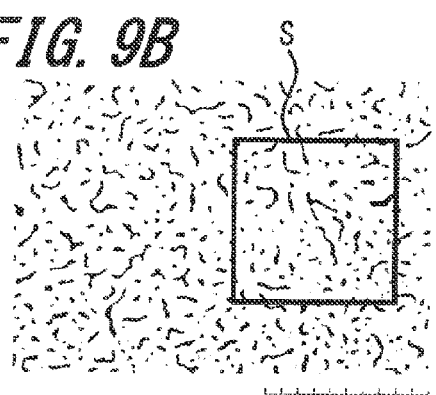
FIG. 9B is a processed image obtained by performing image processing on the SEM image.
Figure 10A:
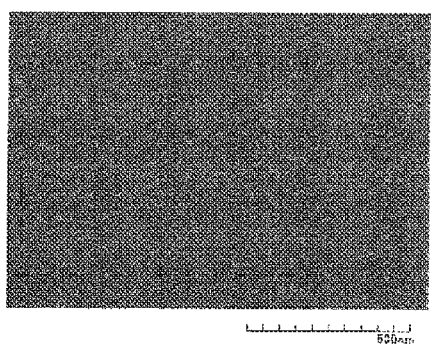
FIG. 10A is a SEM image of a transparent electrode of Sample 1-11 produced in Example 1.
Figure 10B:
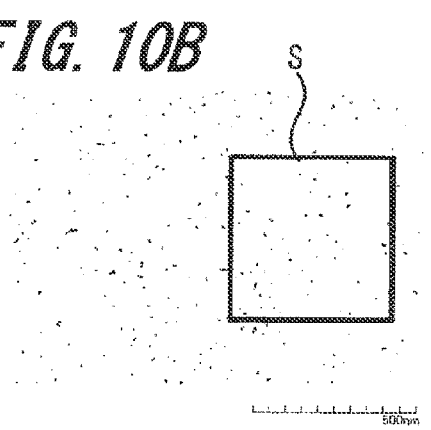
FIG. 10B is a processed image obtained by performing image processing on the SEM image.
Figure 11A:
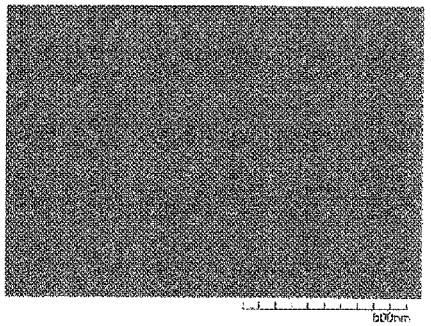
FIG. 11A is a SEM image of a transparent electrode of Sample 1-12 produced in Example 1.
Figure 11B:
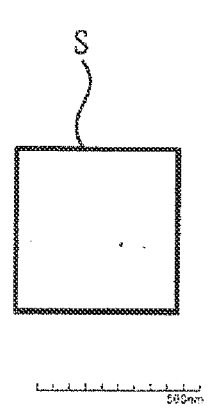
FIG. 11B is a processed image obtained by performing image processing on the SEM image.

| | | Configuration of example | | | | Result of Evaluation | | |
|---|---|---|---|---|---|---|---|---|
| | | Nitrogen-containing | Electrode layer | | | | | |
| Sample | Base material | layer (Film-thickness 25 nm) Material | Material Film-thickness (nm) | Film-forming method | Circumferential length of aperture (nm) | Light transmittance (at 550 nm) | Sheet resistance (Ω/sq.) | Remark |
| 1-1 | Glass | — | Ag/8 | Resistance heating deposition | >5000 | 38% | Unmeasurable | Comparison (FIG. 8) |
| 1-2 | | Anthracene | | | >5000 | 39% | Unmeasurable | Comparison |
| 1-3 | | spiro-DPVBi | | | >5000 | 42% | Unmeasurable | Comparison |
| 1-4 | Glass | TPD | Ag/8 | Resistance heating deposition | 2600 | 52% | 35 | Present invention (FIG. 9) |
| 1-5 | | Porphyrin derivative | | | 1900 | 57% | 28 | Present invention |
| 1-6 | | Compound 99 | | | 1500 | 62% | 15 | Present invention |
| 1-7 | | Compound 94 | | | 1200 | 65% | 10 | Present invention |
| 1-8 | | Compound No. 11 | | | 0 | 69% | 9.2 | Present invention |
| 1-9 | Glass | Compound 10 | Ag/3 | Resistance heating deposition | 2500 | 60% | 456 | Present invention |
| 1-10 | | | Ag/5 | | 1000 | 69% | 42 | Present invention |
| 1-11 | | | Ag/8 | | 600 | 70% | 7.8 | Present invention (FIG. 10) |
| 1-12 | | | Ag/10 | | 30 | 60% | 5.2 | Present invention (FIG. 11) |
| 1-13 | | | Ag/12 | | 0 | 53% | 4.3 | Present invention |
| 1-14 | Glass | Compound 10 | Ag/15 | Resistance heating deposition | 0 | 37% | 3.5 | Comparison |
| 1-15 | Glass | Compound 10 | Ag/8 | Sputtering | 700 | 69% | 8.1 | Present invention |
| 1-16 | | — | Ag/8 | Sputtering | 900 | 68% | 8.2 | Present invention |
| 1-17 | PET | — | Ag—Cu (3 atm %)/8 | | 0 | 69% | 7.9 | Present invention |
| 1-18 | PEN | | Ag—Cu (3 atm %)/8 | | 0 | 69% | 7.9 | Present invention |
| 1-19 | Glass | | Ag—Cu (3 atm %)/8 | | 0 | 69% | 7.9 | Present invention |

<Process for Producing Transparent Electrode of Sample 1-1>

First, a base material made of transparent alkali-free glass was fixed to a base material holder of a commercially available vacuum deposition device, and then the base material holder was mounted on a vacuum chamber of the vacuum deposition device. Further, silver (Ag) was placed in a tungsten resistance heating boat, and then the tungsten resistance heating boat was mounted in the vacuum chamber. Next, the pressure of the vacuum chamber was reduced to $4\times10^{-4}$ Pa, and then the resistance heating boat was electrically heated at a deposition rate of 0.1 nm/sec to 0.2 nm/sec so as to form a transparent electrode having a single-layer structure composed of silver and having a film-thickness of 5 nm.

<Process for Producing Transparent Electrodes of Samples 1-2 to 1-14>

A base material made of transparent alkali-free glass was fixed to a base material holder of a commercially available vacuum deposition device. In the production of each transparent electrode, each of anthracene, TPD and other compounds was placed in a tantalum resistance heating boat. The base material holder and the heating boat were mounted on a first vacuum chamber of the vacuum deposition device. Further, silver (Ag) was placed in a tungsten resistance heating boat, and the tungsten resistance heating boat was mounted inside a second vacuum chamber.

In such state, first, the pressure of the first vacuum chamber was reduced to $4\times10^{-4}$ Pa, and then the heating boat having each of the compounds placed therein was electrically heated to form a nitrogen-containing layer (or a ground layer) composed of each of the compounds on the base material at a deposition rate of 0.1 nm/sec to 0.2 nm/sec, wherein the film-thickness of the nitrogen-containing layer (or the ground layer) was 25 nm.

Next, the base material, on which the layers up to the nitrogen-containing layer (or the ground layer) had been formed, was transferred to the second vacuum chamber while maintaining the vacuum state. After the pressure of the second vacuum chamber was reduced to $-4\times10^{-4}$ Pa, the heating boat having silver placed therein was electrically heated. Thus, an electrode layer composed of silver and having each film-thickness (3 nm to 5 nm) was formed at a deposition rate of 0.1 nm/sec to 0.2 nm/sec, and thereby each transparent electrode of Samples 1-2 to 1-14 having a laminated structure configured by a nitrogen-containing layer (or a ground layer) and an electrode layer formed on the top of the nitrogen-containing layer was obtained. The film-thickness of the electrode layer of each of Samples 1-1 to 1-14 is shown in Table 1.

<Process for Producing Transparent Electrode of Sample 1-15>

The process for producing the transparent electrode of Sample 1-15 differs from the process for producing the transparent electrode of Sample 1-11 in that the formation method of the electrode layer is changed to sputtering method.

<Process for Producing Transparent Electrode of Sample 1-16>

The process for producing the transparent electrode of Sample 1-15 differs from the process for producing the transparent electrode of Sample 1-1 in that the formation method of the electrode layer is changed to sputtering method.

<Process for Producing Transparent Electrodes of Samples 1-17 to 1-19>

As shown in Table 1, in Samples 1-17 to 1-19, respective materials were used as the base material, and the electrode layer was formed by a sputtering method by using AgCu containing 3 atm % copper (Cu).

<Measurement of Circumferential Length of Aperture(s) for Each Sample of Example 1>

Figure 8A:
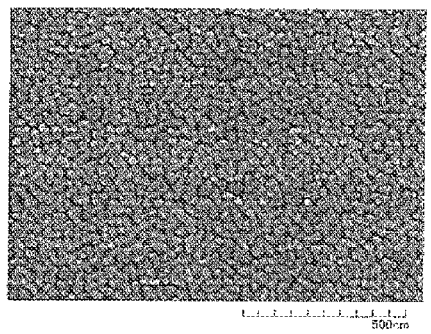
FIG. 8A is a SEM image of a transparent electrode of Sample 1-1 produced in Example 1.
Figure 8B:
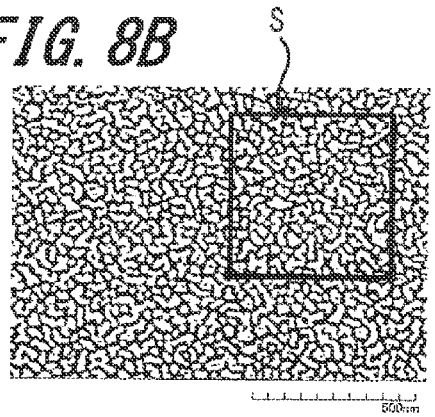
FIG. 8B is a processed image obtained by performing image processing on the SEM image.

A scanning electron microscope image of the surface of the electrode layer of each of Samples 1-1 to 1-19 produced in the aforesaid manner was taken, and circumferential length of all aperture(s) existing in a surface region with an area of 500 nm×500 nm of the electrode layer was summed by performing image processing on the scanning electron microscope image. FIG. 8A shows a secondary electron image (SEM image) of the electrode layer of Sample 1-1 obtained by a scanning electron microscope. FIG. 8B shows a processed image obtained by binarizing the contrast of the SEM image by performing image processing, and further shows a surface region S with an area of about 500 nm×500 nm. In FIG. 8B, the black parts correspond to apertures "a". Similarly, FIGS. 9A and 9B, FIGS. 10A and 10B, and FIGS. 11A and 11B respectively show secondary electron images and processed images of Sample 1-4, Sample 1-11 and Sample 1-12. The sum of the circumferential length of aperture(s) obtained in this manner is shown in Table 1.

<Evaluation of Each Sample of Example 1, Part 1>

Light transmittance was measured for the transparent electrode of each of Samples 1-1 to 1-19 produced above. The measurement of the light transmittance was performed using a spectrophotometer (U-3300, manufactured by Hitachi Co., Ltd.) with a base material identical to the sample as a baseline. The results of the measurement are also shown in Table 1.

<Evaluation of Each Sample of Example 1, Part 2>

Sheet resistance was measured for the transparent electrode of each of Samples 1-1 to 1-19 produced above. The measurement of the sheet resistance was performed by a 4-terminal 4-probe constant current applying method using a resistivity meter (MCP-T610, manufactured by Mitsubishi Chemical Corporation). The results of the measurement are also shown in Table 1.

<Evaluation Results of Example 1>

As is clear from Table 1, the light transmittance of the transparent electrode of each of Samples 1-4 to 1-13 and 1-15 to 1-19 (i.e., the transparent electrode of the present invention having an electrode layer composed of silver which has a film-thickness of 12 nm or less at which the sheet resistance of the electrode layer 1b is measurable and in which the circumferential length of aperture(s) obtained by performing image processing on a scanning electron microscope image of a surface region with an area of 500 nm×500 nm is, in sum total, 3000 nm or less) is 50% or higher. In contrast, the transparent electrode of each of Samples 1-1 to 1-3 (i.e., the transparent electrode not of the present invention whose circumferential length of aperture(s), in sum total, exceeds 3000 nm) not only has unmeasurable sheet resistance but also has low light transmittance of 42% or less. Further, the transparent electrode of Sample 1-4 (i.e., the transparent electrode having an electrode layer whose film-thickness is 15 nm or more) has measurable sheet resistance but has low light transmittance of 37%.

Based on the above facts, it is confirmed that the transparent electrode having the configuration of the present invention has higher light transmittance and higher electrical conductivity.

Further, by comparing Samples 1-4 to 1-8, Samples 11, and Samples 1-15 to 1-19 (which each have an electrode layer having film-thickness of 8 nm) with each other, it is confirmed that: the smaller the summed circumferential length of all aperture(s) is, the lower the sheet resistance will be, and the higher the light transmittance will be. Furthermore, by comparing the sheet resistances of Samples 1-9 to 1-14 (which have the same material (Compound 10) of the nitrogen-containing layer but different film-thicknesses of the electrode layer) with each other, it is confirmed that: the greater the film-thicknesses of the electrode layer is and the smaller the summed circumferential length of all aperture(s) is, the lower the sheet resistance will be.

In contrast, by comparing the light transmittances of Samples 1-9 to 1-14 (which are the same except for film-thicknesses of the electrode layer) with each other, it can be known that the light transmittance shows the maximum value in a range of about 5 nm to 8 nm of the film-thickness of the electrode layer, and the light transmittance will decease when the film-thickness goes beyond that range. Thus, it is confirmed that the optimum film-thickness of the electrode layer composed of silver is in a range of 5 nm to 8 nm.

The aforesaid tendency does not change even in a case where the electrode layer is formed by a sputtering method or in a case where the electrode layer is composed of an alloy having silver as a main component. Further, the aforesaid tendency does not change even in a case where the base material is changed into a plastic material such as PET, PEN or the like.

Example 2

<<Production of Transparent Electrode: Part 2>>

As described below, each transparent electrode of Samples 2-1 to 2-12 was produced so that the area of the conductive region of the transparent electrode became 5 cm×5 cm.

In Sample 2-1, a transparent electrode with a single-layer structure configured by an electrode layer was produced, wherein the electrode layer is composed of silver and has a film-thickness of 5 nm. In each of Samples 2-2 to 2-12, a transparent electrode having a laminated structure was produced, wherein the laminated structure is configured by a nitrogen-containing layer composed of each of compounds, and an electrode layer composed of silver and formed on the top of the nitrogen-containing layer, the film-thickness of the electrode layer being 5 nm.

In the production of the transparent electrode of Sample 2-2, instead of the nitrogen-containing layer, a ground layer was formed by using anthracene (Compound No. 01), which contains no nitrogen.

On the other hand, in the production of the respective transparent electrodes of Samples 2-3 to 2-12, the nitrogen-containing Compound No. 02 to Compound No. 11 shown below were used as the compounds constituting the nitrogen-containing layers.

[Chemical Formula 70]
No.02
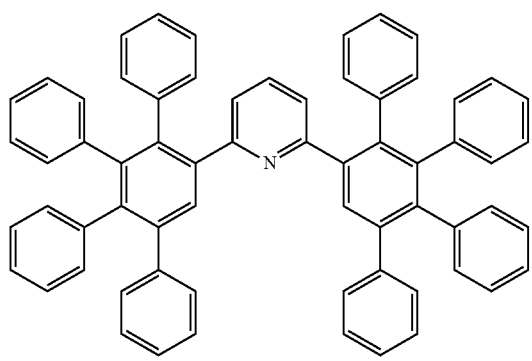
No.03
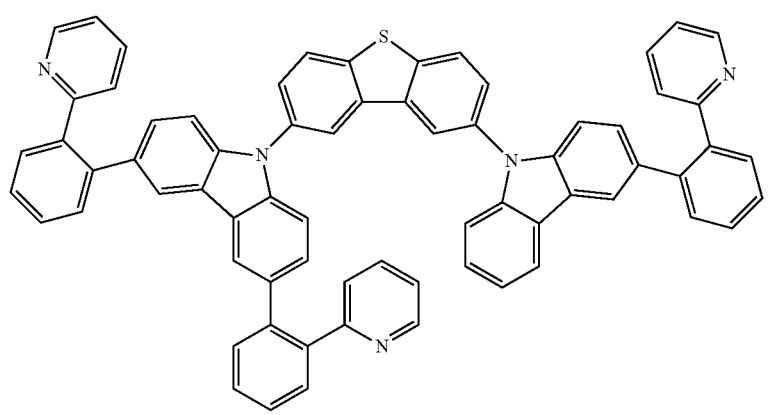
No.04
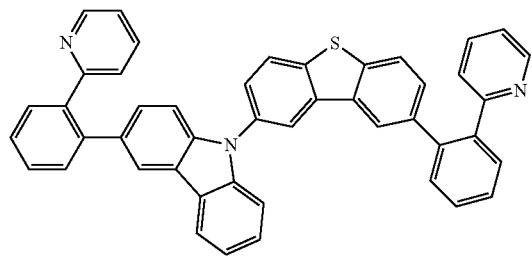
No.05
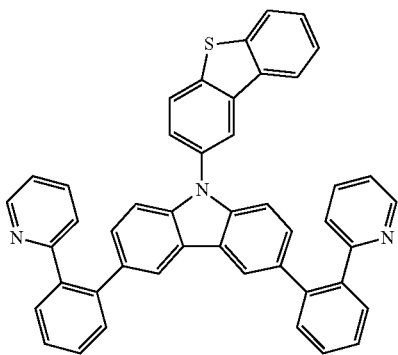
No.06
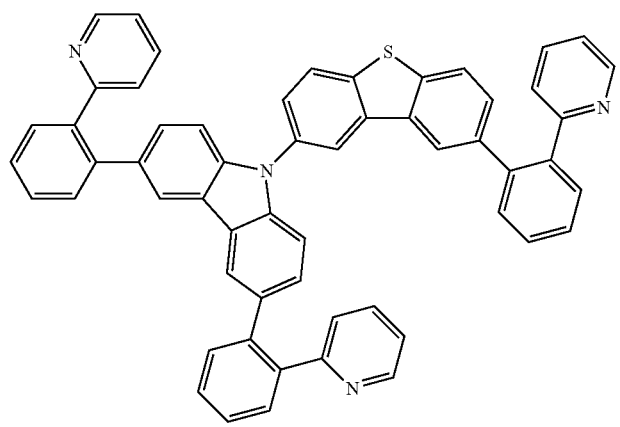

[Chemical Formula 71]

No.07

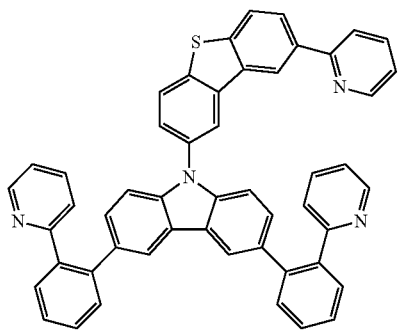

No.08

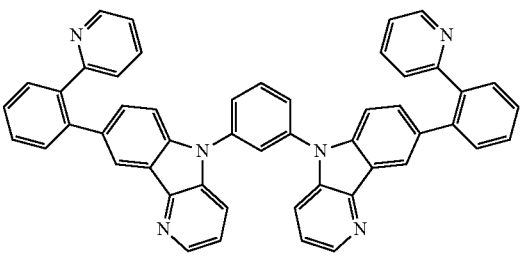

No.09

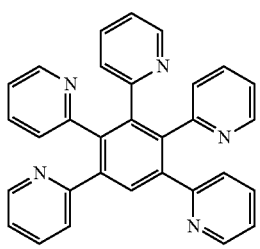

No.10

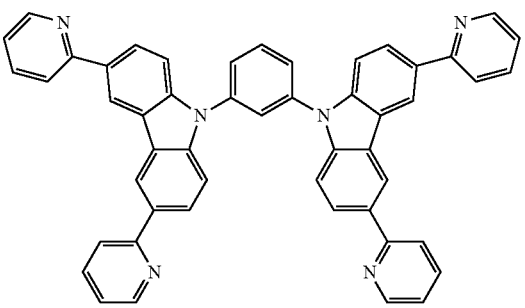

No.11

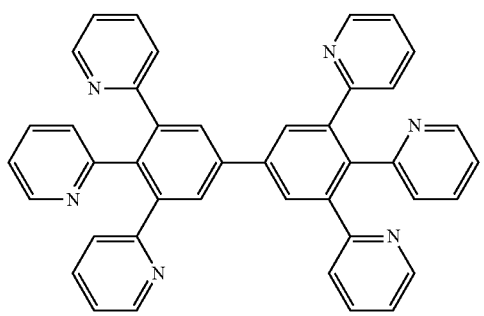

In these compounds, compounds No. 03 and No. 08 are compounds included in General Formula (1), and compounds No. 11 is a compound included in General Formula (2). Compound No. 4 is Compound 31 shown before as a material constituting the nitrogen-containing layer. Compound No. 5 is Compound 34 shown before as a material constituting the nitrogen-containing layer. Compound No. 6 is Compound 33 shown before as a material constituting the nitrogen-containing layer. Further, Compound No. 8 is Compound 10 shown before as a material constituting the nitrogen-containing layer.

The number [n] of nitrogen atom(s) contained in the compound and stably bonded with silver, the interaction energy [ΔE] between silver (Ag) and nitrogen (N) contained in the compound, the surface area [s] of the compound, and the effective action energy [ΔEef] calculated based on the number [n], the interaction energy [ΔE] and the surface area [s] are shown in the following Table 1 for each of Compounds No. 02 to No. 11 used in Samples 2-3 to 2-12. The dihedral angle [D] between nitrogen atom and silver with respect to the ring containing nitrogen atom in the compound, and the [ΔE] were calculated by using Gaussian 03 (Gaussian, Inc., Wallingford, Conn., 2003), wherein the dihedral angle [D] was used to obtain the number [n]. Incidentally, in each of the compounds No. 02 to No. 11 used in Samples 2-3 to 2-12, the nitrogen atom(s) whose dihedral angle [D] satisfies "D<10 degrees" was counted as the number [n].

TABLE 2

| Sample | Compound | Nitrogen-containing layer 1a (25 nm) | | | | Electrode layer 1b (Ag: 5 nm) |
| | | n [Piece] | ΔE [kcal/mol] | s [Å$^2$] | ΔEef [kcal/mol · Å$^2$] | Sheet resistance [Ω/sq.] |
| --- | --- | --- | --- | --- | --- | --- |
| 2-1 | — | — | — | — | — | Unmeasurable |
| 2-2 | No. 01 (Anthracene) | — | — | — | — | Unmeasurable |

TABLE 2-continued

| | | Nitrogen-containing layer 1a (25 nm) | | | | Electrode layer 1b (Ag: 5 nm) |
|---|---|---|---|---|---|---|
| Sample | Compound | n [Piece] | ΔE [kcal/mol] | s [Å$^2$] | ΔEef [kcal/mol · Å$^2$] | Sheet resistance [Ω/sq.] |
| 2-3 | No. 02 | 1 | −51.6 | 902.7 | −0.057161848 | Unmeasurable |
| 2-4 | No. 03 | 3 | −36.418 | 981 | −0.111370031 | 963 |
| 2-5 | No. 04 | 2 | −48.933 | 666 | −0.146945946 | 915750 |
| 2-6 | No. 05 | 2 | −49.419 | 666 | −0.148405405 | 39120 |
| 2-7 | No. 06 | 3 | −43.768 | 821 | −0.15993179 | 769 |
| 2-8 | No. 07 | 3 | −45.834 | 739 | −0.186064953 | 3337 |
| 2-9 | No. 08 | 4 | −41.989 | 729 | −0.230392318 | 278 |
| 2-10 | No. 09 | 2 | −56.976 | 479 | −0.237895616 | 122 |
| 2-11 | No. 10 | 4 | −45.01 | 723 | −0.249017981 | 792 |
| 2-12 | No. 11 | 4 | −57.302 | 634 | −0.361526814 | 52 |

In the compound No. 02, the effective action energy [ΔEef], which shows the relationship between nitrogen atom (N) contained in the compound and silver (Ag) constituting the electrode layer, satisfies the condition of ΔEef>−0.1. In contrast, in each of the compounds No. 03 to No. 11, the effective action energy [ΔEef] satisfies the condition of ΔEef≤−0.1.

<Process for Producing Transparent Electrode of Sample 2-1>

First, a base material made of transparent alkali-free glass was fixed to a base material holder of a commercially available vacuum deposition device, and then the base material holder was mounted on a vacuum chamber of the vacuum deposition device. Further, silver (Ag) was placed in a tungsten resistance heating boat, and then the tungsten resistance heating boat was mounted in the vacuum chamber. Next, the pressure of the vacuum chamber was reduced to 4×10$^{-4}$ Pa, and then the resistance heating boat was electrically heated at a deposition rate of 0.1 nm/sec to 0.2 nm/sec so as to form a transparent electrode having a single-layer structure composed of silver and having a film-thickness of 5 nm.

<Process for Producing Transparent Electrodes of Samples 2-2 to 2-12>

A base material made of transparent alkali-free glass was fixed to a base material holder of a commercially available vacuum deposition device. In the production of each transparent electrode, each of the compounds No. 01 to No. 11 was placed in a tantalum resistance heating boat. The base material holder and the heating boat were mounted in a first vacuum chamber of the vacuum deposition device. Further, silver (Ag) was placed in a tungsten resistance heating boat, and the tungsten resistance heating boat was mounted in a second vacuum chamber.

In such state, first, the pressure of the first vacuum chamber was reduced to 4×10$^{-4}$ Pa, and then the heating boat having each of the compounds placed therein was electrically heated to form a nitrogen-containing layer (or a ground layer) composed of each of the compounds on the base material at a deposition rate of 0.1 nm/sec to 0.2 nm/sec, wherein the film-thickness of the nitrogen-containing layer (or the ground layer) was 25 nm.

Next, the base material, on which the layers up to the nitrogen-containing layer (or the ground layer) had been formed, was transferred to the second vacuum chamber while maintaining the vacuum state. After the pressure of the second vacuum chamber was reduced to −4×10$^{-4}$ Pa, the heating boat having silver placed therein was electrically heated. Thus, an electrode layer composed of silver and having a film-thickness of 5 nm was formed at a deposition rate of 0.1 nm/sec to 0.2 nm/sec, and thereby each transparent electrode of Samples 2-2 to 2-12 having a laminated structure configured by a nitrogen-containing layer (or a ground layer) and an electrode layer formed on the top of the nitrogen-containing layer was obtained.

<Evaluation of Each Sample of Example 2>

Sheet resistance of each transparent electrode of Samples 2-1 to 2-12 produced above was measured. The measurement of the sheet resistance was performed by a 4-terminal 4-probe constant current applying method using a resistivity meter (MCP-T610, manufactured by Mitsubishi Chemical Corporation). The results of the measurement are also shown in Table 1.

<Evaluation Results of Example 2>

As is clear from Table 2, in each transparent electrode of Samples 2-4 to 2-12 in which the nitrogen-containing layer is formed by using each of Compounds No. 03 to No. 11 whose effective action energy ΔEef satisfies a condition of ΔEef-0.1, the electrode layer (which substantially functions as a conductive layer) composed of silver has a measurable sheet resistance despite having extremely small thickness of 5 nm, so that it is confirmed that the silver grows in a single-layer growth mode (Frank-van der Merwe: FW mode) and thereby is formed into a film having substantially uniform thickness. In contrast, in the transparent electrode of Sample 2-1 which has a single-layer structure with no nitrogen-containing layer, the transparent electrode of Sample 2-2 in which the nitrogen-containing layer is formed by using Compound No. 1 containing no nitrogen, and the transparent electrode of Sample 2-3 in which the nitrogen-containing layer is formed by using Compound No. 02 whose ΔEef satisfies a condition of ΔEef>−0.1, the sheet resistance is not measurable.

Figure 12:
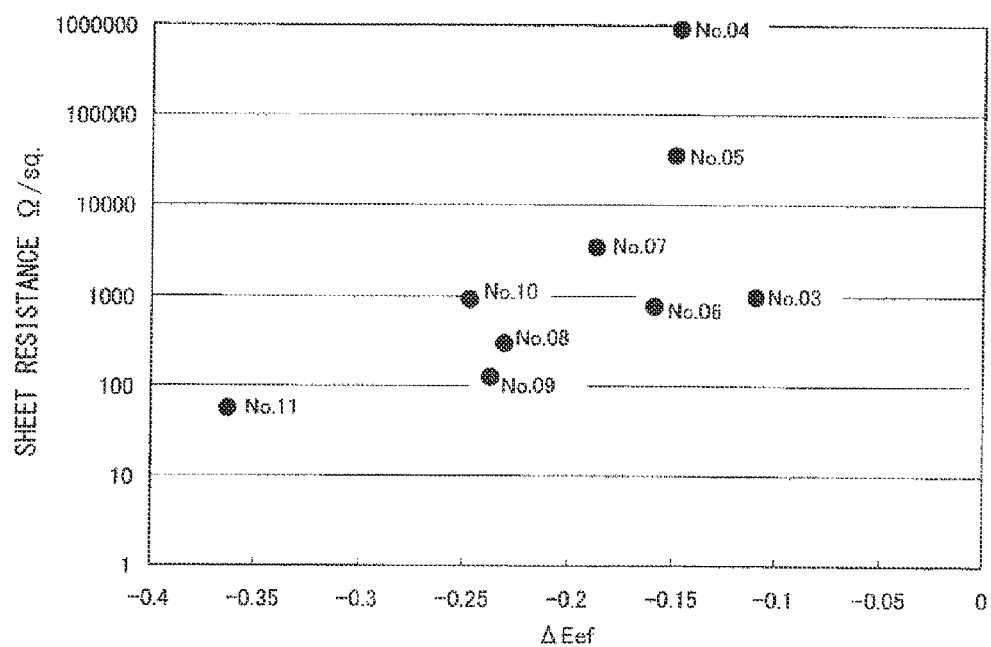
FIG. 12 is a graph showing a relationship between effective action energy $\Delta E_{ef}$ and sheet resistance of each transparent electrode produced in Example 2.

FIG. 12 shows a relationship between the effective action energy ΔEef of each of compounds No. 03 to No. 11, which constitutes the nitrogen-containing layer, and the sheet resistance measured for each transparent electrode. It is clear from FIG. 12 that, if the effective action energy ΔEef falls in a confirmed range of −0.4≤ΔEef≤−0.1, the smaller the value of ΔEef is, the lower the sheet resistance of the transparent electrode becomes. Further, if the effective action energy ΔEef falls in a range of −0.4≤ΔEef≤−0.2, the sheet resistance is maintained at 1000 [Ω/sq.] or lower, which is further preferable.

Based on the above facts, it has been confirmed that, by selecting a compound to form the nitrogen-containing layer with the effective action energy ΔEef as an index, it is possible to obtain an electrode film which is a thin-film (in order to have light transmissibility) yet has lower resistance (i.e., it is possible to obtain a transparent electrode).

Example 3

Figure 13:
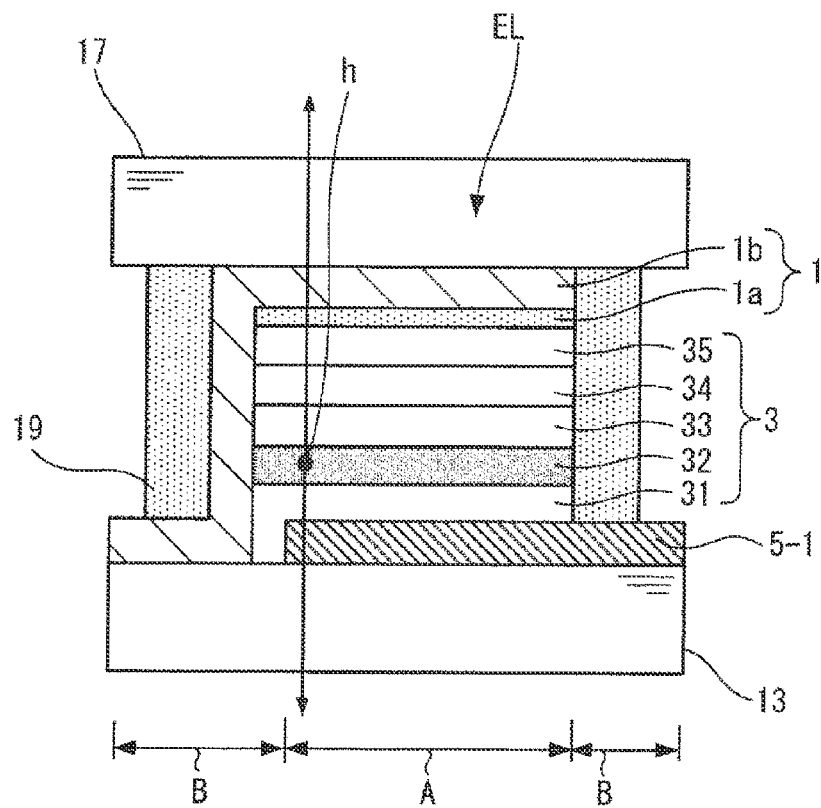
FIG. 13 is a cross-sectional view showing a configuration of an organic electroluminescence element produced in Example 3.

Dual emission type organic electroluminescence elements were each produced using the transparent electrode of each of Samples 1-1 to 1-16 produced in Example 1 as a cathode thereof. The process of the production will be described below with reference to FIG. 13.

First, as an anode, an opposite electrode 5-1 composed of ITO and having light transmissibility was formed on a transparent substrate 13 by a sputtering method. At this time, the 13 was fixed to a substrate holder of a sputtering system which had a target of ITO (as the material of the opposite electrode) attached thereto. Thereafter, in a treatment chamber of the sputtering system, the light transmissive opposite electrode 5-1 composed of ITO and having a film-thickness of 150 nm was formed as the anode at a film-forming rate of 0.3 nm/sec to 0.5 nm/sec.

Thereafter, the transparent substrate 13 having the opposite electrode 5-1 formed thereon was transferred from the sputtering system to a commercially available vacuum deposition device and fixed to a substrate holder of the vacuum deposition device so that a deposition mask faced a surface of the transparent substrate 13 on which the opposite electrode 5-1 had been formed. Further, respective materials for forming the light-emitting functional layer 3 were filled into respective heating boats provided in the vacuum deposition device, wherein the amounts of the respective materials filled into respective heating boats were optimized for forming the respective layers. Incidentally, the heating boats were each produced by using a resistance heating material made of tungsten.

Next, the pressure of a deposition chamber of the vacuum deposition device was reduced to $4 \times 10^{-4}$ Pa, and the heating boats having respective materials placed therein were electrically heated sequentially, and thereby the respective layers were formed as follows.

First, a heating boat having α-NPD represented by the following structural formula, as a hole transporting/injecting material, placed therein was electrically heated to form a hole transporting/injecting layer 31 on the opposite electrode 5-1, wherein the hole transporting/injecting layer 31 is composed of α-NPD and serves both as a hole injecting layer and as a hole transporting layer. At this time, the deposition rate was 0.1 nm/sec to 0.2 nm/sec, and the film-thickness was 20 nm.

[Chemical Formula 72]

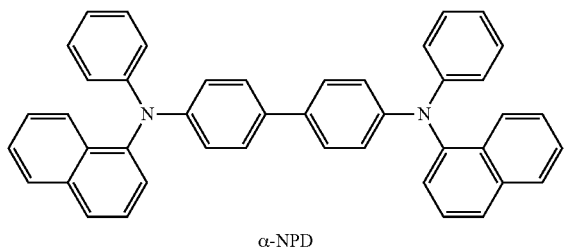

α-NPD

Next, a heating boat having a host material H4 represented by a structural formula shown before placed therein and a heating boat having the phosphorescent compound Ir-4 represented by a structural formula shown before placed therein were each independently electrically heated to form an light emitting layer 32 composed of the host material H4 and the phosphorescent compound Ir-4 on the hole transporting/injecting layer 31. At this time, the deposition rates of the two compounds were adjusted by adjusting the currents of the two heating boats so that the ratio of (host H4):(phosphorescent compound Ir-4)=10:6. The film-thickness was 30 nm.

Next, a heating boat having BAlq, as a hole blocking material, represented by the following formula placed therein was electrically heated to form a hole blocking layer 33 composed of BAlq on the light emitting layer 32. At this time, the deposition rate was 0.1 nm/sec to 0.2 nm/sec, and the film-thickness was 10 nm.

[Chemical Formula 73]

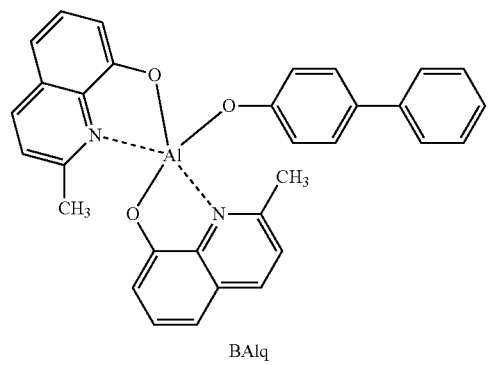

BAlq

Thereafter, a heating boat having Compound 10 represented by the structural formula shown before, as an electron transporting material, placed therein and a heating boat having potassium fluoride placed therein were each independently electrically heated to form an electron transporting layer 34 on the hole blocking layer 33, wherein the electron transporting layer 34 was composed of Compound 10 and potassium fluoride. At this time, the deposition rates of the two compounds were adjusted by adjusting the currents of the two heating boats so that the ratio of (Compound 10):(potassium fluoride)=75:25. The film-thickness was 30 nm.

Next, a heating boat having potassium fluoride, as an electron injecting material, placed therein was electrically heated to form, on the electron transporting layer 34, an electron injecting layer 35 composed of potassium fluoride. At this time, the deposition rate was in a range of 0.01 nm/sec to 0.02 nm/sec, and the film-thickness was 1 nm.

Thereafter, as the cathode, the transparent electrode 1 described in Example 1 was formed on the electron injecting layer 35. By performing the above process, the organic electroluminescence element EL was formed on the transparent substrate 13. The process for forming the transparent electrode 1 is identical to that described in Example 1.

Thereafter, the organic electroluminescence element EL was covered by the sealing material 17 formed of a glass substrate and having a thickness of 300 μm, and, in a state where the organic electroluminescence element EL was enclosed by the sealing material 17, the gap between the sealing material 17 and the transparent substrate 13 was filled with the adhesive 19 (a sealing material). An epoxy-based light curable adhesive (Lux track LC0629B, manufactured by Toa Gosei Co. Ltd.) was used as the adhesive 19. Ultraviolet light was irradiated from the side of the glass substrate (i.e., the side of the sealing material 17) onto the adhesive 19 filled into the gap between the sealing material 17 and the transparent substrate 13 to cure the adhesive 19 to thereby seal the organic electroluminescence element EL.

Incidentally, in the formation of the organic electroluminescence element EL, a deposition mask was used to form each of the layers, so that in the transparent substrate 13 which had a size of (5 cm×5 cm), the central area (4.5 cm×4.5 cm) was formed as a light-emitting region A, around which a light non-emitting region B having a width of 0.25 cm was arranged. Further, the opposite electrode 5-1 (which is the anode) and the transparent electrode 1 (which is the cathode) were formed into a shape such that the end portions of the opposite electrode 5-1 and the transparent electrode 1 were drawn out to the edge of the transparent substrate 13 in a state where the opposite electrode 5-1 and the transparent electrode 1 were insulated from each other by the light-emitting functional layer 3, which was configured by the layers from the hole transporting/injecting layer 31 to the electron injecting layer 35.

In such a manner, the organic electroluminescence element EL was arranged on the transparent substrate 13, and the both were sealed by the sealing material 17 and the adhesive 19, so that the light-emitting panel of each of Samples 3-1 to 3-14 was obtained. In each light-emitting panel, each different color of the emitted light h emitted from the light emitting layer 32 were extracted from both the side of the transparent electrode 1 (i.e., the side of the transparent substrate 13) and the side of the opposite electrode 5-1 (i.e., the side of the sealing material 17).

<Evaluation of Each Sample of Example 3, Part 1>

The light transmittance of the element (i.e., element transmittance) was measured for each of the organic electroluminescence elements EL produced in Samples 3-1 to 3-16. The measurement of the light transmittance was performed using a spectrophotometer (U-3300, manufactured by Hitachi Co., Ltd.) with a base material identical to the sample as a baseline. The results of the measurement are shown in the following Table 3.

<Evaluation of Each Sample of Example 3, Part 2>

The driving voltage of the organic electroluminescence element EL produced in each of Samples 3-1 to 3-16 was measured. The results of the measurement are also shown in the following Table 3. In the measurement of the driving voltage, front brightness on the side of the transparent electrode 1 (i.e., the side of the transparent substrate 13) of each organic electroluminescence element EL and front brightness on the side of the opposite electrode 5-1 (i.e., the side of the sealing material 17) of each organic electroluminescence element EL were measured, and the voltage at the time when the sum of the both front brightnesses was equal to 1000 cd/m$^2$ was regarded as the driving voltage. Incidentally, the brightness was measured using a spectroradiometer CS-1000 (manufactured by Konica Minolta Sensing Inc.). The smaller the value of the obtained driving voltage is, the more preferable the result is.

TABLE 3

| | Transparent electrode (Cathode) | | | | Result of Evaluation | | |
|---|---|---|---|---|---|---|---|
| | Nitrogen-containing | Electrode layer | | | | | |
| Sample | layer (Film-thickness 25 nm) Material | Material/Film-thickness (nm) | Film-forming method | Circumferential length of aperture (nm) | Element transmittance (at 550 nm) | Driving voltage (V) | Remark |
| 3-1 | — | Ag/8 | Resistance heating deposition | >5000 | 32% | Do not emit light | Comparison |
| 3-2 | Anthracene | | | >5000 | 33% | Do not emit light | Comparison |
| 3-3 | spiro-DPVBi | | | >5000 | 38% | Do not emit light | Comparison |
| 3-4 | TPD | Ag/8 | Resistance heating deposition | 2600 | 44% | 4.3 | Present invention |
| 3-5 | Porphyrin derivative | | | 1900 | 48% | 4.2 | Present invention |
| 3-6 | Compound 99 | | | 1500 | 53% | 4.0 | Present invention |
| 3-7 | Compound 94 | | | 1200 | 55% | 3.9 | Present invention |
| 3-8 | Compound No. 11 | | | 0 | 59% | 3.6 | Present invention |
| 3-9 | Compound 10 | Ag/3 | Resistance heating deposition | 2500 | 51% | 5.3 | Present invention |
| 3-10 | | Ag/5 | | 1000 | 59% | 4.5 | Present invention |
| 3-11 | | Ag/8 | | 600 | 60% | 3.6 | Present invention |
| 3-12 | | Ag/10 | | 30 | 51% | 3.6 | Present invention |
| 3-13 | | Ag/12 | | 0 | 42% | 3.6 | Present invention |
| 3-14 | Compound 10 | Ag/15 | Resistance heating deposition | 0 | 30% | 3.6 | Comparison |
| 3-15 | Compound 10 | Ag/8 | Sputtering | 700 | 59% | 3.6 | Present invention |
| 3-16 | Compound 10 | Ag—Cu (3 atm %)/8 | | 700 | 58% | 3.6 | Present invention |

<Evaluation Results of Example 3>

As is clear from Table 3, the element transmittance of the organic electroluminescence element of each of Samples 3-4 to 3-13, 3-15 and 3-16, in which a transparent electrode 1 having the configuration of the present invention is used as the cathode thereof, is 40% or higher, and light emission of the element is confirmed when a driving voltage is applied. In contrast, the element transmittance of the organic electroluminescence element of each of Samples 3-1 to 3-3 and 3-14, in which a transparent electrode not having the configuration of the present invention is used as the cathode thereof, is less than 40%, and further, the organic electroluminescence element of each of Samples 3-1 to 3-3 does not emit light even when a driving voltage is applied.

Based on the above facts, it has been confirmed that the organic electroluminescence element using the transparent electrode having the configuration of the present invention can emit light of higher brightness with lower driving voltage. Further, based on the above facts, it has been confirmed that it is expected to reduce driving voltage and improve light-emitting lifetime for obtaining a given brightness.

EXPLANATION OF REFERENCE NUMERALS 1 transparent electrode 1
1b electrode layer 1b
EL, EL-1, EL-2, EL-3, EL-4 organic electroluminescence element (electronic device)
a aperture
S surface region (500 nm×500 nm)

The invention claimed is:

1. An electronic device comprising:
   a transparent substrate,
   two transparent electrodes arranged on the transparent substrate,
   a light-emitting function layer arranged on the transparent substrate and sandwiched between the two transparent electrodes,
   wherein the electronic device is an organic electroluminescence element in which emitted light from the light-emitting function layer is extracted from both a side of the light-emitting function layer facing the transparent substrate and a side opposite to the side of the light-emitting function layer facing the transparent substrate,
   wherein at least one of the two transparent electrodes comprises a nitrogen-containing layer composed of a compound containing nitrogen; and an electrode layer composed of silver, arranged adjacent to the nitrogen-containing layer,
      wherein film thickness of the electrode layer is 12 nm or less at which sheet resistance of the electrode layer is measurable,
      wherein circumferential length of aperture(s) obtained by performing image processing on a scanning electron microscope image of a surface region with an area of 500 nm×500 nm of the electrode layer is, in sum total, 3000 nm or less,
      wherein the organic electroluminescence element has a light transmittance of 40% or higher,
   wherein an effective action energy (ΔEef) which is defined as interaction energy between the compound of the nitrogen-containing layer and silver of the electrode layer falls in a range satisfying the following Formula, $$\Delta Eef \leq -0.23 [\text{kcal/mol} \cdot \text{Å}^2]$$

wherein the compound of the nitrogen-containing layer is a compound represented by General Formula (1),

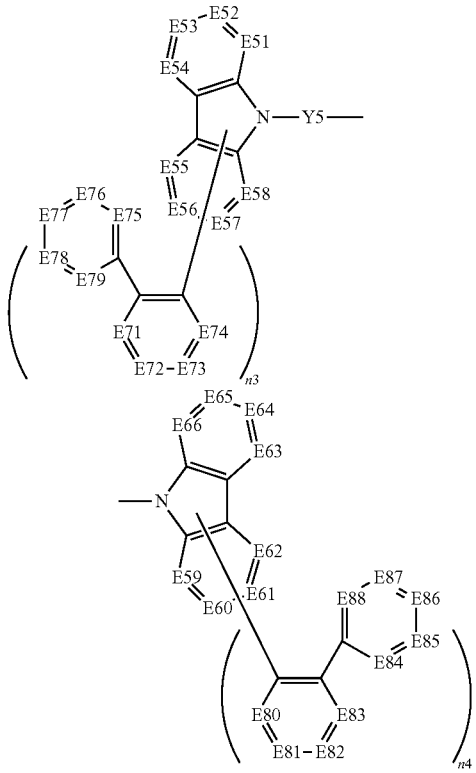

General Formula (1)

wherein,
Y5 represents a divalent linking group which is an arylene group, a heteroarylene group or a combination of the arylene group and the heteroarylene group;
E51 to E66 and E71 to E88 each represent —C(R3)= or —N=, wherein R3 represents a hydrogen atom or a substituent, and wherein at least one of E71 to E79 and at least one of E80 to E88 each represent —N=; and
   n3 and n4 each represent an integer of 0 to 4, wherein the sum of n3 and n4 is 2 or more.

2. The electronic device according to claim 1, wherein the transparent electrode that comprises the nitrogen-containing layer is arranged under the light-emitting function layer, and
the nitrogen-containing layer is arranged adjacent to the transparent substrate.

3. The electronic device according to claim 1, wherein the circumferential length of the aperture(s) is, in sum total, 1000 nm or less.

* * * * *